United States Patent
Sitzmann et al.

(10) Patent No.: US 11,118,064 B2
(45) Date of Patent: Sep. 14, 2021

(54) PHOTOCURABLE HARDCOAT COMPOSITIONS, METHODS, AND ARTICLES DERIVED THEREFROM

(71) Applicant: BASF SE, Ludwigshafen (DE)

(72) Inventors: Eugene V. Sitzmann, Southfield, MI (US); Mervin G. Wood, Jr., Southfield, MI (US); Charles E. Jones, Jr., Southfield, MI (US); Ziniu Yu, Southfield, MI (US); Thomas N. Hall, Longs, MI (US); Zulfiqar A. Tahir, Southfield, MI (US)

(73) Assignee: BASF SE

( * ) Notice: Subject to any disclaimer, the term of this patent is extended or adjusted under 35 U.S.C. 154(b) by 188 days.

(21) Appl. No.: 16/464,612

(22) PCT Filed: Nov. 29, 2017

(86) PCT No.: PCT/US2017/063594
§ 371 (c)(1),
(2) Date: May 28, 2019

(87) PCT Pub. No.: WO2018/102341
PCT Pub. Date: Jun. 7, 2018

(65) Prior Publication Data
US 2021/0095133 A1    Apr. 1, 2021

Related U.S. Application Data

(60) Provisional application No. 62/428,273, filed on Nov. 30, 2016.

(51) Int. Cl.
| C08F 2/46 | (2006.01) |
| C08F 2/50 | (2006.01) |
| C08G 61/04 | (2006.01) |
| C09D 4/00 | (2006.01) |
| C09D 7/48 | (2018.01) |
| C08F 222/10 | (2006.01) |
| C08K 5/07 | (2006.01) |
| C08K 5/3475 | (2006.01) |
| C08K 5/3492 | (2006.01) |
| C08K 5/5397 | (2006.01) |

(52) U.S. Cl.
CPC .............. *C09D 4/00* (2013.01); *C08F 2/50* (2013.01); *C08F 222/102* (2020.02); *C08F 222/1065* (2020.02); *C08K 5/07* (2013.01); *C08K 5/3475* (2013.01); *C08K 5/3492* (2013.01); *C08K 5/5397* (2013.01); *C09D 7/48* (2018.01)

(58) Field of Classification Search
CPC .............. C08F 2/46; C08F 2/50; C08G 61/04
USPC .................. 522/1; 520/15, 14, 8, 1
See application file for complete search history.

(56) References Cited

U.S. PATENT DOCUMENTS

| 5,977,219 | A | 11/1999 | Ravichandran et al. |
| 6,187,845 | B1 | 2/2001 | Renz et al. |
| 6,191,199 | B1 | 2/2001 | Renz et al. |
| 6,225,384 | B1 | 5/2001 | Renz et al. |
| 7,070,849 | B2 | 7/2006 | Mori et al. |
| 8,446,673 | B2 | 5/2013 | Yoshihara |
| 8,535,795 | B2 | 9/2013 | Wegner et al. |
| 2002/0132871 | A1 | 9/2002 | Colton et al. |
| 2005/0088740 | A1 | 4/2005 | Takeda et al. |
| 2005/0136252 | A1 | 6/2005 | Chisholm et al. |
| 2005/0182199 | A1 | 8/2005 | Jing et al. |
| 2005/0197417 | A1* | 9/2005 | Sitzmann ............ C08F 290/062 522/64 |
| 2009/0004478 | A1 | 1/2009 | Baetzold et al. |
| 2009/0297724 | A1 | 12/2009 | Weber |
| 2010/0208350 | A1 | 8/2010 | Yoshihara |
| 2012/0279566 | A1 | 11/2012 | Bruder et al. |
| 2016/0009952 | A1 | 1/2016 | Wood et al. |

FOREIGN PATENT DOCUMENTS

| WO | WO-2006/082145 A1 | 8/2006 | |
| WO | WO-2006082145 A1 * | 8/2006 | ........... C08K 5/3475 |
| WO | WO-2012/150529 A1 | 11/2012 | |

OTHER PUBLICATIONS

International Search Report and Written Opinion in International Application No. PCT/US2017/063594, dated Mar. 6, 2018 (13 pages).
A. Valet, "Outdoor applications of UV curable clearcoats—a real alternative to thermally cured clearcoats," Progress in Organic Coatings 35 (1999) 223-233.
International Preliminary Report on Patentability received for PCT Patent Application No. PCT/US17/63594, dated Jun. 13, 2019, 10 pages.

* cited by examiner

*Primary Examiner* — Jessica Whiteley
(74) *Attorney, Agent, or Firm* — Faegre Drinker Biddle & Reath LLP

(57) ABSTRACT

A photocurable hardcoat composition includes certain red-shifted ultraviolet light absorbers (UVA) that include a combination of a-hydroxy ketone and bisacylphosphine oxide photoinitiators.

21 Claims, 2 Drawing Sheets

PHOTOCURABLE HARDCOAT COMPOSITIONS, METHODS, AND ARTICLES DERIVED THEREFROM

CROSS-REFERENCE TO RELATED APPLICATIONS

This application is a U.S. National Phase Application under 35 U.S.C. § 371 of International Application No. PCT/US2017/063594, filed on Nov. 29, 2017, which claims the benefit of priority to U.S. Provisional Patent Application No. 62/428,273, filed on Nov. 30, 2016, which are each incorporated herein by reference in their entireties for any and all purposes.

FIELD

The present technology is directed to photocurable hardcoat coating compositions, processes for photocuring coating formulations and articles derived therefrom which comprise certain red-shifted ultraviolet light absorbers (UVAs).

DETAILED DESCRIPTION

Figure 1:
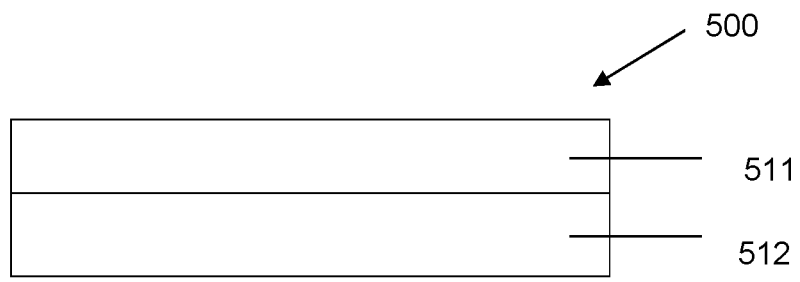
FIG. 1 is a schematic diagram of an article including a substrate and a photocured hardcoat coating layer adhered thereto, according to various embodiments.

Various embodiments are described hereinafter. It should be noted that the specific embodiments are not intended as an exhaustive description or as a limitation to the broader aspects discussed herein. One aspect described in conjunction with a particular embodiment is not necessarily limited to that embodiment and may be practiced with any other embodiment(s).

As used herein, "about" will be understood by persons of ordinary skill in the art and will vary to some extent depending upon the context in which it is used. If there are uses of the term which are not clear to persons of ordinary skill in the art, given the context in which it is used, "about" will mean up to plus or minus 10% of the particular term.

The use of the terms "a" and "an" and "the" and similar referents in the context of describing the elements (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein may be performed in any suitable order unless otherwise indicated herein or otherwise clearly contradicted by context. The use of any and all examples, or exemplary language (e.g., "such as") provided herein, is intended merely to better illuminate the embodiments and does not pose a limitation on the scope of the claims unless otherwise stated. No language in the specification should be construed as indicating any non-claimed element as essential.

In general, "substituted" refers to an alkyl, alkenyl, alkynyl, aryl, or ether group, as defined below (e.g., an alkyl group) in which one or more bonds to a hydrogen atom contained therein are replaced by a bond to non-hydrogen or non-carbon atoms. Substituted groups also include groups in which one or more bonds to a carbon(s) or hydrogen(s) atom are replaced by one or more bonds, including double or triple bonds, to a heteroatom. Thus, a substituted group will be substituted with one or more substituents, unless otherwise specified. In some embodiments, a substituted group is substituted with 1, 2, 3, 4, 5, or 6 substituents. Examples of substituent groups include: halogens (i.e., F, Cl, Br, and I); hydroxyls; alkoxy, alkenoxy, alkynoxy, aryloxy, aralkyloxy, heterocyclyloxy, and heterocyclylalkoxy groups; carbonyls (oxo); carboxyls; esters; urethanes; oximes; hydroxylamines; alkoxyamines; aralkoxyamines; thiols; sulfides; sulfoxides; sulfones; sulfonyls; sulfonamides; amines; N-oxides; hydrazines; hydrazides; hydrazones; azides; amides; ureas; amidines; guanidines; enamines; imides; isocyanates; isothiocyanates; cyanates; thiocyanates; imines; nitro groups; nitriles (i.e., CN); and the like. In some embodiments, as noted herein, the substitution may be with an alkyl or other carbon containing group when attached to an alkyl, cycloalkyl, aryl, heteroaryl, or heterocyclyl group.

As used herein, "alkyl" groups include straight chain and branched alkyl groups having from 1 to about 20 carbon atoms, and typically from 1 to 12 carbons or, in some embodiments, from 1 to 8 carbon atoms. As employed herein, "alkyl groups" include cycloalkyl groups as defined below. Alkyl groups may be substituted or unsubstituted. Examples of straight chain alkyl groups include methyl, ethyl, n-propyl, n-butyl, n-pentyl, n-hexyl, n-heptyl, and n-octyl groups. Examples of branched alkyl groups include, but are not limited to, isopropyl, sec-butyl, t-butyl, neopentyl, and isopentyl groups. Representative substituted alkyl groups may be substituted one or more times with, for example, amino, thio, hydroxy, cyano, alkoxy, and/or halo groups such as F, Cl, Br, and I groups. As used herein the term haloalkyl is an alkyl group having one or more halo groups. In some embodiments, haloalkyl refers to a perhaloalkyl group.

Cycloalkyl groups are cyclic alkyl groups such as, but not limited to, cyclopropyl, cyclobutyl, cyclopentyl, cyclohexyl, cycloheptyl, and cyclooctyl groups. In some embodiments, the cycloalkyl group has 3 to 8 ring members, whereas in other embodiments the number of ring carbon atoms range from 3 to 5, 6, or 7. Cycloalkyl groups may be substituted or unsubstituted. Cycloalkyl groups further include polycyclic cycloalkyl groups such as, but not limited to, norbornyl, adamantyl, bornyl, camphenyl, isocamphenyl, and carenyl groups, and fused rings such as, but not limited to, decalinyl, and the like. Cycloalkyl groups also include rings that are substituted with straight or branched chain alkyl groups as defined above. Representative substituted cycloalkyl groups may be mono-substituted or substituted more than once, such as, but not limited to: 2,2-; 2,3-; 2,4-; 2,5-; or 2,6-disubstituted cyclohexyl groups or mono-, di-, or tri-substituted norbornyl or cycloheptyl groups, which may be substituted with, for example, alkyl, alkoxy, amino, thio, hydroxy, cyano, and/or halo groups.

Alkenyl groups are straight chain, branched or cyclic alkyl groups having 2 to about 20 carbon atoms, and further including at least one double bond. In some embodiments alkenyl groups have from 1 to 12 carbons, or, typically, from 1 to 8 carbon atoms. Alkenyl groups may be substituted or unsubstituted. Alkenyl groups include, for instance, vinyl, propenyl, 2-butenyl, 3-butenyl, isobutenyl, cyclohexenyl, cyclopentenyl, cyclohexadienyl, butadienyl, pentadienyl, and hexadienyl groups among others. Alkenyl groups may be substituted similarly to alkyl groups. Divalent alkenyl groups, i.e., alkenyl groups with two points of attachment, include, but are not limited to, CH—CH=CH$_2$, C=CH$_2$, or C=CHCH$_3$.

As used herein, "aryl", or "aromatic," groups are cyclic aromatic hydrocarbons that do not contain heteroatoms. Aryl groups include monocyclic, bicyclic and polycyclic ring systems. Thus, aryl groups include, but are not limited to, phenyl, azulenyl, heptalenyl, biphenylenyl, indacenyl, fluorenyl, phenanthrenyl, triphenylenyl, pyrenyl, naphthacenyl, chrysenyl, biphenyl, anthracenyl, indenyl, indanyl, pentalenyl, and naphthyl groups. In some embodiments, aryl groups contain 6-14 carbons, and in others from 6 to 12 or even 6-10 carbon atoms in the ring portions of the groups. The phrase "aryl groups" includes groups containing fused rings, such as fused aromatic-aliphatic ring systems (e.g., indanyl, tetrahydronaphthyl, and the like). Aryl groups may be substituted or unsubstituted.

In one aspect, a photocurable hard coat coating composition includes: a) at least one ethylenically unsaturated polymerizable compound; b) at least one red-shifted UV absorber of Formula (I) or (II), or a mixture of any two of Formulas (I), (II), and (III); and c) a combination of photoinitiators comprising: i) at least one alpha-hydroxy ketone photoinitiator; and ii) at least one bisacylphosphine oxide photoinitiator; and, optionally, d) a hindered amine light stabilizer:

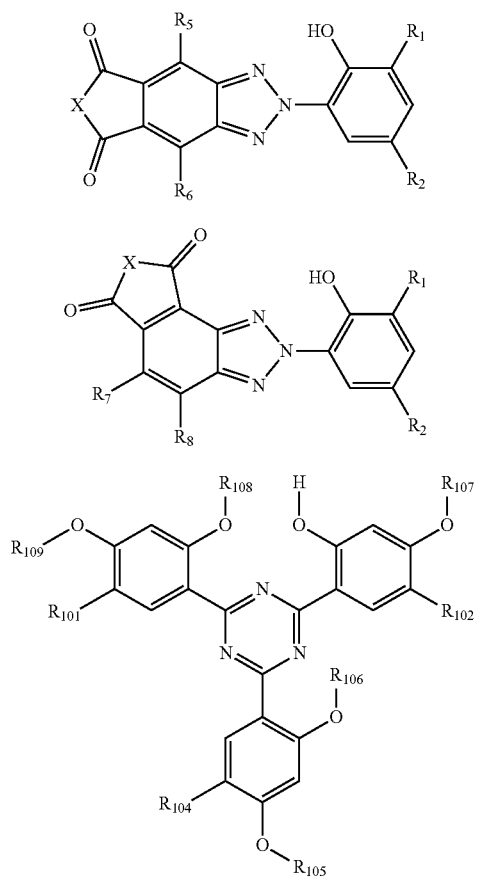

In some embodiments, the combination of photoinitiators may also include e) a compound selected from the group consisting of further ultraviolet light absorbers, phenolic antioxidants and organic or inorganic pigments.

The red-shifted hydroxyphenylbenzotriazoles UV absorbers of component b) may be of Formula (I) or Formula (II):

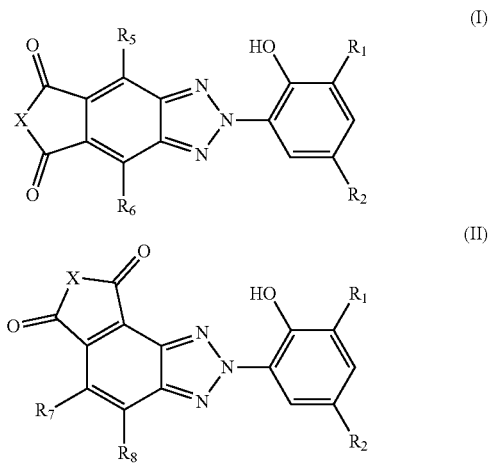

In Formula I and Formula II, $R_1$ may be hydrogen, a straight or a branched chain alkyl of 1 to 24 carbon atoms, a straight or a branched chain alkenyl of 2 to 18 carbon atoms, a cycloalkyl of 5 to 12 carbon atoms, a phenylalkyl of 7 to 15 carbon atoms, a phenyl, a phenyl or phenylalkyl substituted on the phenyl ring by 1 to 4 alkyl groups having 1 to 4 carbon atoms; or $R_1$ is a

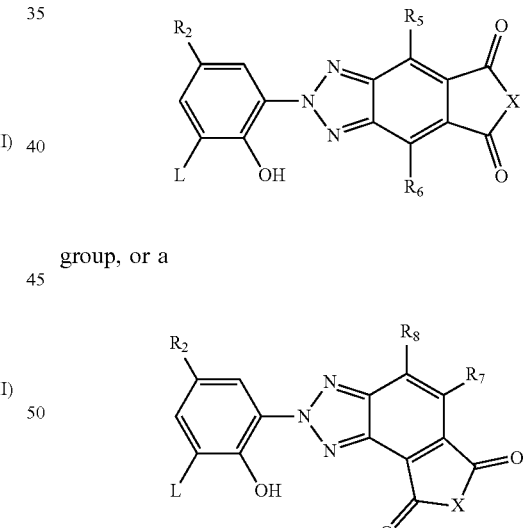

group, or a group, where L is an alkylene of 1 to 12 carbon atoms, an alkylidene of 2 to 12 carbon atoms, a benzylidene, a p-xylylene or a cycloalkylene of 5 to 7 carbon atoms;

$R_2$ is a straight or a branched chain alkyl of 1 to 24 carbon atoms, a straight or a branched chain alkenyl of 2 to 18 carbon atoms, a cycloalkyl of 5 to 12 carbon atoms, a phenylalkyl of 7 to 15 carbon atoms, a phenyl, a phenyl or phenylalkyl substituted on the phenyl ring by 1 to 3 alkyl of 1 to 4 carbon atoms; or an alkyl substituted by one or more —OH, —OCO—$R_{11}$, —OR$_{14}$, —NCO or —NH$_2$ groups or mixtures thereof, or the alkyl or the alkenyl is interrupted by one or more —O—, —NH— or —NR$_{14}$— groups or mixtures thereof and which may be unsubstituted or substituted by one or more —OH, —OR$_{14}$ or —NH$_2$ groups or mixtures thereof; where R$_{11}$ is hydrogen, a straight or a branched chain C$_1$-C$_{18}$alkyl, a C$_5$-C$_{12}$cycloalkyl, a straight or a branched chain C$_3$-C$_8$alkenyl, a phenyl, a naphthyl or a C$_7$-C$_{15}$phenylalkyl; and R$_{14}$ is hydrogen, a straight or a branched chain alkyl of 1 to 24 carbon atoms; or R$_2$ is —OR$_{14}$, a group —C(O)—O—R$_{14}$, —C(O)—NHR$_{14}$ or —C(O)—NR$_{14}$R'$_{14}$ wherein R'$_{14}$ has the same meaning as R$_{14}$; or R$_2$ is —SR$_{13}$, —NHR$_{13}$ or —N(R$_{13}$)$_2$; or R$_2$ is —(CH$_2$)$_m$—CO—X$_1$—(Z)$_p$—Y—R$_{15}$ wherein X$_1$ is —O— or —N(R$_{16}$)—, Y is —O— or —N(R$_{17}$)— or a direct bond, Z is C$_2$-C$_{12}$-alkylene, C$_4$-C$_{12}$alkylene interrupted by one to three nitrogen atoms, oxygen atoms or a mixture thereof, or is C$_3$-C$_{12}$alkylene, butenylene, butynylene, cyclohexylene or phenylene, each of which may be additionally substituted by a hydroxyl group; or

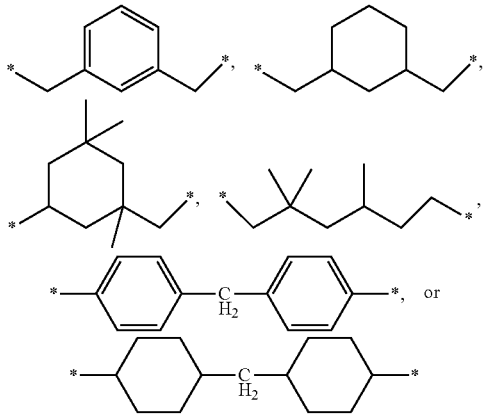

wherein * denotes a bond; or when

Y is a direct bond, Z can additionally also be a direct bond;

m is zero, 1 or 2, p is 1, or p is also zero when X and Y are —N(R$_{16}$)— and —N(R$_{17}$)—, respectively, R$_{15}$ is hydrogen, C$_1$-C$_{12}$alkyl, a

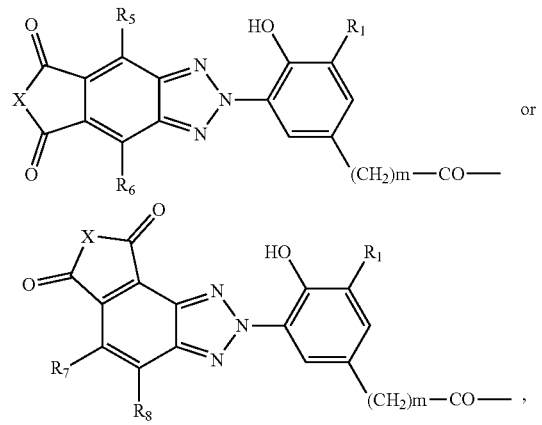

or a group —CO—C(R$_{18}$)═C(H)R$_{19}$ or, when Y is —N(R$_{17}$)—, forms together with R$_{17}$ a group —CO—CH═CH—CO— wherein R$_{18}$ is hydrogen or methyl and R$_{19}$ is hydrogen, methyl or —CO—X$_1$-R$_{20}$, wherein R$_{20}$ is hydrogen, C$_1$-C$_{12}$alkyl or a group of Formulas

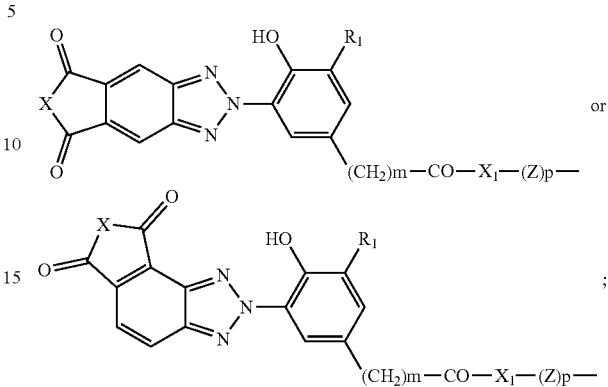

R$_5$, R$_6$, R$_7$ and R$_8$ are independently hydrogen, halogen, CN, NO$_2$ or NH$_2$;

R$_{13}$ is alkyl of 1 to 20 carbon atoms, hydroxyalkyl of 2 to 20 carbon atoms, alkenyl of 3 to 18 carbon atoms, cycloalkyl of 5 to 12 carbon atoms, phenylalkyl of 7 to 15 carbon atoms, phenyl or naphthyl, which both may be substituted by one or two alkyl of 1 to 4 carbon atoms;

R$_{16}$ and R$_{17}$ independently of one another are hydrogen, C$_1$-C$_{12}$-alkyl, C$_3$-C$_{12}$-alkyl interrupted by 1 to 3 oxygen atoms, or is cyclohexyl or C$_7$-C$_{15}$phenylalkyl and R$_{16}$ together with R$_{17}$ in the case where Z is ethylene, also forms ethylene;

X is O or NE$_1$; wherein

E$_1$ is hydrogen, straight or branched chain C$_1$-C$_{24}$alkyl, straight or branched chain C$_2$-C$_{18}$alkenyl, C$_2$-C$_6$alkyinyl, C$_5$-C$_{12}$cycloalkyl, phenyl, naphthyl or C$_7$-C$_{15}$phenylalkyl; or the straight or branched chain C$_1$-C$_{24}$ alkyl, straight or branched chain C$_2$-C$_{24}$ alkenyl, C$_5$-C$_{12}$ cycloalkyl, C$_2$-C$_6$ alkinyl may be substituted by one or more —F, —OH, —OR$_{22}$, —NH$_2$, —NHR$_{22}$, —N(R$_{22}$)$_2$, —NHCOR$_{23}$, —NR$_{22}$COR$_{23}$, —OCOR$_{24}$, —COR$_{25}$, —SO$_2$R$_{26}$ —PO(R$_{27}$)$_n$(R$_{28}$)$_{2-n}$, —Si(R$_{29}$)$_n$(R$_{30}$)$_{3-n}$, —Si(R$_{22}$)$_3$, —N$^+$(R$_{22}$)$_3$ —S$^+$(R$_{22}$)$_2$ A$^-$, -oxiranyl groups or mixtures thereof; the straight or branched chain C$_1$-C$_{24}$ alkyl, straight or branched chain unsubstituted or substituted C$_2$-C$_{24}$ alkenyl, C$_5$-C$_{12}$ cycloalkyl or C$_2$-C$_6$ alkynyl can also be interrupted by one or more —O—, —S—, —NH— or —NR$_{22}$— groups or combinations thereof wherein the phenyl, naphthyl or C$_7$-C$_{15}$phenylalkyl can also be substituted by one or more halogen, —CN, —CF$_3$, —NO$_2$, —NHR$_{22}$, —N(R$_{22}$)$_2$, —SO$_2$R$_{26}$, —PO(R$_{27}$)$_n$(R$_{28}$)$_{2-n}$, —OH, —OR$_{22}$, —COR$_{25}$, —R$_{25}$; wherein n is 0, 1 or 2;

R$_{22}$ is straight or branched chain C$_1$-C$_{18}$ alkyl, straight or branched chain C$_2$-C$_{18}$ alkenyl, C$_5$-C$_{10}$ cycloalkyl, phenyl or naphthyl, C$_7$-C$_{15}$ phenylalkyl, or two R$_{22}$ when attached to an N or Si atom can form together with the atom to which they are bonded a pyrrolidine, piperidine or morpholine ring;

R$_{23}$ is hydrogen, OR$_{22}$, NHR$_{22}$, N(R$_{22}$)$_2$ or has the same meaning as R$_{22}$, R$_{24}$ is OR$_{22}$, NHR$_{22}$, N(R$_{22}$)$_2$ or has the same meaning as R$_{22}$, R$_{25}$ is hydrogen, OH, OR$_{22}$, NHR$_{22}$ or N(R$_{22}$)$_2$, O-glycidyl or has the same meaning as R$_{22}$, R$_{26}$ is OH, OR$_{22}$, NHR$_{22}$ or N(R$_{22}$)$_2$, R$_{27}$ is NH$_2$, NHR$_{22}$ or N(R$_{22}$)$_2$, $R_{28}$ is OH or $OR_{22}$,
$R_{29}$ is Cl or $OR_{22}$,
$R_{30}$ is straight or branched chain $C_1$-$C_{18}$ alkyl; or $E_1$ is

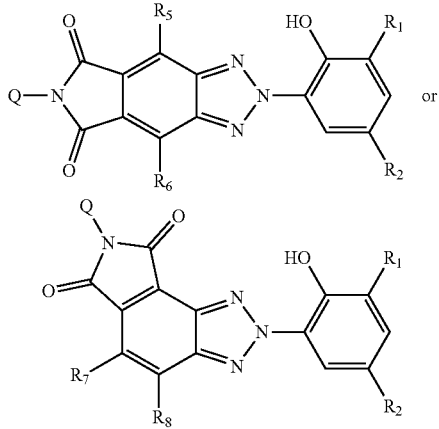

wherein $R_1$ to $R_8$ have the meanings as defined above and Q is straight or branched $C_2$-$C_{12}$alkylene, $C_2$-$C_{12}$alkylene, which is interrupted by one or more —O—, NH or $NR_{14}$ atoms, $C_5$-$C_{10}$cycloalkylene, para-phenylene,

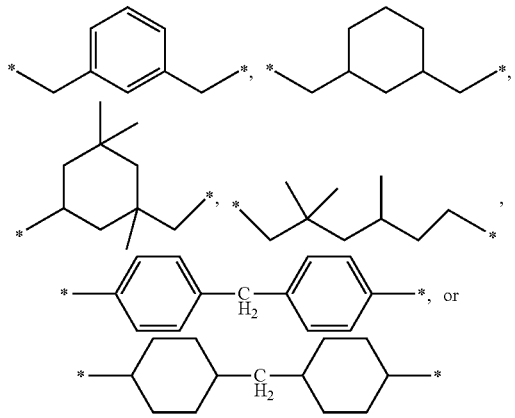

wherein * denotes a bond;
The red-shifted hydroxyphenyltriazines of component b) are of Formula (III) wherein (III)

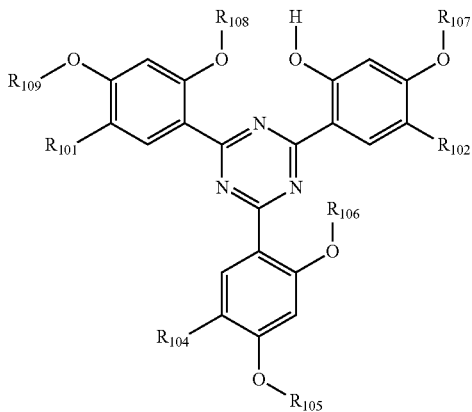

In Formula III, $R_{101}$, $R_{102}$, and $R_{104}$ are independently hydrogen, straight or branched chain alkyl of 1 to 24 carbon atoms, cycloalkyl of 5 to 12 carbon atoms, phenylalkyl of 7 to 15 carbon atoms;

$R_{105}$, $R_{106}$, $R_{107}$, $R_{108}$, and $R_{109}$ are independently hydrogen, straight or branched chain alkyl of 1 to 24 carbon atoms or cycloalkyl of 5 to 12 carbon atoms; or the alkyl or the cycloalkyl substitute by one to four halogen, epoxy, glycidyloxy, furyloxy, —$R_{204}$, —$OR_{205}$, —$N(R_{205})_2$, —$CON(R_{205})_2$, —$COR_{205}$, —$COOR_{205}$, —$OCOR_{205}$, —$OCOC(R_{205})$=$C(R_{205})_2$, —$C(R_{205})$=$CCOOR_{205}$, —CN, —NCO, or a combination of any two or more thereof, or the alkyl or the cycloalkyl interrupted by one to four epoxy, —O—, —$NR_{205}$—, —$CONR_{205}$—, —COO—, —OCO—, —CO—, —$C(R_{205})$=$C(R_{205})$COO—, —$OCOC(R_{205})$=$C(R_{205})$—, —$C(R_{205})$=$C(R_{205})$—, phenylene or phenylene-G-phenylene in which G is —O—, —S—, —$SO_2$—, —$CH_2$— or —$C(CH_3)_2$— or a combination of any two or more thereof, or the alkyl or the cycloalkyl both substituted and interrupted by combinations of the groups mentioned above; or —$COR_{206}$;

$R_{204}$ is aryl of 6 to 10 carbon atoms or the aryl substituted by one to three halogen, alkyl of 1 to 8 carbon atoms, alkoxy of 1 to 8 carbon atoms, or a combination of any two or more thereof; cycloalkyl of 5 to 12 carbon atoms; phenylalkyl of 7 to 15 carbon atoms or the phenylalkyl substituted on the phenyl ring by one to three halogen, alkyl of 1 to 8 carbon atoms, alkoxy of 1 to 8 carbon atoms, or a combination of any two or more thereof; or straight or branched chain alkenyl of 2 to 18 carbon atoms;

$R_{205}$ is defined as is $R_{204}$; or $R_{205}$ is also hydrogen or straight or branched chain alkyl of 1 to 24 carbon atoms, alkenyl of 2 to 24 carbon atoms;

$R_{206}$ is straight or branched chain alkyl of 1 to 18 carbon atoms, straight or branched chain alkenyl of 2 to 12 carbon atoms, phenoxy, alkyl amino of 1 to 12 carbon atoms, arylamino of 6 to 12 carbon atoms, —$R_{207}$COOH or —NH—$R_{208}$—NCO;

$R_{207}$ is alkylene of 2 to 14 carbon atoms or phenylene; and $R_{208}$ is alkylene of 2 to 24 carbon atoms, phenylene, tolylene, or diphenylmethane.

Halogen is, for example, fluorine, chlorine, bromine, or iodine. Chlorine is preferred.

When any of the substituents are straight or branched chain alkyl of 1 to 24 carbon atoms, such groups are, for example, methyl, ethyl, isopropyl, n-butyl, isobutyl, sec-butyl, tert-butyl, tert-amyl, 2-ethylhexyl, tert-octyl, lauryl, tert-dodecyl, tridecyl, n-hexadecyl, n-octadecyl, or eicosyl.

When any of the substituents are straight or branched chain alkenyl of 2 to 18 carbon atoms, such groups are, for example, allyl, pentenyl, hexenyl, doceneyl or oleyl. Preference is given to alkenyl having from 3 to 16, especially from 3 to 12, for example from 2 to 6, carbon atoms.

When any of the substituents are cycloalkyl of 5 to 12 carbon atoms, such groups are, for example, cyclopentyl, cyclohexyl, cycloheptyl, cyclooctyl, and cyclododecyl. $C_1$-$C_4$alkyl-substituted $C_5$-$C_8$cycloalkyl is, for example, methylcyclopentyl, dimethylcyclopentyl, methylcyclohexyl, dimethylcyclohexyl, trimethylcyclohexyl, or tert-butylcyclohexyl.

When any of the radicals are phenylalkyl of 7 to 15 carbon atoms, such groups are, for example, benzyl, phenethyl, alpha-methylbenzyl, or alpha, alpha-dimethylbenzyl.

When phenyl is substituted by alkyl, this is, for example, tolyl and xylyl.

Alkyl substituted by one or more —O— groups and/or substituted by one or more —OH groups may be, for example, —(OCH$_2$CH$_2$)$_w$OH, or —(OCH$_2$CH$_2$)$_w$O(C$_1$-C$_{24}$alkyl) where w is 1 to 12.

Alkyl interrupted by one or more —O— may be derived from ethyleneoxide units or from propyleneoxide units or from mixtures of both.

When alkyl is interrupted by —NH— or —NR$_{205}$— the radicals are derived in analogy to the above —O— interrupted radicals. Preferred are repeating units of ethylenediamine.

Examples are CH$_3$—O—CH$_2$CH$_2$—, CH$_3$—NH—CH$_2$CH$_2$—, CH$_3$—N(CH$_3$)—CH$_2$—, CH$_3$—O—CH$_2$CH$_2$—O—CH$_2$CH$_2$—, CH$_3$—(O—CH$_2$CH$_2$—)$_2$—CH$_2$CH$_2$—, CH$_3$—(O—CH$_2$CH$_2$—)$_3$—CH$_2$CH$_2$—, or CH$_3$—(O—CH$_2$CH$_2$—)$_4$—CH$_2$CH$_2$—.

Alkylene is, for example, ethylene, tetramethylene, hexamethylene, 2-methyl-1,4-tetramethylene, hexamethylene, octamethylene, decamethylene, and dodecamethylene.

Cycloalkylene is, for example, cyclopentylene, cyclohexylene, cycloheptylene, cyclooctylene, and cyclododecylene. In some embodiment, the cycloalkylene is cyclohexylene.

Alkylene interrupted by oxygen, NH or —NR$_{205}$— is, for example, —CH$_2$CH$_2$—O—CH$_2$CH$_2$—, —CH$_2$CH$_2$—NH—CH$_2$CH$_2$—, —CH$_2$CH$_2$—N(CH$_3$)—CH$_2$CH$_2$—, —CH$_2$CH$_2$—O—CH$_2$CH$_2$—O—CH$_2$CH$_2$—, —CH$_2$CH$_2$—(O—CH$_2$CH$_2$—)$_2$—CH$_2$CH$_2$—, —CH$_2$CH$_2$—(O—CH$_2$CH$_2$—)$_3$—CH$_2$CH$_2$—, —CH$_2$CH$_2$—(O—CH$_2$CH$_2$—)$_4$—CH$_2$CH$_2$—, or —CH$_2$CH$_2$—NH—CH$_2$CH$_2$—.

The radical Q is straight or branched C$_1$-C$_{12}$alkylene, C$_5$-C$_{10}$cycloalkylene, para-phenylene or a group

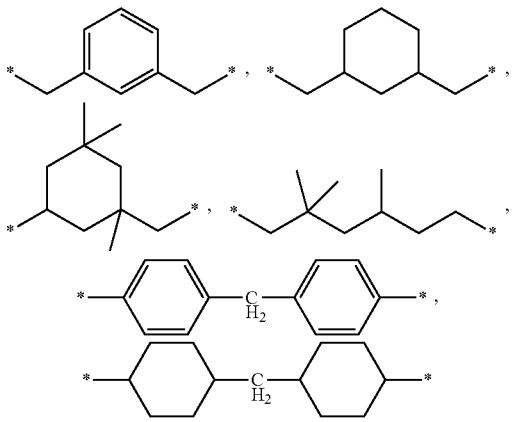

wherein * denotes a bond.

The radical may be derived from readily available diamines, for example, so called Jeffamines. Examples for diamines are ethylenediamine, propylenediamine, 2-methyl-1,5-pentamethylendiamine, isophorondiamine, or 1,2-diaminocyclohexane.

In analogy the radical Z can also be derived from the same available diamines or from the corresponding diols.

Typical Jeffamines are, for example D-2000

wherein x is 33.1, or ED-2003

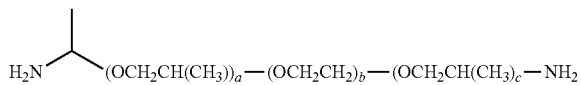

wherein a+c is 5 and b is 39.5.

In some embodiments, the compound of Formula (I) or Formula (II) wherein R$_1$ is hydrogen, straight or branched chain alkyl of 1 to 24 carbon atoms, straight or branched chain alkenyl of 2 to 18 carbon atoms, cycloalkyl of 5 to 12 carbon atoms, phenylalkyl of 7 to 15 carbon atoms, phenyl, or the phenyl or the phenylalkyl substituted on the phenyl ring by 1 to 4 alkyl of 1 to 4 carbon atoms; or R$_1$ is a

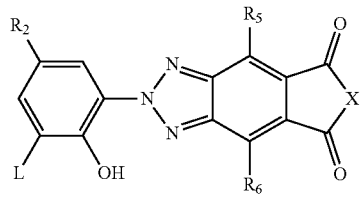

or a group

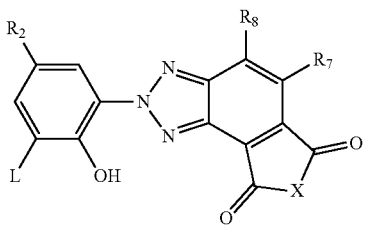

wherein L is alkylene of 1 to 12 carbon atoms, alkylidene of 2 to 12 carbon atoms, benzylidene, p-xylylene or cycloalkylene of 5 to 7 carbon atoms;

R$_2$ is straight or branched chain alkyl of 1 to 24 carbon atoms, straight or branched chain alkenyl of 2 to 18 carbon atoms, cycloalkyl of 5 to 12 carbon atoms, phenylalkyl of 7 to 15 carbon atoms, phenyl, or the phenyl or the phenylalkyl substituted on the phenyl ring by 1 to 3 alkyl of 1 to 4 carbon atoms; or R$_2$ is —(CH$_2$)$_m$—CO—X$_1$—(Z)$_p$—Y—R$_{15}$ wherein
X$_1$ is —O—,
Y is —O— or a direct bond,
Z is C$_2$-C$_{12}$-alkylene, C$_4$-C$_{12}$alkylene interrupted by one to three nitrogen atoms, oxygen atoms or a mixture thereof, or when Y is a direct bond, Z can additionally also be a direct bond;
m is 2,
p is 1,
R$_{15}$ is hydrogen, C$_1$-C$_{12}$alkyl or a group

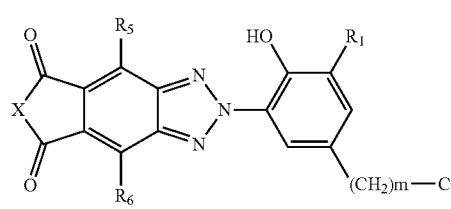

or

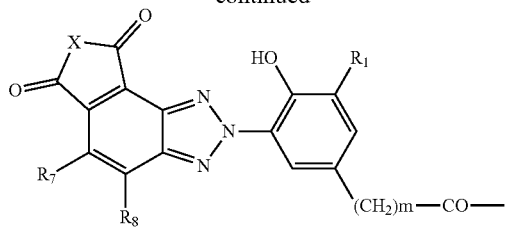

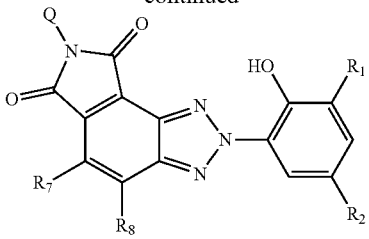

$R_5$, $R_6$, $R_7$ and $R_8$ are independently hydrogen, Cl or Br;

X is O or $NE_1$ wherein $E_1$ is hydrogen, straight or branched chain $C_1$-$C_{24}$alkyl, straight or branched chain $C_2$-$C_{18}$alkenyl, $C_2$-$C_6$alkyinyl, $C_5$-$C_{12}$cycloalkyl, phenyl, naphthyl or $C_7$-$C_{15}$phenylalkyl; or the straight or branched chain $C_1$-$C_{24}$ alkyl, straight or branched chain $C_2$-$C_{24}$ alkenyl, $C_5$-$C_{12}$ cycloalkyl, $C_2$-$C_6$ alkinyl may be substituted by one or more —F, —OH, —$OR_{22}$, —$NH_2$, —$NHR_{22}$, —$N(R_{22})_2$, —$NHCOR_{23}$, —$NR_{22}COR_{23}$, —$OCOR_{24}$, —$COR_{25}$, —$SO_2R_{26}$, —$PO(R_{27})_n(R_{28})_{2-n}$, —$Si(R_{29})_n(R_{30})_{3-n}$, —$Si(R_{22})_3$, —$N^+(R_{22})_3$ $A^-$, —$S^+(R_{22})_2$ $A^-$, -oxiranyl groups or mixtures thereof; the straight or branched chain $C_1$-$C_{24}$ alkyl, straight or branched chain unsubstituted or substituted $C_2$-$C_{24}$ alkenyl, $C_5$-$C_{12}$ cycloalkyl or $C_2$-$C_6$ alkinyl can also be interrupted by one or more —O—, —S—, —NH—, or —$NR_{22}$— groups or combinations thereof; the phenyl, naphthyl or $C_7$-$C_{15}$phenylalkyl can also be substituted by one or more halogen, —CN, —$CF_3$, —$NO_2$, —$NHR_{22}$, —$N(R_{22})_2$, —$SO_2R_{26}$, —$PO(R_{27})_n(R_{28})_{2-n}$, —OH, —$OR_{22}$, —$COR_{25}$, —$R_{25}$; wherein n is 0, 1 or 2;

$R_{22}$ is straight or branched chain $C_1$-$C_{18}$ alkyl, straight or branched chain $C_2$-$C_{18}$ alkenyl, $C_5$-$C_{10}$ cycloalkyl, phenyl or naphthyl, $C_7$-$C_{15}$ phenylalkyl, or two $R_{22}$ when attached to an N or Si atom can form together with the atom to which they are bonded a pyrrolidine, piperidine or morpholine ring;

$R_{23}$ is hydrogen, $OR_{22}$, $NHR_{22}$, $N(R_{22})_2$, or has the same meaning as $R_{22}$, $R_{24}$ is $OR_{22}$, $NHR_{22}$, $N(R_{22})_2$ or has the same meaning as $R_{22}$, $R_{25}$ is hydrogen, OH, $OR_{22}$, $NHR_{22}$ or $N(R_{22})_2$, O-glycidyl or has the same meaning as $R_{22}$, $R_{26}$ is OH, $OR_{22}$, $NHR_{22}$, or $N(R_{22})_2$, $R_{27}$ is $NH_2$, $NHR_{22}$, or $N(R_{22})_2$, $R_{28}$ is OH or $OR_{22}$, $R_{29}$ is Cl or $OR_{22}$, $R_{30}$ is straight or branched chain $C_1$-$C_{18}$ alkyl; or $E_1$ is a group

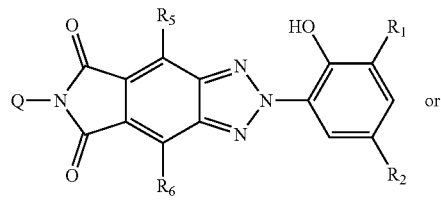

wherein $R_1$ to $R_8$ have the meanings as defined above and

Q is straight or branched $C_2$-$C_{12}$alkylene, $C_5$-$C_{10}$cycloalkylene or para-phenylene or a group.

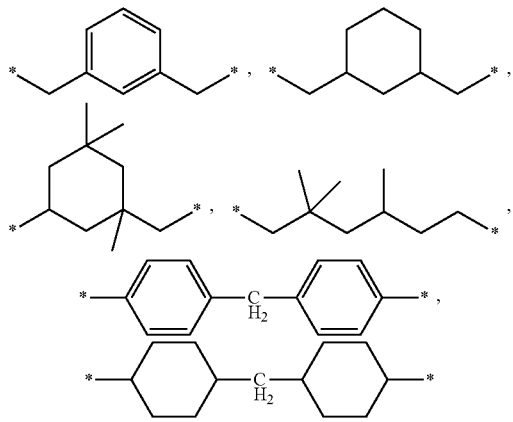

For example, in the compound of Formula (I) or Formula (II) $R_1$ is hydrogen, straight or branched chain alkyl of 1 to 24 carbon atoms, straight or branched chain alkenyl of 2 to 18 carbon atoms, cycloalkyl of 5 to 12 carbon atoms, phenylalkyl of 7 to 15 carbon atoms, phenyl, or the phenyl or the phenylalkyl substituted on the phenyl ring by 1 to 4 alkyl of 1 to 4 carbon atoms; $R_2$ is straight or branched chain alkyl of 1 to 24 carbon atoms, straight or branched chain alkenyl of 2 to 18 carbon atoms, cycloalkyl of 5 to 12 carbon atoms, phenylalkyl of 7 to 15 carbon atoms, phenyl, or the phenyl or the phenylalkyl substituted on the phenyl ring by 1 to 3 alkyl of 1 to 4 carbon atoms; or $R_2$ is —$(CH_2)_2$—CO—O—(Z)—O—$R_{15}$ wherein Z is $C_2$-$C_{12}$-alkylene, $C_4$-$C_{12}$alkylene interrupted by one to three oxygen atoms; $R_{15}$ is hydrogen, $C_1$-$C_{12}$alkyl or

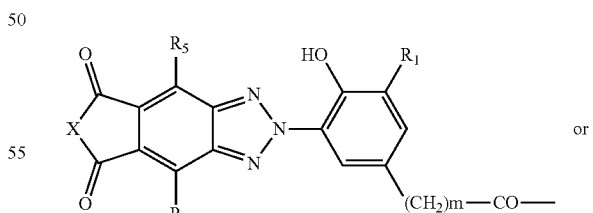

or

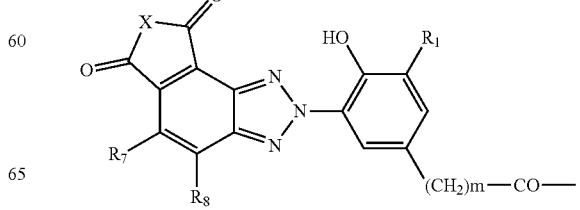

$R_5$, $R_6$, $R_7$ and $R_8$ are independently hydrogen, Cl or Br; X is O or $NE_1$ wherein $E_1$ is hydrogen, straight or branched chain $C_1$-$C_{24}$alkyl, $C_5$-$C_{12}$cycloalkyl, phenyl, or $C_7$-$C_{15}$phenylalkyl; or the straight or branched chain $C_1$-$C_{24}$ alkyl or $C_5$-$C_{12}$ cycloalkyl may be substituted by one or more —F, —OH, —$OR_{22}$, —$NH_2$, —$NHR_{22}$, —$N(R_{22})_2$; the phenyl or $C_7$-$C_{15}$phenylalkyl can also be substituted by one or more halogen, —CN, —$CF_3$, —OH, —$OR_{22}$, —$COR_{22}$, —$R_{22}$; wherein $R_{22}$ is straight or branched chain $C_1$-$C_{18}$ alkyl, straight or branched chain $C_2$-$C_{18}$ alkenyl, $C_5$-$C_{10}$ cycloalkyl, $C_6$-$C_{16}$ phenyl or naphthyl, $C_7$-$C_{15}$ phenylalkyl; or $E_1$ is a group

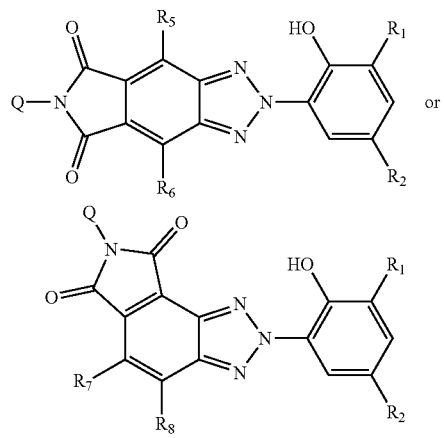

wherein $R_1$ to $R_8$ have the meanings as defined above; and Q is $C_2$-$C_{12}$alkylene, $C_5$-$C_7$cycloalkylene, para-phenylene or a group Particular preference is given to a compound of Formula (I) or (II) wherein $R_1$ is hydrogen, straight or branched chain alkyl of 1 to 12 carbon atoms or phenylalkyl of 7 to 15 carbon atoms; $R_2$ is straight or branched chain alkyl of 1 to 12 carbon atoms or phenylalkyl of 7 to 15 carbon atoms, phenyl, or the phenyl or the phenylalkyl substituted on the phenyl ring by 1 to 3 alkyl of 1 to 4 carbon atoms; $R_5$ and $R_6$ are hydrogen or one of both is Cl or Br; $R_7$ and $R_8$ are independently hydrogen, Cl or Br; X is O or $NE_1$ wherein $E_1$ is hydrogen, straight or branched chain $C_1$-$C_6$alkyl, which is unsubstituted or substituted by 1 to 4 OH, phenyl which is unsubstituted or substituted by F, $CF_3$, CN or Cl, or $C_7$-$C_9$phenylalkyl.

A compound of Formula (I) is in general preferred.
Illustrative compounds include UVA1-UVA12:

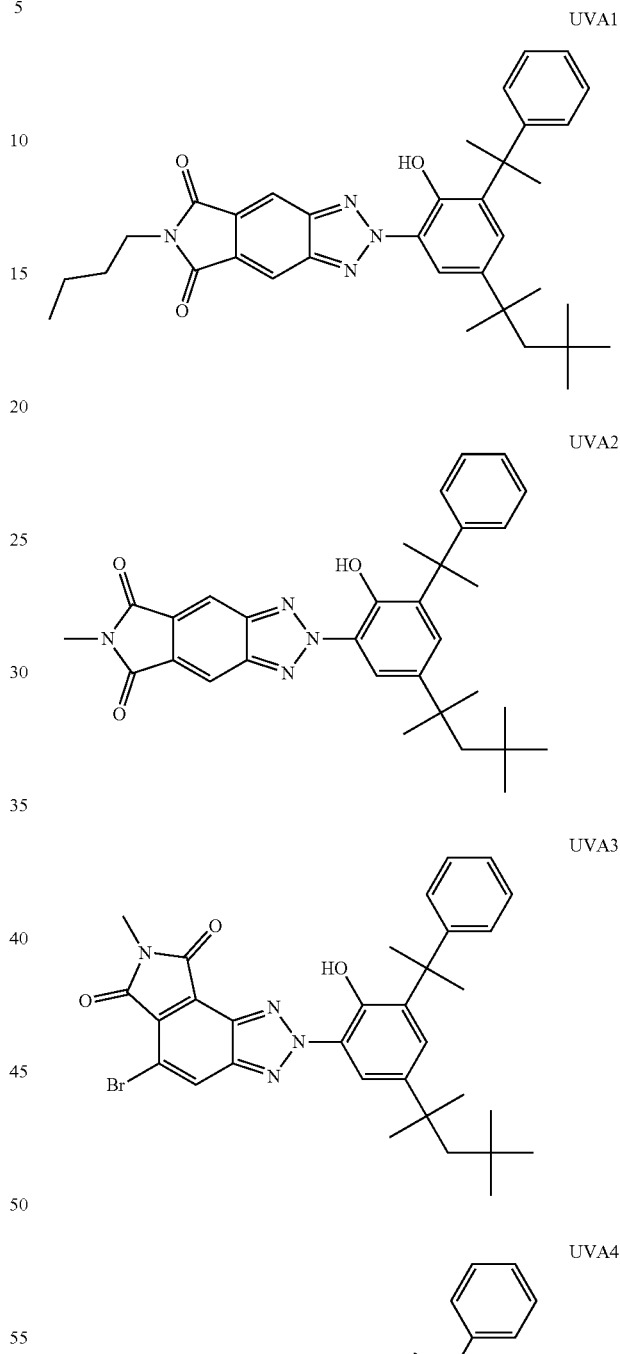

UVA5
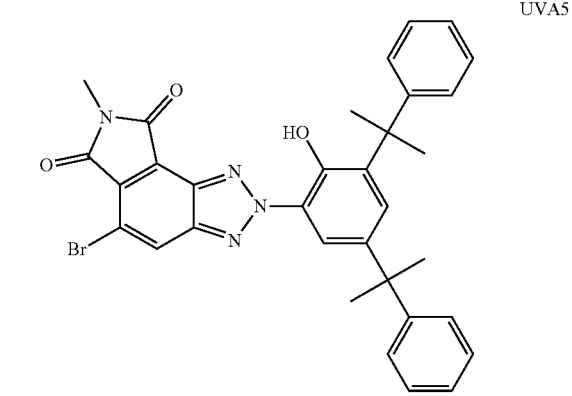
UVA6
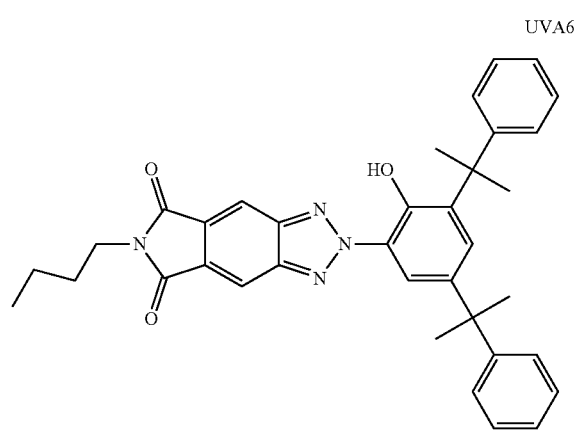
UVA7
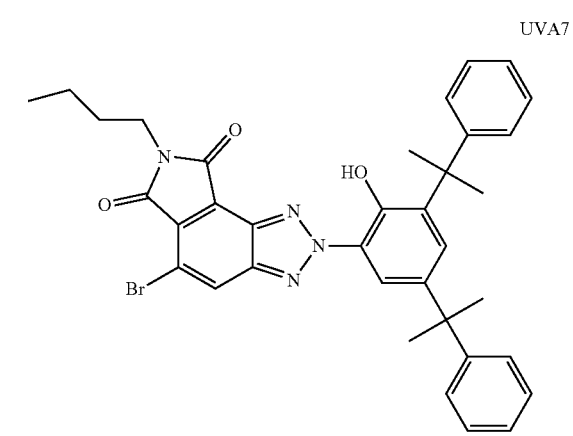
UVA8
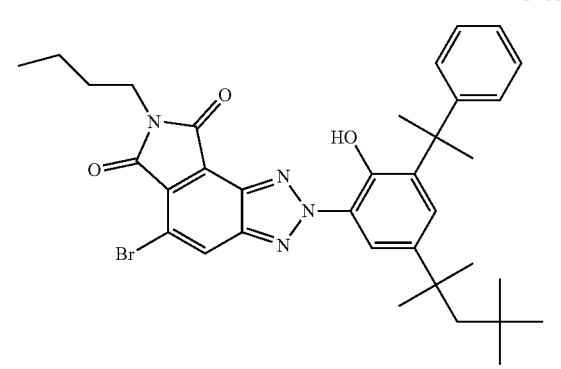
UVA9
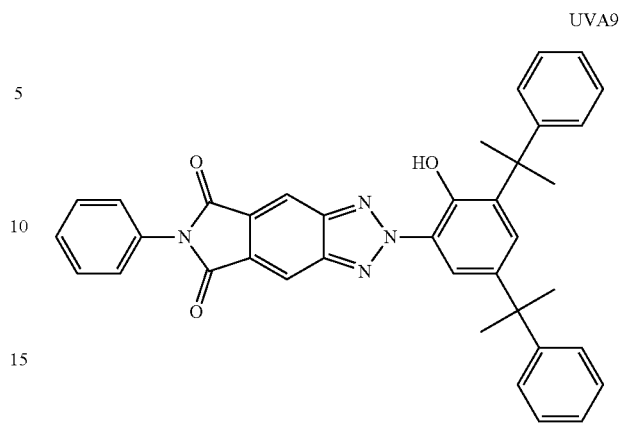
UVA10
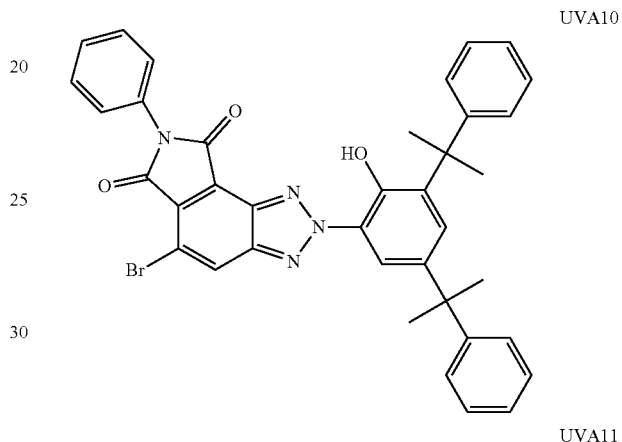
UVA11
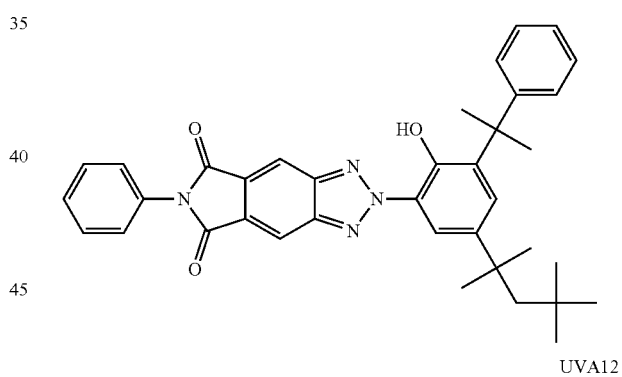
UVA12
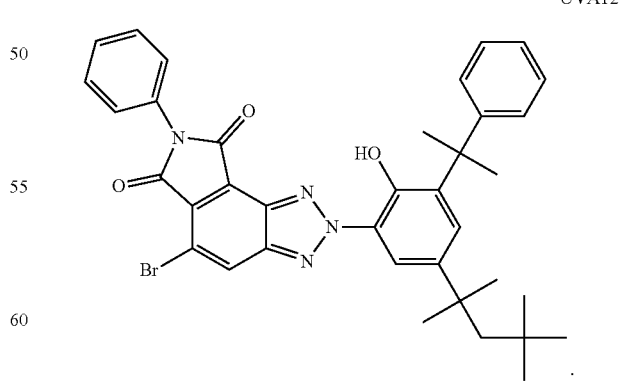
Illustrative red-shifted hydroxyphenylbenzotriazole UV absorbers of Formula (I) and (II) are also disclosed in U.S. Pat. No. 7,695,643 and U.S. Pub. No. 2009/0317629.

The amount of the red-shifted hydroxyphenylbenzotriazoles of Formula (I) and/or (II) component b) may be from about 0.1% to about 25% by weight, based on the weight of the photocurable hard coat resin solids, from about 0.25% to about 15% by weight, from about 0.5% to about 10% by weight, or from about 0.5% to about 5% by weight, based on the weight of the photocurable hardcoat resin solids. In some embodiments, the red-shifted hydroxyphenylbenzotriazoles of Formula (I) and/or (II) component b) may be present at very low levels, from about 0.05% to about 3% by weight, more advantageously from about 0.05% to about 0.5% by weight, most advantageously from about 0.05% to about 0.3% by weight, based on the weight of the photocurable resin solids.

Illustrative red-shifted hydroxyphenyltriazine UV absorbers of Formula III include, but are not limited to, 2,4-bis(2-hydroxy-4-n-butyloxyphenyl)-6-(2,4-di-n-butyloxyphenyl)-s-triazine; 2,4,6-tri s(2-hydroxy-4-isooctyloxycarbonylisopropylideneoxyphenyl)-s-triazine; 2,4,6-tris[2-hydroxy-4-(3-sec-butyloxy-2-hydroxypropyloxy)phenyl]-1,3,5-triazine; 2-(2,4dihydroxyphenyl)-4,6-bis(2-hydroxy-4(1-methoxycarbonylpentoxy)phenyl)-1,3,5-triazine; 2,4,6-tris(2-hydroxy-4-(1-methoxycarbonyl-pentoxy)phenyl)-1,3,5triazine; 2-(2,4-di(methoxycarbonylpentoxy)phenyl)-4,6-bis(2-hydroxy-4-(1-methoxycarbonylpentoxy) phenyl)-1,3,5-triazine; 2-(2,4-dihydroxyphenyl)-4,6-bis-(2-hydroxy-4-(1-hydroxycarbonylpentoxy)phenyl)-1,3,5-triazine; 2,4,6-tris(2-hydroxy-4-(1-hydroxycarbonylpentoxy)phenyl)-1,3,5-triazine; 2-(2,4-di(hydroxycarbonylpentoxy)phenyl)-4,6-bis(2-hydroxy-4-(1-hydroxycarbonylpentoxy)phenyl)-1,3,5-triazine; 2,4-bis[2-hydroxy-4-(3-n-butoxy-2-hydroxypropoxy)phenyl]-6-[2-methoxy-4-(3-n-butoxy-2-hydroxypropoxy)phenyl]-1,3,5-triazine; 2,4-bis[2-hydroxy-4-(3-n-butoxy-2-hydroxypropoxy)phenyl]-6-[2,4-di-(3-n-butoxy-2-hydroxypropoxy)phenyl]-1,3,5-triazine; 2,4-bis[2-hydroxy-4-(1-ethoxycarbonylethoxy)phenyl]-6-[2,4-di-(1-ethoxycarbonylethoxy)phenyl]-1,3,5-triazine; 2,4,6-tris(2'-hydroxy-4'-isopropyloxyphenyl)-1,3,5-triazine; 2,4,6-tris(2'-hydroxy-4'-n-hexyloxyphenyl)-1,3,5-triazine; 2,4-bis(2'-hydroxy-4'-isopropyloxyphenyl)-6-(2'-methoxy-4'-isopropyloxyphenyl)-1,3,5-triazine; 2,4-bis(2'-hydroxy-4'-isopropyloxyphenyl)-6-(2'-ethoxy-4'-isopropyloxypheny 1)-1,3,5-triazine; 2,4-bis(2'-hydroxy-4'-isopropyloxyphenyl)-6-(2',4'-diisopropyloxyphenyl)-1,3,5-triazine; 2,4-bis (2'-hydroxy-4'-n-hexyloxyphenyl)-6-(2',4'-di-(n-hexyloxy) phenyl)-1-3,5-triazine, and mixtures of any two or more thereof.

The amount of the red-shifted hydroxyphenyltriazines of Formula (III) component b) may be from about 0.1% to about 25% by weight, based on the weight of the photocurable hardcoat resin solids, from about 0.25% to about 15% by weight, from about 0.5% to about 10% by weight, or from about 0.5% to about 5% by weight, based on the weight of the photocurable hard coat resin solids. In some embodiments, the red-shifted hydroxyphenyltriazines of Formula (III) component b) may be present at very low levels, from about 0.05% to about 3% by weight, from about 0.05% to about 0.5% by weight, or from about 0.05% to about 0.3% by weight, based on the weight of the photocurable resin solids.

A weight ratio of the red-shifted hydroxyphenylbenzotriazoles of Formula (I) and/or (II) to red-shifted hydroxyphenyltriazines of Formula (III) may be from about 15:1 to about 1:15. This may include, from about 12:1 to about 1:12, from about 10:1 to about 1:10, from about 5:1 to about 1:5, from about 3:1 to about 1:3 or from about 1:1. In some embodiments, the weight ratio of the red-shifted hydroxyphenylbenzotriazoles of Formula (I) and/or (II) to red-shifted hydroxyphenyltriazines of Formula (III) may be from about 15:1 to about 1:15. This may include, from about 12:1 to about 1:12, from about 10:1 to about 1:10, from about 5:1 to about 1:5, from about 3:1 to about 1:3 or from about 1:1.

Illustrative alpha-hydroxy ketone and bisacylphosphine oxide photoinitiators of component c) may include, but are not limited to, those disclosed in U.S. Pat. Nos. 5,942,290, 5,534,559 and 6,020,528.

Illustrative alpha-hydroxy ketone photoinitiators of component c) i) may also be represented by the Formulas

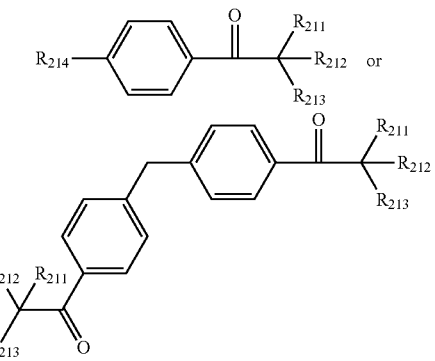

In the Formulas, $R_{211}$ and $R_{212}$ independently of one another are hydrogen, $C_1$-$C_6$ alkyl, phenyl, $C_1$-$C_6$ alkoxy, $OSiR_{216}(R_{217})_2$ or —$O(CH_2CH_2O)_q$-$C_1$-$C_6$ alkyl, or $R_{211}$ and $R_{212}$, together with the carbon atom to which they are attached, form a cyclohexyl ring; q is a number from 1 to 20; $R_{213}$ is OH, $C_1$-$C_{16}$ alkoxy or —$O(CH_2CH_2O)_q$—$C_1$-$C_8$ alkyl; $R_{214}$ is hydrogen, $C_1$-$C_{18}$ alkyl, $C_1$-$C_{18}$ alkoxy, —$OCH_2CH_2$—$OR_{215}$, or $CH_2$=$C(CH_3)$—; $R_{215}$ is hydrogen, —$COCH$=$CH_2$ or —$COC(CH_3)$=$CH_2$; and $R_{216}$ and $R_{217}$ independently of one another are $C_1$-$C_8$ alkyl or phenyl.

Some illustrative alpha-hydroxy ketone photoinitiators include those in which $R_{211}$ and $R_{212}$ independently of one another are hydrogen, $C_1$-$C_6$ alkyl or phenyl or $R_{211}$ and $R_{212}$, together with the carbon atom to which they are attached, form a cyclohexyl ring; $R_{213}$ is OH; and $R_{214}$ is hydrogen, $C_1$-$C_{12}$ alkyl, $C_1$-$C_{12}$ alkoxy, —$OCH_2CH_2OR_{215}$, or —$C(CH_3)$=$CH_2$. For example, $R_{211}$ and $R_{212}$ may be, independently of one another, methyl or ethyl or $R_{211}$ and $R_{212}$, together with the carbon atom to which they are attached, form a cyclohexyl ring; $R_{213}$ is hydrogen and $R_{214}$ is hydrogen, $C_1$-$C_4$ alkyl, $C_1$-$C_4$ alkoxy or —$OCH_2CH_2OH$. Illustrative alpha-hydroxy ketone photoinitiators may include, but are not limited to alpha-hydroxycyclohexyl phenyl ketone; 2-hydroxy-1-(4-(4-(2-hydroxy-2-methylpropionyl)benzyl)phenyl-2-methylpropan-1-one; 2-hydroxy-2-methyl-1-phenylpropanone; 2-hydroxy-2-methyl-1-(4-isopropylphenyl)propanone ; oligo (2-hydroxy-2-methyl-1-(4-(1-methylvinyl)phenyl)propanone; CAS number 163702-01-0; 2-hydroxy-2-methyl-1-(4-dodecylphenyl)propanone; and 2-hydroxy-2-methyl-1-[(2-hydroxyethoxy)phenyl]propanone.

Illustrative bisacylphosphine oxide photoinitiators component c) ii) may be represented as the following formula:

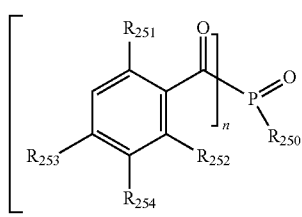

wherein $R_{250}$ is $C_1$-$C_{12}$ alkyl, cyclohexyl or phenyl which is unsubstituted or is substituted by 1 to 4 halogen or $C_1$-$C_8$ alkyl; n is 2; $R_{251}$ and $R_{252}$ are each independently of the other $C_1$-$C_8$ alkyl, or $C_1$-$C_8$ alkoxy; $R_{253}$ is hydrogen or $C_1$-$C_8$ alkyl; and $R_{254}$ is hydrogen or methyl. In some embodiments, $R_{250}$ may $C_2$-$C_{10}$ alkyl, cyclohexyl or phenyl which is unsubstituted or is substituted by 1 to 4 $C_1$-$C_4$ alkyl, Cl or Br. In some embodiments, $R_{250}$ may be $C_3$-$C_8$ alkyl, cyclohexyl or phenyl which is unsubstituted or is substituted in the 2-, 3-, 4- or 2,5-positions by $C_1$-$C_4$ alkyl. In some embodiments, $R_{250}$ may be $C_4$-$C_{12}$ alkyl or cyclohexyl, $R_{251}$ and $R_{252}$ are each independently of the other $C_1$-$C_8$ alkyl or $C_1$-$C_8$ alkoxy and $R_{253}$ is hydrogen or $C_1$-$C_8$ alkyl. In some embodiments, $R_{251}$ and $R_{252}$ may be $C_1$-$C_4$ alkyl and $R_{253}$ is hydrogen or $C_1$-$C_4$ alkyl. In some embodiments, $R_{251}$ and $R_{252}$ may be $C_1$-$C_4$ alkoxy and $R_{253}$ is hydrogen or $C_1$-$C_4$ alkyl. In some embodiments, $R_{251}$ and $R_{252}$ may be methyl and $R_{253}$ may be hydrogen or methyl. In some embodiments, $R_{251}$, $R_{252}$ and $R_{253}$ are all methyl. In some embodiments, $R_{251}$, $R_{252}$ and $R_{253}$ are methyl and $R_{254}$ is hydrogen. In some embodiments, $R_{251}$ and $R_{252}$ are methoxy, $R_{253}$ and $R_{254}$ is hydrogen. In some embodiments, $R_{250}$ is $C_3$-$C_8$ alkyl. In some embodiments, $R_{250}$ is isobutyl or isooctyl. In some embodiments, $R_{250}$ is phenyl.

Illustrative bisacylphosphine oxide photoinitiators include, but are not limited to, bis(2,4,6-trimethylbenzoyl)-phenylphosphine oxide; 2,4,6-trimethylbenzoyldiphenylphosphine oxide; 2,4,6-trimethylbenzoylphenyl phosphinate; and bis(2,6-dimethoxybenzoyl)-2,4,4-trimethylpentylphosphine oxide.

The alpha-hydroxy ketone photoinitiators of component c) i) may be present in the photocured hardcoat coating compositions from about 0.5% to about 7% by weight, based on the weight of the photocurable hardcoat coating composition. This includes from about 0.5% to about 2%, from about 1% to about 3% from about 1% to about 4%, from about 1% to about 5%, or from about 1% to about 6% by weight, based on the weight of the photocurable hardcoat coating. In some embodiments, the alpha-hydroxy ketone photoinitiators may be present from about 2% to about 7%, from about 3% to about 7%, from about 4% to about 7%, from about 5% to about 7%, or from about 6% to about 7% by weight, based on the weight of the photocurable hardcoat coating composition. In other embodiments, the alpha-hydroxy ketone photoinitiators may be present from about 2% to about 6% by weight, or from about 3% to about 5% by weight, based on the weight of the photocurable hardcoat coating composition.

The bisacylphosphine oxide photoinitiators of component c) ii) may be present from about 0.1% to about 3% by weight, based on the weight of the photocurable hardcoat coating composition. This includes from about 0.1% to about 1.5%, from about 0.1% to about 1%, or from about 0.1% to about 0.5% by weight, based on the weight of the photocurable hardcoat coating. In some embodiments, the present bisacylphosphine oxide photoinitiators is present from about 0.2% to 2%, from about 0.5% to about 2%, or from about 0.7% to about 2% by weight, based on the weight of the photocurable hardcoat coating composition. In other embodiments, the bisacylphosphine oxide photoinitator is present from about 0.2% to about 1.5%, or from about 0.5 to about 1% by weight, based on the weight of the photocurable hardcoat coating composition. The alpha-hydroxy ketone photoinitiator may be, for example, used in excess of the bisacylphosphine oxide photoinitiator.

A weight ratio of the alpha-hydroxy ketone to bisacylphosphine oxide may be from about 2:1 to about 15:1. This may include, from about 3:1 to about 12:1, from about 5:1 to about 10:1, from about 5:1 to about 9:1, from about 5:1 to about 8:1 or from about 5:1 to about 7:1. In some embodiments, the weight ratio of alpha-hydroxy ketone to bisacylphosphine oxide is from about 7:1 to about 15:1, from about 8:1 to about 15:1, from about 9:1 to about 15:1, from about 10:1 to about 15:1, or from about 12:1 to about 15:1. In some embodiments, the weight ratio of alpha-hydroxy ketone to bisacylphosphine oxide is from about 7:1 to about 12:1, or from about 8:1 to about 11:1.

Efficient curing of the present coatings may be achieved with the alpha-hydroxy ketone photoinitiator alone.

The ethylenically unsaturated polymerizable compounds component a) may have one, or more than one, olefinic double bonds. They may be low molecular weight (monomer or monomeric) or high molecular weight (oligomeric) compounds.

The ethylenically unsaturated polymerizable compounds component a) may include hydroxyalkyl acrylates, hydroxymethacrylates, acrylonitrile, acrylamide, methacrylamide, N-substituted (meth)acrylamides, vinyl esters, styrene, alkylstyrenes, halostyrenes, N-vinylpyrrolidone, vinyl chloride, vinylidene chloride, other monomers containing two to four double bonds, or a mixture of any two or more thereof.

Oligomeric polyunsaturated compounds of component a) may include acrylated epoxy resins, acrylated polyethers, acrylated polyurethanes, acrylated polyesters, esters of ethylenically unsaturated carboxylic acids and polyols or polyepoxides, unsaturated polyesters, polyamides and polyurethanes and co-polymers thereof, polybutadiene and butadiene co-polymers, polyisoprene and isoprene co-polymers, polymers and co-polymers containing (meth)acrylic groups in side-chains, unsaturated amides, oligomeric polyunsaturated compounds, urethane (meth)acrylate oligomer(s), acrylate monomer comprising three or four acrylate groups, methacrylate monomer comprising three or four methacrylate groups or mixtures thereof. In some embodiments, the oligomeric polyunsaturated compounds of component a) includes oligomeric polyunsaturated compounds include acrylated epoxy resins, acrylated polyethers, acrylated polyurethanes, acrylated polyesters, esters of ethylenically unsaturated carboxylic acids and polyols or polyepoxides, unsaturated polyesters, polyamides and polyurethanes, co-polymers containing (meth)acrylic groups in side-chains, oligomeric urethane (meth)acrylate oligomer(s), acrylate monomer comprising two, three, or four acrylate groups, methacrylate monomer comprising two, three, or four methacrylate groups, and mixtures of any two or more thereof.

Illustrative monomers of component a) containing one double bonds include alkyl or hydroxyalkyl acrylates or methacrylates, for example methyl acrylate, ethyl acrylate, butyl acrylate, 2-ethylhexyl acrylate, 2-hydroxyethyl acrylate, isobornyl acrylate, methyl methacrylate, ethyl methacrylate, acrylonitrile, acrylamide, methacrylamide, N-substituted (meth)acrylamides, vinyl esters such as vinyl acetate, vinyl ethers such as isobutyl vinyl ether, styrene, alkylstyrenes, halostyrenes, N-vinylpyrrolidone, vinyl chloride, vinylidene chloride, phenoxyethyl acrylate, 4-t-butylcyclohexyl acrylate, and mixtures of any two or more thereof.

Illustrative monomers of component a) containing more than one double bond include, but are not limited to, ethylene glycol diacrylate, propylene glycol diacrylate, neopentyl glycol diacrylate, hexamethylene glycol diacrylate, bisphenol A diacrylate, 4,4'-bis(2-acryloyloxyethoxy)diphenylpropane, trimethylolpropane triacrylate, pentaerythritol triacrylate and tetraacrylate, pentaerythritol divinyl ether, vinyl acrylate, divinyl benzene, divinyl succinate, diallyl phthalate, triallyl phosphate, triallyl isocyanurate, or tris(2-acryloylethyl)isocyanurate. Further examples of unsaturated oligomers may include unsaturated polyester resins, which are usually prepared from maleic acid, phthalic acid and one or more diols and which have molecular weights of greater than about 500. Unsaturated oligomers of this type are also known as prepolymers. In some embodiments, the component a) containing more than one double bond includes, ethylene glycol diacrylate, propylene glycol diacrylate, neopentyl glycol diacrylate, aliphatic urethane (meth)acrylates, aromatic urethane (meth)acrylates, hexamethylene glycol diacrylate, bisphenol A diacrylate, 4,4'-bis(2-acryloyloxyethoxy)diphenylpropane, trimethylolpropane triacrylate, pentaerythritol triacrylate and tetraacrylate, pentaerythritol divinyl ether, vinyl acrylate, divinyl benzene, divinyl succinate, diallyl phthalate, triallyl phosphate, triallyl isocyanurate, tris(2-acryloylethyl)isocyanurate, and mixtures of any two more thereof.

Illustrative unsaturated compounds of component a) include esters of ethylenically unsaturated carboxylic acids and polyols or polyepoxides, and polymers containing ethylenically unsaturated groups in the chain or in side groups, including unsaturated polyesters, polyamides and polyurethanes and co-polymers thereof, polybutadiene and butadiene co-polymers, polyisoprene and isoprene co-polymers, polymers and co-polymers containing (meth)acrylic groups in side-chains, as well as mixtures of more than one such polymer.

In some embodiments, the component a) containing esters may include trimethylolethane triacrylate, trimethylolpropane trimethacrylate, trimethylolethane trimethacrylate, tetramethylene glycol dimethacrylate, triethylene glycol dimethacrylate, tetraethylene glycol diacrylate, pentaerythritol diacrylate, dipentaerythritol diacrylate, dipentaerythritol triacrylate, dipentaerythritol tetraacrylate, dipentaerythritol pentacrylate, dipentaerythritol hexacrylate, tripentaerythrtol octacrylate, pentaerythritol dimethacrylate, pentaerythritol trimethacrylate, dipentaerythritol dimethacrylate, dipentaerythritol tetramethacrylate, tripentaerythritol octamethacrylate, pentaerythritol diitaconate, dipentaerythritol trisitaconate, dipentaerythritol pentaitaconate, dipentaerythritol hexaitaconate, 1,3-butanediol diacrylate, 1,3-butanediol dimethacrylate, 1,4-butanediol diitaconate, sorbitol triacrylate, sorbitol tetraacrylate, pentaerythritol-modified triacrylate, sorbitol tetramethacrylate, sorbitol pentacrylate, sorbitol hexacrylate, oligoester acrylates and methacrylates, glycerol di- and-triacrylate, 1,4-cyclohexanediacrylate, bisacrylates and bismethacrylates of polyethylene glycol having molecular weights of 200 to 1500, 1,3-butylene glycol diacrylate, 1,4-butanediol diacrylate, 1,6-hexanediol diacrylate, 1,6-hexanediol monoacrylate monomethacrylate, alkoxylated aliphatic diacrylate, alkoxylated cyclohexane dimethanol diacrylate, alkoxylated hexanediol diacrylate, alkoxylated neopentyl glycol diacrylate, caprolactone modified neopentylglycol hydroxypivalate diacrylate, caprolactone modified neopentylglycol hydroxypivalate diacrylate, cyclohexanedimethanol diacrylate, diethylene glycol diacrylate, dipropylene glycol diacrylate, ethoxylated (10) bisphenol A diacrylate, ethoxylated (3) bisphenol A diacrylate, ethoxylated (30) bisphenol A diacrylate, ethoxylated (4) bisphenol A diacrylate, hydroxypivalaldehyde modified trimethylolpropane diacrylate, neopentyl glycol diacrylate, polyethylene glycol (200) diacrylate, polyethylene glycol (400) diacrylate, polyethylene glycol (600) diacrylate, propoxylated neopentyl glycol diacrylate, tetraethylene glycol diacrylate, tricyclodecanedimethanol diacrylate, triethylene glycol diacrylate, tripropylene glycol diacrylate, or a mixture of any two or more thereof.

Illustrative examples of unsaturated carboxylic acids component a) include acrylic acid, methacrylic acid, crotonic acid, itaconic acid, cinnamic acid, unsaturated fatty acids such as linolenic acid or oleic acid.

In some embodiments, component a) may be a tri(meth)acryl containing compound such as, but not limited to, glycerol triacrylate, trimethylolpropane triacrylate, ethoxylated triacrylates (for example, ethoxylated (3) trimethylolpropane triacrylate, ethoxylated (6) trimethylolpropane triacrylate, ethoxylated (9) trimethylolpropane triacrylate, ethoxylated (20) trimethylolpropane triacrylate), pentaerythritol triacrylate, propoxylated triacrylates (for example, propoxylated (3) glyceryl triacrylate, propoxylated (5.5) glyceryl triacrylate, propoxylated (3) trimethylolpropane triacrylate, propoxylated (6) trimethylolpropane triacrylate), trimethylolpropane triacrylate, pentaerythritol triacrylate, tris(2-hydroxyethyl)isocyanurate triacrylate, and mixtures of any two or more thereof.

In some embodiments, component a) may include pentaerythritol divinyl ether, vinyl methacrylate, divinyl benzene, divinyl succinate, diallyl phthalate, triallyl phosphate, triallyl i socyanurate, tri s(2-acryloylethyl)i socyanurate, ethylene glycol diacrylate, propylene glycol diacrylate, neopentyl glycol diacrylate, hexamethylene glycol diacrylate, bisphenol A diacrylate, trimethylolpropane triacrylate, propyleneglycol diacrylate, hexanediol diacrylate, tripropyleneglycol diacrylate, trimethylolpropane triacrylate, urethane methacrylate oligomers, urethane acrylate oligomers, and mixtures of any two or more thereof.

In some embodiments, component a) may include thylene glycol diacrylate, propylene glycol diacrylate, neopentyl glycol diacrylate, hexamethylene glycol diacrylate, bisphenol A diacrylate, trimethylolpropane triacrylate, propyleneglycol diacrylate, hexanediol diacrylate, tripropyleneglycol diacrylate, trimethylolpropane triacrylate, urethane methacrylate oligomers, urethane acrylate oligomers, and mixtures of any two or more thereof.

Suitable polyols include aromatic, aliphatic and cycloaliphatic polyols. Aromatic polyols may be, but are not limited to, hydroquinone, 4,4'-dihydroxydiphenyl, 2,2-bis(4-hydroxyphenyl)propane, novolacs, and cresols. Polyepoxides include those based on the cited polyols, for instance on the aromatic polyols and epichlorohydrin. Further suitable polyols are polymers and co-polymers which contain hydroxyl groups in the polymer chain or in side groups, for example polyvinyl alcohol and co-polymers thereof or hydroxyalkyl polymethacrylates or co-polymers thereof. Other suitable polyols are oligoesters carrying hydroxyl end groups.

Illustrative examples of aliphatic and cycloaliphatic polyols are alkylenediols containing for example 2 to 12 carbon atoms, including ethylene glycol, 1,2- or 1,3-propanediol, 1,2-, 1,3- or 1,4-butanediol, pentanediol, hexanediol, octanediol, dodecanediol, diethylene glycol, triethylene glycol, polyethylene glycols having molecular weights of for instance 200 to 1500, 1,3-cyclopentanediol, 1,2-, 1,3-, or 1,4-cyclohexanediol, 1,4-dihydroxymethylcyclohexane, glycerol, tris(β-hydroxyethyl)amine, trimethylolethane, trimethylolpropane, pentaerythritol, dipentaerythritol and sorbitol.

The polyols may be esterified partially or completely with one or with different unsaturated carboxylic acids, in which case the free hydroxyl groups of the partial esters may be modified, for example etherified, or esterified with other carboxylic acids.

Illustrative examples of esters component a) include, but are not limited to, trimethylolpropane triacrylate, trimethylolethane triacrylate, trimethylolpropane trimethacrylate, trimethylolethane trimethacrylate, tetramethylene glycol dimethacrylate, triethylene glycol dimethacrylate, tetraethylene glycol diacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, dipentaerythritol pentacrylate, dipentaerythritol hexacrylate, tripentaerythrtol octacrylate, pentaerythritol dimethacrylate, pentaerythritol trimethacrylate, dipentaerythritol dimethacrylate, dipentaerythritol tetramethacrylate, tripentaerythritol octamethacrylate, pentaerythritol diitaconate, dipentaerythritol trisitaconate, dipentaerythritol pentaitaconate, dipentaerythritol hexaitaconate, ethylene glycol diacrylate, 1,3-butanediol diacrylate, 1,3-butanediol dimethacrylate, 1,4-butanediol diitaconate, sorbitol triacrylate, sorbitol tetraacrylate, pentaerythritol-modified triacrylate, sorbitol tetramethacrylate, sorbitol pentacrylate, sorbitol hexacrylate, oligoester acrylates and methacrylates, glycerol di- and-triacrylate, 1,4-cyclohexanediacrylate, bisacrylates and bismethacrylates of polyethylene glycol having molecular weights of 200 to 1500, or mixtures of any two or more thereof.

Suitable ethylenically unsaturated polymerizable compounds of component a) may include amides of identical or different unsaturated carboxylic acids of aromatic, cycloaliphatic and aliphatic polyamines containing for instance 2 to 6, for example 2 to 4, amino groups. Exemplary of such polyamines are ethylenediamine, 1,2- or 1,3-propylenediamine, 1,2-, 1,3- or 1,4-butylenediamine, 1,5-pentylenediamine, 1,6-hexylenediamine, octylenediamine, dodecylenediamine, 1,4-diaminocyclohexane, isophoronediamine, phenylenediamine, bisphenylenediamine, bis(.beta.-aminoethyl)ether, diethylenetriamine, triethylenetetramine, bis (.quadrature.-aminoethoxy)ethane or bis(.beta.-aminopropoxy)ethane. Other suitable polyamines are polymers and co-polymers which may contain additional amino groups in the side-chain and oligoamides containing amino end groups. Illustrative unsaturated amides include methylenebisacrylamide, 1,6-hexamethylenebisacrylamide, diethylenetriaminetrismethacrylamide, bis(methacrylamidopropoxy)ethane, beta-methacrylamidoethylmethacrylate, and N-[(beta-hydroxyethoxy)ethyl]acrylamide.

Illustrative unsaturated polyesters and polyamides component a) include those that are derived from maleic acid and diols or diamines. Maleic acid may be partially replaced by other dicarboxylic acids such as fumaric acid, itaconic acid, citraconic acid, mesaconic acid or chloromaleic acid. To control the reactivity of the polyester and to influence the crosslinking density and hence the product properties, it is possible to use in addition to the unsaturated dicarboxylic acids different amounts of saturated dicarboxylic acids such as phthalic acid, isophthalic acid, terephthalic acid, tetrahydrophthalic acid, succinic acid, or adipic acid. The unsaturated polyesters may be used together with ethylenically unsaturated comonomers such as styrene. The polyesters and polyamides can also be derived from dicarboxylic acids and ethylenically unsaturated diols or diamines, especially from those with long chains containing typically from 6 to 20 carbon atoms. Polyurethanes are typically those derived from saturated or unsaturated diisocyanates and unsaturated and saturated diols.

Illustrative polyester acrylates or acrylated polyesters component a) may be obtained by reacting oligomers, typically epoxides, urethanes, polyethers or polyesters, with acrylates such as hydroxyethyl acrylate or hydroxypropyl acrylate.

Polybutadiene and polyisoprene and co-polymers thereof are known. Suitable comonomers include olefins such as ethylene, propene, butene, hexene, (meth)acrylates, acrylonitrile, styrene or vinyl chloride. Polymers containing (meth)acrylate groups in the side-chain are also known. They may typically be reaction products of epoxy resins based on novolak with (meth)acrylic acid, homo- or co-polymers of polyvinyl alcohol or their hydroxyalkyl derivatives which are esterified with (meth)acrylic acid or homo- and co-polymers of (meth)acrylates which are esterified with hydroxyalkyl(meth)acrylates.

Monomers component a) may be for instance alkyl- or hydroxyalkyl acrylates or methacrylates, styrene, ethylene glycol diacrylate, propylene glycol diacrylate, neopentyl glycol diacrylate, hexamethylene glycol diacrylate or bisphenol A diacrylate, 4,4'-bis(2-acryloyloxyethoxy)diphenylpropane, trimethylolpropane triacrylate, pentaerythritol triacrylate or tetraacrylate, for instance acrylates, styrene, hexamethylene glycol or bisphenol A diacrylate, 4,4'-bis(2-acryloyloxyethoxy)diphenylpropane, or trimethylolpropane triacrylate.

Oligomeric polyunsaturated compounds component a) may be, for instance, polyester acrylates or unsaturated polyester resins which are prepared from maleic acid, fumaric acid, phthalic acid and one or more than one diol, and which typically have molecular weights from about 500 to about 3000 g/mol. Unsaturated carboxylic acids component a), may, in some embodiments, be acrylic acid and methacrylic acid.

Photocured hardcoat films are also provided herein and are formed from the reaction product of a photopolymerizable composition comprising one or more urethane (meth)acrylate oligomer(s) of component a). In some embodiments, the urethane (meth)acrylate oligomer is a di(meth) acrylate. The term "(meth)acrylate" is used to designate esters of acrylic and methacrylic acids, and "di(meth)acrylate" designates a molecule containing two (meth)acrylate groups.

Oligomeric urethane (meth)acrylates of component a) may be prepared by the initial reaction of an alkylene or aromatic diisocyanate of the Formula OCN—$R_{403}$—NCO with a polyol. Most often, the polyol is a diol of the Formula HO—$R_{400}$—OH, wherein $R_{403}$ is a $C_{2\text{-}100}$ alkylene or an arylene group and $R_{400}$ is a $C_{2\text{-}100}$ alkylene or alkoxy group. The intermediate product is then a urethane diol diisocyanate, which subsequently can undergo reaction with a hydroxyalkyl (meth)acrylate. Suitable diisocyanates include alkylene diisocyanates such as 2,2,4-trimethylhexylene diisocyanate. The urethane (meth)acrylate oligomer employed herein is preferably aliphatic.

The urethane (meth)acrylate oligomer of component a) contributes to the conformability and flexibility of the cured hardcoat composition. In some embodiments, a 5 micron thick film of the photocurable hardcoat composition is sufficiently flexible such that cracking is minimized. In addition to being flexible, the photocured hardcoat may exhibit good durability and abrasion resistance.

Illustrative urethane (meth)acrylate oligomers that may be employed in the photocurable hardcoat composition are available from SARTOMER Company (Exton, Pa.) under the trade designation CN981B88 and CN991. CN981B88 is described as an aliphatic urethane (meth)acrylate oligomer available from SARTOMER Company under the trade designation CN981 blended with SR238 (1,6 hexanediol diacrylate).

The urethane (meth)acrylate oligomer of component a) may be combined with at least one multi(meth)acrylate monomer comprising three or four (meth)acrylate groups. The multi(meth)acrylate monomer is believed to increase the crosslinking density and thereby contribute the durability and abrasion resistance to the photocured hardcoat.

Suitable tri(meth)acryl containing compounds may include, but are not limited to, glycerol triacrylate, trimethylolpropane triacrylate, ethoxylated triacrylates (for example, ethoxylated (3) trimethylolpropane triacrylate, ethoxylated (6) trimethylolpropane triacrylate, ethoxylated (9) trimethylolpropane triacrylate, ethoxylated (20) trimethylolpropane triacrylate), pentaerythritol triacrylate, propoxylated triacrylates (for example, propoxylated (3) glyceryl triacrylate, propoxylated (5.5) glyceryl triacrylate, propoxylated (3) trimethylolpropane triacrylate, propoxylated (6) trimethylolpropane triacrylate), trimethylolpropane triacrylate, pentaerythritol triacrylate, and tris(2-hydroxyethyl)isocyanurate triacrylate. Higher functionality (meth)acryl containing compounds include ditrimethylolpropane tetraacrylate, ethoxylated (4) pentaerythritol tetraacrylate, and pentaerythritol tetraacrylate.

The photocurable hardcoat composition may also include one or more di(meth)acryl containing compounds. Such illustrative monomers include, for example, 1,3-butylene glycol diacrylate, 1,4-butanediol diacrylate, 1,6-hexanediol diacrylate, 1,6-hexanediol monoacrylate monomethacrylate, ethylene glycol diacrylate, alkoxylated aliphatic diacrylate, alkoxylated cyclohexane dimethanol diacrylate, alkoxylated hexanediol diacrylate, alkoxylated neopentyl glycol diacrylate, caprolactone modified neopentylglycol hydroxypivalate diacrylate, caprolactone modified neopentylglycol hydroxypivalate diacrylate, cyclohexanedimethanol diacrylate, diethylene glycol diacrylate, dipropylene glycol diacrylate, ethoxylated (10) bisphenol A diacrylate, ethoxylated (3) bisphenol A diacrylate, ethoxylated (30) bisphenol A diacrylate, ethoxylated (4) bisphenol A diacrylate, hydroxypivalaldehyde modified trimethylolpropane diacrylate, neopentyl glycol diacrylate, polyethylene glycol (200) diacrylate, polyethylene glycol (400) diacrylate, polyethylene glycol (600) diacrylate, propoxylated neopentyl glycol diacrylate, tetraethylene glycol diacrylate, tricyclodecanedimethanol diacrylate, triethylene glycol diacrylate, and tripropylene glycol diacrylate.

It has been found that when substantial concentrations of (meth)acrylate monomer having greater than four (meth)acrylate groups are employed, the flexibility of the hardcoat is reduced. Hence, when such monomers are employed, the concentration is typically less than 40 wt %, 30 wt %, 20 wt %, 10 wt %, 5 wt %, or 3 wt % solids of the total hardcoat composition. In some embodiments, the hardcoat composition is free of monomers comprising more than four (meth)acrylate groups.

In some embodiments, the photocurable hardcoat composition, or an underlying layer, contains (e.g. surface modified) inorganic particles that add mechanical strength and durability to the resultant coating. The inorganic nanoparticles can include, for example, silica, alumina, or zirconia (the term "zirconia" includes zirconia metal oxide) nanoparticles. In some embodiments, the nanoparticles have a mean diameter from about 1 to about 200 nm; about 5 to about 150 nm; or about 5 to about 125 nm. The nanoparticles may be present in an amount from about 10 to about 200 parts per 100 parts of hardcoat layer monomer.

Illustrative silica nanoparticles are commercially available from NALCO CHEMICAL CO. (Naperville, Ill.) under the product designation NALCO COLLOIDAL SILICAS. For example, silicas include NALCO products 1040, 1042, 1050, 1060, 2327 and 2329. Useful zirconia nanoparticles are commercially available from Nalco Chemical Co. (Naperville, Ill.) under the product designation NALCO OOS-SOO8.

Various high refractive index inorganic oxide particles may be employed such as for example zirconia ("$ZrO_2$"), titania ("$TiO_2$"), antimony oxides, alumina, tin oxides, alone or in combination of any two or more such materials. Mixed metal oxides may also be employed. Zirconias for use in the high refractive index layer are available from NALCO CHEMICAL CO. under the trade designation "Nalco OOS-SOO8" and from Buhler AG Uzwil, Switzerland under the trade designation "Buhler zirconia Z-WO sol." Zirconia nanoparticles may also be prepared as described in U.S. Pat. Nos. 7,241,437 and 6,376,590.

Surface treating or surface modification of the nanoparticles may provide a stable dispersion in the photocured hardcoat layer resin. The surface-treatment may stabilize the nanoparticles so that the particles will be well dispersed in the photocurable hardcoat composition and result in a substantially homogeneous composition. Furthermore, the nanoparticles may be modified over at least a portion of its surface with a surface treatment agent so that the stabilized particle can copolymerize or react with the photocurable hardcoat layer resin during curing.

The method of forming the hardcoated article or hardcoat protective film includes providing a (e.g. light transmissible) substrate layer and providing the composition on the (optionally primed) substrate layer. The photocurable coating composition is then dried to remove the solvent and cured by exposure to ultraviolet radiation (e.g. using an H-bulb or other lamp) at a desired wavelength or an electron beam or light emitting diode. The curing may be conducted in an inert atmosphere (defined as an atmosphere having less than 50 parts per million $O_2$). Alternatively, a transferable photocurable hardcoat film may be formed coating the composition to a release liner, at least partially cured, and subsequently transferring from the release layer to the substrate using a thermal transfer or photoradiation application technique.

The photocurable hardcoat composition may be applied as a single or multiple layers directly to an article or (e.g. light transmissive) film substrate using conventional film application techniques. Alternatively, the hardcoat may be applied to a release liner, at least partially cured, and transfer coated using a thermal transfer or a photoradiation application technique. Although it is usually convenient for the substrate to be in the form of a roll of continuous web, the coatings may be applied to individual sheets.

Photopolymerizable and photocurable are understood to mean to the same thing: a coating composition that is photocured or polymerized with UV light. The instant photocurable hard coat compositions are not thermally cure coatings. Rather, the instant photocurable hardcoat compositions are cured by UV light resulting in the photocured hardcoat coating layer or protective film.

The photopolymerizable or photocurable compounds component a) are used by themselves or in any desired mixtures. In some embodiments, it is suitable to use mixtures of polyol(meth)acrylates.

Binders may also be added to the unsaturated photopolymerizable compounds of component a). Binders may be used when the photopolymerizable compounds are liquid or viscous substances. The amount of binder may be from about 5 wt % to about 95 wt %, based upon the entire composition. This includes from about 10 wt % to about 90 wt %, or from about 40 wt % to about 90 wt %, based on the entire composition. The choice of binder will depend on the field of use and the desired properties therefore, such as the ability of the compositions to be developed in aqueous and organic solvent systems, adhesion to substrates and susceptibility to oxygen.

Suitable binders are typically polymers having a molecular weight of about 5,000 to 2,000,000, for instance 10,000 to 1,000,000. Illustrative examples include, but are not limited to, homopolymers and co-polymers of acrylates and methacrylates, including co-polymers of methyl methacrylate/ethyl acrylate/methacrylic acid, poly(alkylmethacrylates), poly(alkylacrylates); cellulose esters and ethers such as cellulose acetate, cellulose acetobutyrate, methyl cellulose, ethyl cellulose; polyvinyl butyral, polyvinyl formal, cyclized rubber, polyethers such as polyethylene oxide, polypropylene oxide, polytetrahydrofuran; polystyrene, polycarbonate, polyurethane, chlorinated polyolefins, polyvinyl chloride, co-polymers of vinyl chloride/vinylidene chloride, co-polymers of vinylidene chloride with acrylonitrile, methyl methacrylate and vinyl acetate, polyvinyl acetate, co-poly(ethylene/vinyl acetate), polymers such as polycaprolactam and poly(hexamethylene adipamide), polyesters such as poly(ethylene glycol terephthalate) and poly(hexamethylene glycol succinate).

The unsaturated compounds component a) may also be used in an admixture with non-photopolymerizable film-forming components. These components may be physically drying polymers or solutions thereof in organic solvents, for example nitrocellulose or cellulose acetobutyrate. The photopolymerizable unsaturated monomers may be a component of a free radical-ionic curable blend, such as a free radical-cationic curable blend. Without being bound by theory, it is believed that the polyunsaturated monomer acts as crosslinking agent that renders the photocured film insoluble. The mono-unsaturated monomer acts as a reactive diluent with the aid of which the viscosity is lowered without having to use a solvent. Moreover, properties of the cured composition such as curing rate, crosslinking density and surface properties are dependent on the choice of monomer. Unsaturated polyester resins are usually used in two-component systems, together with a mono-unsaturated monomer, for example with styrene.

Binary electron-rich/electron-poor monomer systems are often employed in thick pigmented coatings. For example, styrene/unsaturated polyester systems are used in gel coats.

An interesting process is that wherein the ethylenically unsaturated polymerizable compounds of component a) are a mixture of 1) unsaturated polyesters, especially those that are prepared from maleic acid, fumaric acid and/or phthalic acid and one or more than one diol, and which have molecular weights of 500 to 3,000, and 2) acrylates, methacrylates or styrene or combinations thereof.

An important process is also that wherein the ethylenically unsaturated polymerizable compounds of component a) are a mixture of 1) unsaturated polyesters and 2) acrylates or methacrylates or combinations thereof.

Another interesting process is that wherein the ethylenically unsaturated polymerizable compounds of component a) are a mixture of 1) unsaturated polyester acrylates and 2) acrylates or methacrylates or combinations thereof.

The present coating layers exhibit a transmission of ≤0.1% at 290 nm-360 nm, ≤0.5% at 400 nm, and ≤12% at 420 nm. Such transmissions may be exhibited in a single photocured coating layer at a thickness of about 0.2 mil, about 1 mil, about 2 mil, about 3 mil, about 4 mil, and about 5 mil (note: 1 mil is equal to 25.4 micrometers). The transmission of a cured coating layer is measured in adherence to a fused silica glass plate that is UV transparent.

The present photocured hard coat coatings or protective films derived from the photocurable hardcoat coating compositions exhibit enhanced durability and superior exterior weathering performance.

The photocurable hardcoat coating compositions may additionally contain further additives. Illustrative additives may include thermal inhibitors intended to prevent premature polymerization. Illustrative thermal inhibitors include hydroquinone, hydroquinone derivatives, p-methoxyphenyl, β-naphthol, or sterically hindered phenyls, such as 2,6-di(tert-butyl)-p-cresol. To enhance the dark storage stability other additives may be uses such as copper compounds, including copper naphthenate, copper stearate, or copper octoate; phosphorus compounds, including triphenylphosphine, tributylphosphine, triethyl phosphite, triphenyl phosphite, or tribenzyl phosphite; quaternary ammonium compounds, such as tetramethylammonium chloride or trimethylbenzylammonium chloride; or hydroxylamine derivatives, such as N-diethylhydroxylamine. The exclusion of atmospheric oxygen during the photopolymerization may be effected by adding paraffin or similar wax-like substances which, at the onset of photopolymerization, migrate to the surface owing to lack of solubility in the polymer and form a transparent film which prevents air from entering the system.

The instant photocurable hardcoat coating compositions which are employed in the invention have a viscosity of about 100 to 3000 cps (centipoise). This includes viscosities of about 100 to about 2000 cps, about 100 to about 1500 cps, or about 100 to about 1000 cps.

The sterically hindered amine light stabilizers ("HALS") contain at least one moiety of Formula

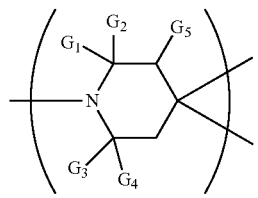

where $G_1$, $G_2$, $G_3$, $G_4$ and $G_5$ are independently alkyl of 1 to 8 carbon atoms or $G_1$ and $G_2$ or $G_3$ and $G_4$ together are pentamethylene.

Illustrative hindered amines are disclosed in, for example, U.S. Pat. Nos. 5,004,770; 5,204,473; 5,096,950; 5,300,544; 5,112,890; 5,124,378; 5,145,893; 5,216,156; 5,844,026; 5,980,783; 6,046,304; 6,117,995; 6,271,377; 6,297,299; 6,392,041; 6,376,584; and 6,472,456, while illustrative hindered hydroxyalkoxyamine stabilizers are disclosed in, for example, U.S. Pat. Nos. 6,271,377; 6,392,041; and 6,376,584.

Illustrative hindered amine light stabilizers include, but are not limited to, 1-cyclohexyloxy-2,2,6,6-tetramethyl-4-octadecylaminopiperidine; bis(2,2,6,6-tetramethylpiperidin-4-yl) sebacate; bis(1-acetoxy-2,2,6,6-tetramethylpiperidin-4-yl) sebacate; bis(1,2,2,6,6-pentamethyl-4-yl) sebacate; bis(1-cyclohexyloxy-2,2,6,6-tetramethylpiperidin-4-yl) sebacate; bis(1-octyloxy-2,2,6,6-tetramethylpiperidin-4-yl) sebacate; bis(1-acyl-2,2,6,6-tetramethylpiperidin-4-yl) sebacate; bis(1,2,2,6,6-pentamethyl-4-piperidyl)-n-butyl-3,5-di-tert-butyl-4-hydroxybenzylmalonate; 2,4-bis[(1-cyclohexyloxy-2,2,6,6-tetramethylpiperidin-4-yl)-butylamino]-6-(2-hydroxyethylamino-s-triazine; bis(1-cyclohexyloxy-2,2,6,6-tetramethylpiperidin-4-yl)-adipate; 2,4-bis[(1-cyclohexyloxy-2,2,6,6-piperidin-4-yl)-butylamino]-6-chloro-s-triazine; 1-(2-hydroxy-2-methylpropoxy)-4-hydroxy-2,2,6,6-tetramethylpiperidine; 1-(2-hydroxy-2-methylpropoxy)-4-oxo-2,2,6,6-tetramethylpiperidine; 1-(2-hydroxy-2-methylpropoxy)-4-octadecanoyloxy-2,2,6,6-tetramethylpiperidine; bis(1-(2-hydroxy-2-methylpropoxy)-2,2,6,6-tetramethylpiperidin-4-yl) sebacate; bis(1-(2-hydroxy-2-methylpropoxy)-2,2,6,6-tetramethylpiperidin-4-yl) adipate; 2,4-bis{N-[1-(2-hydroxy-2-methylpropoxy)-2,2,6,6-tetramethylpiperidin-4-yl]-N-butylamino}-6-(2-hydroxyethylamino)-s-triazine; 4-benzoyl-2,2,6,6-tetramethylpiperidine; di-(1,2,2,6,6-pentamethylpiperidin-4-yl) p-methoxybenzylidenemalonate; 4-stearyloxy-2,2,6,6-tetramethylpiperidine; bis(1-octyloxy-2,2,6,6-tetramethylpiperidyl) succinate; 1,2,2,6,6-pentamethyl-4-aminopiperidine; 2-undecyl-7,7,9,9-tetramethyl-1-oxa-3,8-diaza-4-oxo-spiro[4,5]decane; tris(2,2,6,6-tetramethyl-4-piperidyl) nitrilotriacetate; tris(2-hydroxy-3-(amino-(2,2,6,6-tetramethylpiperidin-4-yl)propyl) nitrilotriacetate; tetrakis-(2,2,6,6-tetramethyl-4-piperidyl)-1,2,3,4-butane-tetracarboxylate; tetrakis-(1,2,2,6,6-pentamethyl-4-piperidyl)-1,2,3,4-butane-tetracarboxylate; 1,1'-(1,2-ethanediyl)-bis-(3,3,5,5-tetramethylpiperazinone); 3-n-octyl-7,7,9,9-tetramethyl-1,3,8-triazaspiro[4.5]decan-2,4-dione; 8-acetyl-3-dodecyl-7,7,9,9-tetramethyl-1,3,8-triazaspiro[4.5]decane-2,4-dione; 3-dodecyl-1-(2,2,6,6-tetramethyl-4-piperidyl)pyrrolidin-2,5-dione; 3-dodecyl-1-(1,2,2,6,6-pentamethyl-4-piperidyl)pyrrolidine-2,5-dione; N,N'-bis-formyl-N,N'-bis(2,2,6,6-tetramethyl-4-piperidyl) hexamethylenediamine; the reaction product of 2,4-bis[(1-cyclohexyloxy-2,2,6,6-piperidin-4-yl)butylamino]-6-chloro-s-triazine with N,N'-bis(3-aminopropyl) ethylenediamine); the condensate of 1-(2-hydroxyethyl)-2,2,6,6-tetramethyl-4-hydroxypiperidine and succinic acid; linear or cyclic condensates of N,N'-bis(2,2,6,6-tetramethyl-4-piperidyl)-hexamethylenediamine and 4-tert-octylamino-2,6-dichloro-1,3,5-triazine; linear or cyclic condensates of N,N'-bis(2,2,6,6-tetramethyl-4-piperidyl)-hexamethylenediamine and 4-cyclohexylamino-2,6-dichloro-1,3,5-triazine; linear or cyclic condensates of N,N'-bis-(2,2,6,6-tetramethyl-4-piperidyl)-hexamethylenediamine and 4-morpholino-2,6-dichloro-1,3,5-triazine; linear or cyclic condensates of N,N'-bis-(1,2,2,6,6-pentamethyl-4-piperidyl) hexamethylenediamine and 4-morpholino-2,6-dichloro-1,3,5-triazine; the condensate of 2-chloro-4,6-bis(4-n-butylamino-2,2,6,6-tetramethylpiperidyl)-1,3,5-triazine and 1,2-bis(3-aminopropylamino)ethane; the condensate of 2-chloro-4,6-di-(4-n-butylamino-1,2,2,6,6-pentamethylpiperidyl)-1,3,5-triazine and 1,2-bis-(3-aminopropylamino)ethane; a reaction product of 7,7,9,9-tetramethyl-2-cycloundecyl-1-oxa-3,8-diaza-4-oxospiro [4,5]decane and epichlorohydrin; poly[methyl, (3-oxy-(2,2,6,6-tetramethylpiperidin-4-yl)propyl)] siloxane, CAS#182635-99-0; the reaction product of maleic acid anhydride-$C_{18}$-$C_{22}$-α-olefin-copolymer with 2,2,6,6-tetramethyl-4-aminopiperidine; the oligomeric compound which is the condensation product of 4,4'-hexamethylenebis(amino-2,2,6,6-tetramethylpiperidine) and 2,4-dichloro-6-[(2,2,6,6-tetramethylpiperidin-4-yl)butylamino]-s-triazine end-capped with 2-chloro-4,6-bis(dibutylamino)-s-triazine; the oligomeric compound which is the condensation product of 4,4'-hexamethylenebis(amino-1,2,2,6,6-pentamethylpiperidine) and 2,4-dichloro-6-[(1,2,2,6,6-pentaamethylpiperidin-4-yl)butylamino]-s-triazine end-capped with 2-chloro-4,6-bis(dibutylamino)-s-triazine; the oligomeric compound which is the condensation product of 4,4'-hexamethylenebis(amino-1-propoxy-2,2,6,6-tetramethylpiperidine) and 2,4-dichloro-6-[(1-propoxy-2,2,6,6-tetramethylpiperidin-4-yl)butylamino]-s-triazine end-capped with 2-chloro-4,6-bis(dibutylamino)-s-triazine; the oligomeric compound which is the condensation product of 4,4'-hexamethylenebis(amino-1-acyloxy-2,2,6,6-tetramethylpiperidine) and 2,4-dichloro-6-[(1-acyloxy-2,2,6,6-tetramethylpiperidin-4-yl)butylamino]-s-triazine end-capped with 2-chloro-4,6-bis(dibutylamino)-s-triazine; and a product obtained by reacting a product, obtained by reacting 1,2-bis(3-aminopropylamino)ethane with cyanuric chloride and (2,2,6,6-tetramethylpiperidin-4-yl)butylamine. Also included are the sterically hindered N—H, N-methyl, N-methoxy, N-propoxy, N-octyloxy, N-cyclohexyloxy, N-acyloxy, and N-(2-hydroxy-2-methylpropoxy) analogues of any of the above mentioned compounds. For example, replacing an N—H hindered amine with an N-methyl hindered amine would be employing the N-methyl analogue in place of the N-H.

For illustrative purposes, some of the structures for the above-named compounds are shown below:

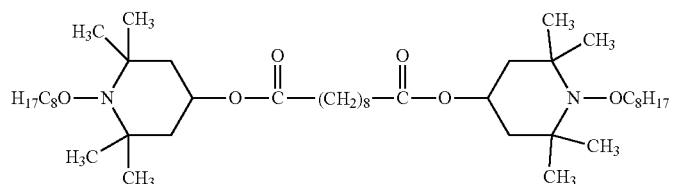

(bis(1-octyloxy-2,2,6,6-tetramethylpiperidin-4-yl) sebacate)

-continued

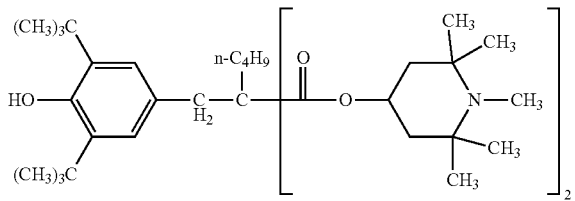
(bis(1,2,2,6,6-pentamethyl-4-piperidyl) n-butyl-3,5-di-tert-butyl-4-hydroxybenzymalonate)

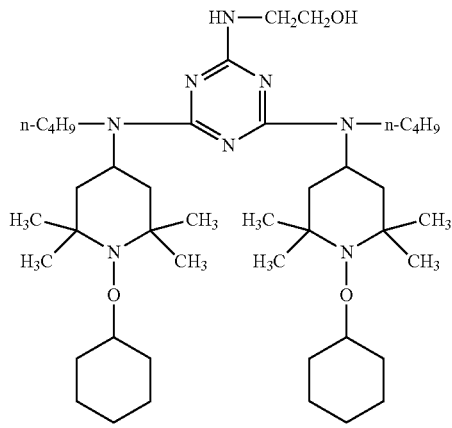
(2,4-bis[(1-cyclohexyloxy-2,2,6,6-tetramethylpiperidin-4-yl)butylamino]-6-(2-hydroxyethyl-amino-s-triazine)

(1-(2-hydroxy-2-methylpropoxy)-4-hydroxy-2,2,6,6-tetramethylpiperidine)   (di-(1,2,2,6,6-pentamethylpiperidin-4-yl) p-methoxybenzylidenemalonate)

(2-undecyl-7,7,9,9-tetramethyl-1-oxa-3,8-diaza-4-oxo-spiro[4,5]decane)   (tris(2-hydroxy-3-(amino-(2,2,6,6-tetramethylpiperidin-4-y:)propyl) nitrilotriacetate)

(tetrakis-(2,2,6,6-tetramethyl-4-piperidyl)-1,2,3,4-butane-tetrracarboxylate)   (1,1'-(1,2-ethanediyl)-bis(3,3,5,5-tetramethylpiperzainone))

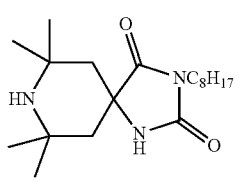

(3-n-octyl-7,7,9,9-tetramethyl-1,3,8-triazaspiro[4.5]decan-2,4-dione)

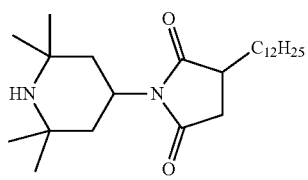

(3-dodecyl-1-(2,2,6,6-tetramethyl-4-piperidyl)pyrrolidin-2,5-dione)

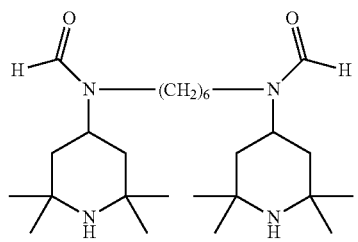

(N,N'-bis-formyl-N,N'-bis(2,2,6,6-tetramethyl-4-piperidyl)hexamethylenediamine)

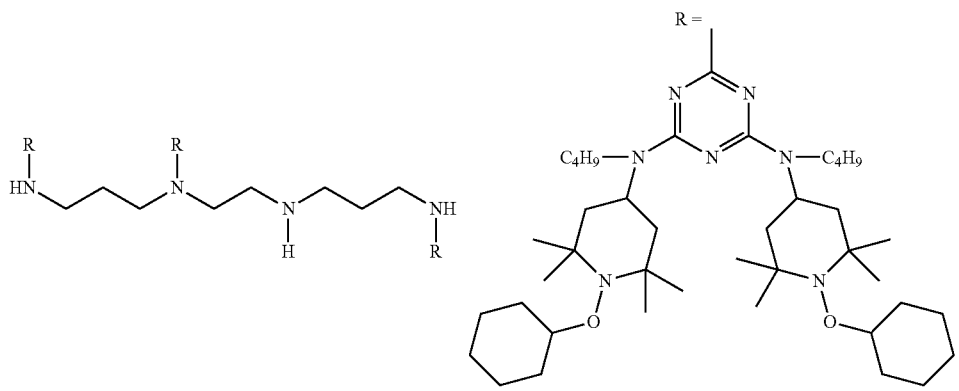

(the reaction product of 2,4-bis[(1-cyclohexyloxy-2,2,6,6-piperidin-4-yl)butylamino]-6-chloro-s-triazine with N,N'-bis(3-aminopropyl)ethylenediamine))

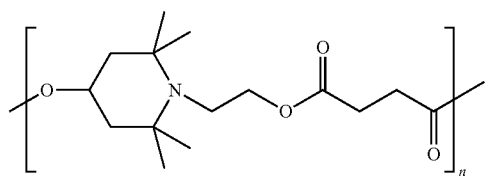

(the condensate of 1-(2-hyroxyethyl)-2,2,6,6-tetramethyl-4-hydroxypiperidine and succinic acid)

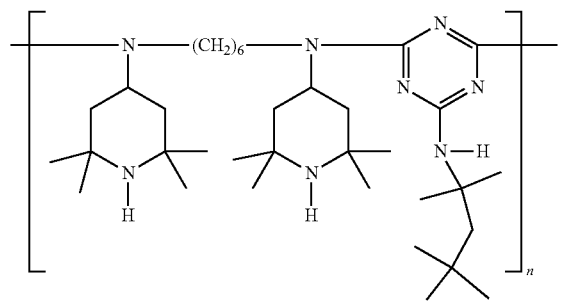

(the linear or cyclic condensates of N,N'-bis(2,2,6,6-tetramethyl-4-piperidyl)-hexamethylenediamine and 4-tert-octylamino-2,6-dichloro-1,3,5-triazine)

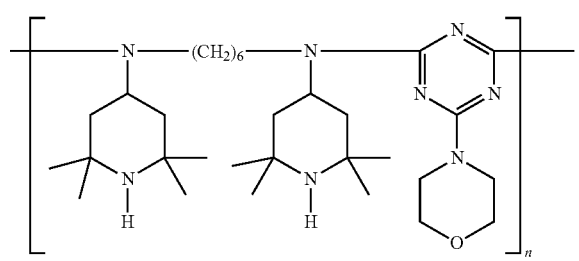

(the linear or cyclic condensates of N,N'-bis-(2,2,6,6-tetramethyl-4-piperidyl)hexamethylenediamine and 4-morpholino-2,6-dichloro-1,3,5-triazine)

-continued

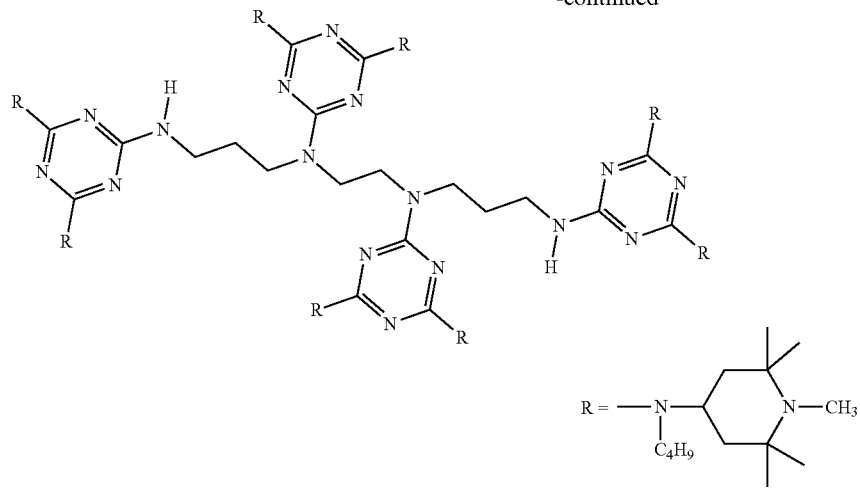

(the condensate of 2-chloro-4,6-di-(4-n-butylamino-1,2,2,6,6-pentamethylpiperidyl)-1,3,5-triazine and 1,2-bis-(bis-(3-aminopropylamino)ethane)

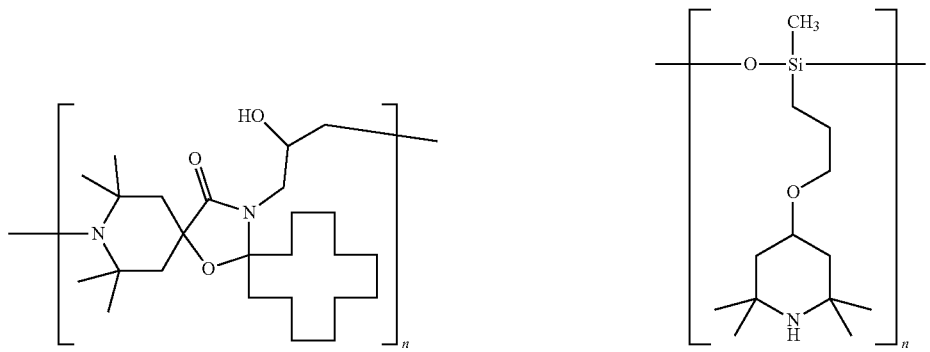

a reaction product of 7,7,9,9-tetramethyl-2-cycloundecyl-1-oxa-3,8-diaza-4-oxospiro [4,5]decane and epochlorohydrin)

(poly[methyl,(3-oxy-(2,2,6,6-tetramethylpiperidin-4-yl)propyl)] siloxane, CAS#182635-99-0)

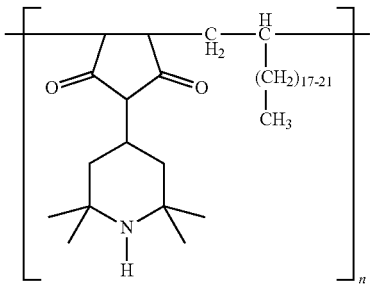

(reaction production of maleic acid anhydride-$C_{18}$-$C_{22}$-α-olefin-copolymer with 2,2,6,6-tetramethyl-4-aminopiperidine

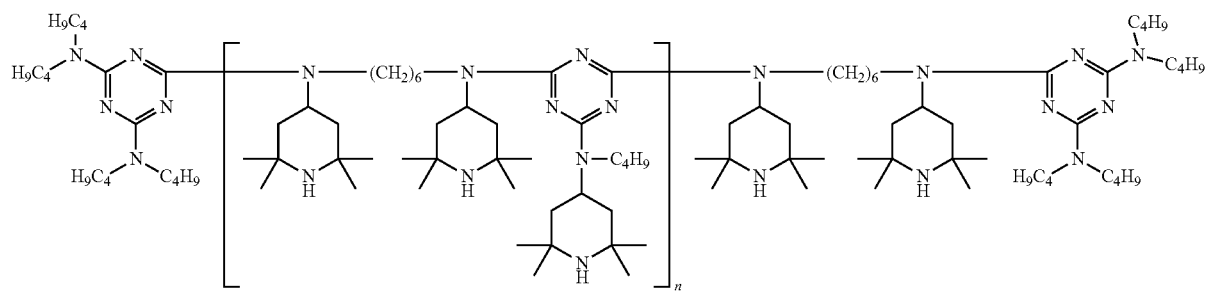

(the oligomeric compound which is the condensation product of 4,4'-hexamethylenebis(amino-2,2,6,6-tetramethylpiperidine) and 2,4-dichloro-6-[(2,2,6,6-tetramethylpiperidin-4-yl)butylamino]-s-triazine end-capped with 2-chloro-4,6-bis(dibutylamino)-s-triazine)

-continued

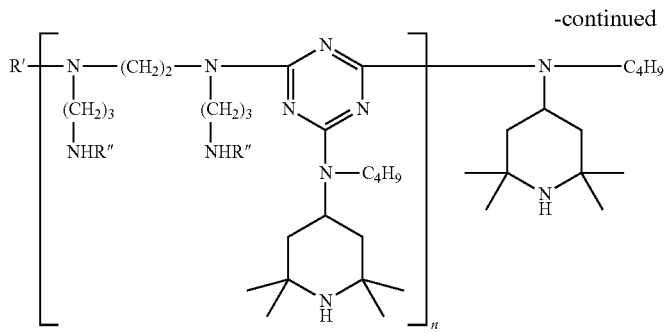

where R' = R" or H

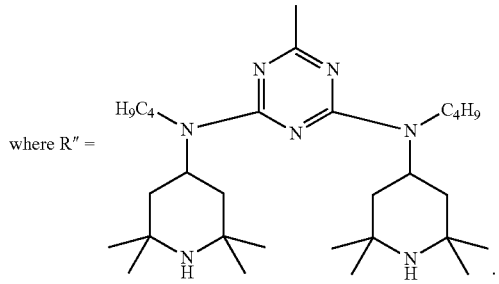

where R" =

(product obtained by reacting a product, obtained by reacting 1,2-bis(3-amino-propylamino)ethane with cyanuric chloride, with (2,2,6,6-tetramethylpiperidin-4-yl)butylamine)

In the oligomeric hindered amine compounds, n may be an integer such that the molecular weight may be greater than about 1200.

The hindered amine compounds may be contained in the photocurable hardcoat coating formulation in an amount from about 0.05 to about 20% by weight based on the weight of the photocurable hardcoat resin solids. This may include from about 0.1 wt % to about 10 wt %; from about 0.2 wt % to about 8 wt %; or from about 0.5 wt % to about 3 wt %.

Known commercial hydroxyphenyl-2H-benzotriazoles as disclosed in, United States Pat. Nos. 3,004,896; 3,055,896; 3,072,585; 3,074,910; 3,189,615; 3,218,332; 3,230,194; 4,127,586; 4,226,763; 4,275,004; 4,278,589; 4,315,848; 4,347,180; 4,383,863; 4,675,352; 4,681,905, 4,853,471; 5,268,450; 5,278,314; 5,280,124; 5,319,091; 5,410,071; 5,436,349; 5,516,914; 5,554,760; 5,563,242; 5,574,166; 5,607,987, 5,977,219 and 6,166,218 such as 2-(2-hydroxy-5-methylphenyl)-2H-benzotriazole; 2-(3,5-di-t-butyl-2-hydroxyphenyl)-2H-benzotriazole; 2-(2-hydroxy-5-t-butylphenyl)-2H-benzotriazole; 2-(2-hydroxy-5-t-octylphenyl)-2H-benzotriazole; 5-chloro-2-(3,5-di-t-butyl-2-hydroxyphenyl)-2H-benzotriazole, 5-chloro-2-(3-t-butyl-2-hydroxy-5-methylphenyl)-2H-benzotriazole; 2-(3-sec-butyl-5-t-butyl-2-hydroxyphenyl)-2H-benzotriazole; 2-(2-hydroxy-4-octyloxyphenyl)-2H-benzotriazole; 2-(3,5-di-t-amyl-2-hydroxyphenyl)-2H-benzotriazole; 2-(3,5-bis-α-cumyl-2-hydroxyphenyl)-2H-benzotriazole; 2-(3-t-butyl-2-hydroxy-5-(2-(w-hydroxy-octa-(ethyleneoxy)carbonyl-ethyl)-phenyl)-2H-benzotriazole; 2-(3-dodecyl-2-hydroxy-5-methylphenyl)-2H-benzotriazole; 2-(3-t-butyl-2-hydroxy-5-(2-octyloxycarbonyl)ethylphenyl)-2H-benzotriazole; dodecylated 2-(2-hydroxy-5-methylphenyl)-2H-benzotriazole; 2-(3-t-butyl-2-hydroxy-5-(2-octyloxycarbonylethyl)phenyl)-5-chloro-2H-benzotriazole; 2-(3-tert-butyl-5-(2-(2-ethylhexyloxy)-carbonylethyl)-2-hydroxyphenyl)-5-chloro-2H-benzotriazole; 2-(3-t-butyl-2-hydroxy-5-(2-methoxycarbonylethyl)phenyl)-5-chloro-2H-benzotriazole; 2-(3-t-butyl-2-hydroxy-5-(2-methoxycarbonylethyl)phenyl)-2H-benzotriazole, 2-(3-t-butyl-5-(2-(2-ethylhexyloxy) carbonylethyl)-2-hydroxyphenyl)-2H-benzotriazole, 2-(3-t-butyl-2-hydroxy-5-(2-isooctyloxycarbonylethyl)phenyl-2H-benzotriazole; 2,2'-methylene-bis(4-t-octyl-(6-2H-benzotriazol-2-yl)phenol); 2-(2-hydroxy-3-α-cumyl-5-t-octylphenyl)-2H-benzotriazole; 2-(2-hydroxy-3-t-octyl-5-α-cumylphenyl)-2H-benzotriazole; 5-fluoro-2-(2-hydroxy-3,5-di-α-cumylphenyl)-2H-benzotriazole; 5-chloro-2-(2-hydroxy-3,5-di-α-cumylphenyl)-2H-benzotriazole; 5-chloro-2-(2-hydroxy-3-α-cumyl-5-t-octylphenyl)-2H-benzotriazole; 2-(3-t-butyl-2-hydroxy-5-(2-isooctyloxycarbonylethyl)phenyl)-5-chloro-2H-benzotriazole; 5-trifluoromethyl-2-(2-hydroxy-3-α-cumyl-5-t-octylphenyl)-2H-benzotriazole; 5-trifluoromethyl-2-(2-hydroxy-5-t-octylphenyl)-2H-benzotriazole; 5-trifluoromethyl-2-(2-hydroxy-3,5-di-t-octylphenyl)-2H-benzotriazole; methyl-3-(5-trifluoromethyl-2H-benzotriazol-2-yl)-5-t-butyl-4-hydroxyhydrocinnamate; 5-butylsulfonyl-2-(2-hydroxy-3-α-cumyl-5-t-octylphenyl)-2H-benzotriazole; 5-trifluoromethyl-2-(2-hydroxy-3-α-cumyl-5-t-butylphenyl)-2H-benzotriazole; 5-trifluoromethyl-2-(2-hydroxy-3,5-di-t-butylphenyl)-2H-benzotriazole; 5-trifluoromethyl-2-(2-hydroxy-3,5-di-α-cumylphenyl)-2H-benzotriazole; 5-butylsulfonyl-2-(2-hydroxy-3,5-di-t-butylphenyl)-2H-benzotriazole; and 5-phenylsulfonyl-2-(2-hydroxy-3,5-di-t-butylphenyl)-2H-benzotriazole. Illustrative 2-hydroxybenzophenones include 4-hydroxy, 4-methoxy, 4-octyloxy, 4-decyloxy, 4-dodecyloxy, 4-benzyloxy, 4,2',4'-trihydroxy and 2'-hydroxy-4,4'-dimethoxy derivatives.

Esters of substituted and unsubstituted benzoic acids include 4-tert-butylphenyl salicylate, phenyl salicylate, octylphenyl salicylate, dibenzoyl resorcinol, bis(4-tert-butylben-zoyl) resorcinol, benzoyl resorcinol, 2,4-di-tert-butylphenyl 3,5-di-tert-butyl-4-hydroxybenzoate, hexadecyl 3,5-di-tert-butyl-4-hydroxybenzoate, octadecyl 3,5-di-tertbutyl-4-hydroxybenzoate, 2-methyl-4, 6-di-tert-butylphenyl 3,5-di-tert-butyl-4-hydroxybenzoate.

Acrylates and malonates include α-cyano-β,β-diphenylacrylic acid ethyl ester or isooctyl ester, α-carbomethoxycinnamic acid methyl ester, α-cyano-β-methyl-p-methoxycinnamic acid methyl ester or butyl ester, α-carbomethoxy-p-methoxy-cinnamic acid methyl ester, N-β-carbomethoxy-β-cyanovinyl)-2-methyl-indoline, dimethyl p-methoxybenzylidenemalonate (CAS# 7443-25-6), and di-(1,2,2,6,6-pentamethylpiperidin-4-yl) p-methoxybenzylidenemalonate (CAS #147783-69-5).

Oxamides include 4,4'-dioctyloxyoxanilide, 2,2'-diethoxyoxanilide, 2,2'-dioctyloxy-5,5'-di-tert-butoxanilide, 2,2'-didodecyloxy-5,5'-di-tert-butoxanilide, 2-ethoxy-2'-ethyloxanilide, N,N'-bis(3-dimethylaminopropyl)oxamide, 2-ethoxy-5-tert-butyl-2'-ethoxanilide and its mixture with 2-ethoxy-2'-ethyl-5,4'-di-tert-butoxanilide, mixtures of o- and p-methoxy-disubstituted oxanilides and mixtures of o- and p-ethoxy-disubstituted oxanilides.

Tris-aryl-o-hydroxyphenyl-s-triazines include hydroxyphenyl-s-triazines and triazines as disclosed in U.S. Pat. Nos. 3,843,371; 4,619,956; 4,740,542; 5,096,489; 5,106, 891; 5,298,067; 5,300,414; 5,354,794; 5,461,151; 5,476, 937; 5,489,503; 5,543,518; 5,556,973; 5,597,854; 5,681, 955; 5,726,309; 5,736,597; 5,942,626; 5,959,008; 5,998, 116; 6,013,704; 6,060,543; 6,242,598 and 6,255,483. Illustrative hydroxyphenyl-s-triazines and triazine include, but are not limited to, 4,6-bis-(2,4-dimethylphenyl)-2-(2-hydroxy-4-octyloxyphenyl)-s-triazine; 4,6-bis-(2,4-dimethylphenyl)-2-(2,4-dihydroxyphenyl)-s-triazine; 2,4-bis(2,4-dihydroxyphenyl)-6-(4-chlorophenyl)-s-triazine; 2,4-bis[2-hydroxy-4-(2-hydroxyethoxy)phenyl]-6-(4-chlorophenyl)-s-triazine; 2,4-bis[2-hydroxy-4-(2-hydroxy-4-(2-hydroxyethoxy)phenyl]-6-(2,4-dimethylphenyl)-s-triazine; 2,4-bis[2-hydroxy-4-(2-hydroxyethoxy)phenyl]-6-(4-bromophenyl)-s-triazine; 2,4-bis[2-hydroxy-4-(2-acetoxyethoxy)phenyl]-6-(4-chlorophenyl)-s-triazine; 2,4-bis(2,4-dihydroxyphenyl)-6-(2,4-dimethylphenyl)-s-triazine; 2,4-bis(4-biphenylyl)-6-(2-hydroxy-4-octyloxycarbonylethylideneoxyphenyl)-s-triazine; 2-phenyl-4-[2-hydroxy-4-(3-sec-butyloxy-2-hydroxypropyloxy)phenyl]-6-[2-hydroxy-4-(3-sec-amyloxy-2-hydroxypropyloxy)phenyl]-s-triazine; 2,4-bis(2,4-dimethylphenyl)-6-[2-hydroxy-4-(3-benzyloxy-*2-hydroxy-propyloxy) propyloxy)phenyl]-s-triazine; 2,4-bis(2-hydroxy-4-n-butyloxyphenyl)-6-(2,4-di-n-butyloxy-phenyl)-s-triazine; 2,4-bis(2,4-dimethylphenyl)-6-[2-hydroxy-4-(3-nonyloxy*-2-hydroxy-propyloxy)-5-α-cumylphenyl]-s-triazine (* denotes a mixture of octyloxy, nonyloxy and decyloxy groups), methylenebis-{2,4-bis(2,4-dimethylphenyl)-6-[2-hydroxy-4-(3-butyloxy-2-hydroxypropoxy)phenyl]-s-triazine}, methylene bridged dimer mixture bridged in the 3:5', 5:5' and 3:3' positions in a 5:4:1 ratio, 2,4,6-tris(2-hydroxy-4-isooctyloxycarbonylisopropylideneoxyphenyl)-s-triazine; 2,4-bis(2,4-dimethylphenyl)-6-(2-hydroxy-4-hexyloxy-5-α-cumylphenyl)-s-triazine; 2-(2,4,6-trimethylphenyl)-4,6-bis [2-hydroxy-4-(3-butyloxy-2-hydroxypropyloxy)phenyl]-s-triazine; 2,4,6-tris[2-hydroxy-4-(3-sec-butyloxy-2-hydroxypropyloxy)phenyl]-s-triazine; mixture of 4,6-bis-(2, 4-dimethylphenyl)-2-(2-hydroxy-4-(3-dodecyloxy-2-hydroxypropoxy)-phenyl)-s-triazine and 4,6-bis-(2,4-dimethylphenyl)-2-(2-hydroxy-4-(3-tridecyloxy-2-hydroxypropoxy)-phenyl)-s-triazine; 4,6-bis-(2,4-dimethylphenyl)-2-(2-hydroxy-4-(3-(2-ethylhexyloxy)-2-hydroxypropoxy)-phenyl)-s-triazine 4,6-diphenyl-2-(4-hexyloxy-2-hydroxyphenyl)-s-triazine.

Illustrative phenolic antioxidants may include the compounds selected from 1.1-1.17 below:

1.1. Alkylated monophenols include 2,6-di-tert-butyl-4-methylphenol, 2-tert-butyl-4,6-di-methylphenol, 2,6-di-tert-butyl-4-ethylphenol, 2,6-di-tert-butyl-4-n-butylphenol, 2,6-di-tert-butyl-4-isobutylphenol, 2,6-dicyclopentyl-4-methylphenol, 2-(a-methylcyclohexyl)-4,6-dimethylphenol, 2,6-dioctadecyl-4-methylphenol, 2,4,6-tricyclohexylphenol, 2,6-di-tert-butyl-4-methoxymethylphenol, nonylphenols which are linear or branched in the side chains, for example, 2,6-di-nonyl-4-methylphenol, 2,4-dimethyl-6-(1-methylundec-1-yl)phenol, 2,4-dimethyl-6-(1-methylheptadec-1-yl)phenol, 2,4-dimethyl-6-(1-methyltridec-1-yl)phenol, and mixtures thereof.

1.2. Alkylthiomethylphenols include 2,4-di octylthiomethyl-6-tert-butylphenol, 2,4-dioctylthiomethyl-6-methylphenol, 2,4-dioctylthiomethyl-6-ethylphenol, and 2,6-di-dodecylthiomethyl-4-nonylphenol.

1.3. Hydroquinones and alkylated hydroquinones include 2,6-di-tert-butyl-4-methoxyphenol, 2,5-di-tert-butylhydroquinone, 2,5-di-tert-amylhydroquinone, 2,6-diphenyl-4-octadecyloxyphenol, 2,6-di-tert-butylhydroquinone, 2,5-di-tert-butyl-4-hydroxyanisole, 3,5-di-tert-butyl-4-hydroxyanisole, 3,5-di-tert-butyl-4-hydroxyphenyl stearate, and bis-(3,5-di-tert-butyl-4-hydroxyphenyl) adipate.

1.4. Tocopherols include α-tocopherol, β-tocopherol, γ-tocopherol, and δ-tocopherol and mixtures thereof (Vitamin E).

1.5. Hydroxylated thiodiphenyl ethers include 2,2'-thiobis (6-tert-butyl-4-methylphenol), 2,2'-thiobis(4-octylphenol), 4,4'-thiobis(6-tert-butyl-3-methylphenol), 4,4'-thiobis(6-tert-butyl-2-methylphenol), 4,4'-thiobis-(3,6-di-sec-amylphenol), and 4,4'-bis(2,6-dimethyl-4-hydroxyphenyl)disulfide.

1.6. Alkylidenebisphenols include 2,2'-methylenebis(6-tert-butyl-4-methylphenol), 2,2'-methylenebis(6-tert-butyl-4-ethylphenol), 2,2'-methylenebis[4-methyl-6-(α-methylcyclohexyl)phenol], 2,2'-methylenebis(4-methyl-6-cyclohexylphenol), 2,2'-methylenebis(6-nonyl-4-methylphenol), 2,2'-methylenebis(4,6-di-tert-butylphenol), 2,2'-ethylidenebis(4,6-di-tert-butylphenol), 2,2'-ethylidenebis(6-tert-butyl-4-isobutylphenol), 2,2'-methylenebis[6-(α-methylbenzyl)-4-nonylphenol], 2,2'-methylenebis[6-(α,α-dimethylbenzyl)-4-nonylphenol], 4,4'-methylenebis(2,6-di-tert-butylphenol), 4,4'-methylenebis(6-tert-butyl-2-methylphenol), 1,1-bis(5-tert-butyl-4-hydroxy-2-methylphenyl)butane, 2,6-bis(3-tert-butyl-5-methyl-2-hydroxybenzyl)-4-methylphenol, 1,1,3-tris(5-tert-butyl-4-hydroxy-2-methylphenyl)butane, 1,1-bis(5-tert-butyl-4-hydroxy-2-methyl-phenyl)-3-n-dodecylmercaptobutane, ethylene glycol bis[3,3-bis(3-tert-butyl-4-hydroxyphenyl)butyrate], bis(3-tert-butyl-4-hydroxy-5-methyl-phenyl)dicyclopentadiene, bis[2-(3'tert-butyl-2-hydroxy-5-methylbenzyl)-6-tert-butyl-4-methylphenyl]terephthalate, 1,1-bis-(3,5-dimethyl-2-hydroxyphenyl)butane, 2,2-bis-(3,5-di-tert-butyl-4-hydroxyphenyl)propane, 2,2-bis-(5-tert-butyl-4-hydroxy2-methylphenyl)-4-n-dodecylmercaptobutane, 1,1,5,5-tetra-(5-tert-butyl-4-hydroxy-2-methylphenyl) pentane.

1.7. Benzyl compounds include 3,5,3',5'-tetra-tert-butyl-4, 4'-dihydroxydibenzyl ether, octadecyl-4-hydroxy-3,5-dimethylbenzylmercaptoacetate, tridecyl-4-hydroxy-3,5 -di-tert-butylbenzylmercaptoacetate, tris(3,5 -di-tert-butyl-4-hydroxybenzyl)amine, 1,3,5-tri-(3,5-di-tert-butyl-4-hydroxybenzyl)-2,4,6-trimethylbenzene, di-(3,5-di-tert-butyl-4-hydroxybenzyl) sulfide, 3,5-di-tert-butyl- 4-hydroxybenzyl-mercapto-acetic acid isooctyl ester, bis-(4-tert-butyl-3-hydroxy-2,6-dimethylbenzyl)dithiol terephthalate, 1,3,5-tris-(3,5-di-tert-butyl-4-hydroxybenzyl) isocyanurate, 1,3,5-tris-(4-tert-butyl-3-hydroxy-2,6-dimethylbenzyl) isocyanurate, 3,5-di-tert-butyl-4-hydroxybenzyl-phosphoric acid dioctadecyl ester, and 3,5-di-tert-butyl-4-hydroxybenzyl-phosphoric acid monoethyl ester, calcium-salt.

1.8. Hydroxybenzylated malonates include dioctadecyl-2,2-bis-(3,5-di-tert-butyl-2-hydroxybenzyl)-malonate, di-octadecyl-2-(3-tert-butyl-4-hydroxy-5-methylbenzyl)-malonate, di-dodecylmercaptoethyl-2,2-bis-(3,5-di-tert-butyl-4-hydroxybenzyl)malonate, and bis[4-(1,1,3,3-tetramethylbutyl)phenyl]-2,2-bis(3,5-di-tert-butyl-4-hydroxybenzyl)malonate.

1.9. Aromatic hydroxybenzyl compounds include 1,3,5-tris-(3,5-di-tert-butyl-4-hydroxy-benzyl)-2,4,6-trimethylbenzene, 1,4-bis(3,5-di-tert-butyl-4-hydroxybenzyl)-2,3,5,6-tetramethylbenzene, and 2,4,6-tris(3,5-di-tert-butyl-4-hydroxybenzyl)phenol.

1.10. Triazine compounds include 2,4-bis(octylmercapto)-6-(3,5-di-tert-butyl-4-hydroxy-anilino)-1,3,5-triazine, 2-octylmercapto-4,6-bis(3,5-di-tert-butyl-4-hydroxyanilino)-1,3,5-triazine, 2-octylmercapto-4,6-bis(3,5-di-tert-butyl-4-hydroxyphenoxy)-1,3,5-triazine, 2,4,6-tris(3,5-di-tert-butyl-4-hydroxyphenoxy)-1,2,3-triazine, 1,3,5-tris-(3,5-di-tert-butyl-4-hydroxybenzyl)isocyanurate, 1,3,5-tris(4-tert-butyl-3-hydroxy-2,6-dimethylbenzyl) isocyanurate, 2,4,6-tris-(3,5-di-tert-butyl-4-hydroxyphenylethyl)-1,3,5-triazine, 1,3,5-tris(3,5-di-tert-butyl-4-hydroxyphenylpropionyl)-hexahydro-1,3,5-triazine, and 1,3,5-tris(3,5-dicyclohexyl-4-hydroxybenzyl)isocyanurate.

1.11. Benzylphosphonates include dimethyl-2,5-di-tert-butyl-4-hydroxybenzylphosphonate, diethyl-3,5-di-tert-butyl-4-hydroxybenzylphosphonate, dioctadecyl3,5-di-tert-butyl-4-hydroxybenzylphosphonate, dioctadecyl-5-tert-butyl-4-hydroxy-3-methylbenzylphosphonate, and the calcium salt of the monoethyl ester of 3,5-di-tert-butyl-4-hydroxybenzylphosphonic acid.

1.12. Acylaminophenols include 4-hydroxy-lauric acid anilide, 4-hydroxy-stearic acid anilide, 2,4-bis-octylmercapto-6-(3,5-tert-butyl-4-hydroxyanilino)-s-triazine, and octyl-N-(3,5 -di-tert-butyl-4-hydroxyphenyl)-carbamate.

1.13. Esters of β-(3,5-di-tert-butyl-4-hydroxyphenyl)propionic acid with mono- or polyhydric alcohols, e.g. with methanol, ethanol, n-octanol, i-octanol, octadecanol, 1,6-hexanediol, 1,9-nonanediol, ethylene glycol, 1,2-propanediol, neopentyl glycol, thiodiethylene glycol, diethylene glycol, triethylene glycol, pentaerythritol, tris(hydroxyethyl) isocyanurate, N,N'-bis(hydroxyethyl)oxamide, 3-thiaundecanol, 3-thiapentadecanol, trimethylhexanediol, trimethylolpropane, and 4-hydroxymethyl-1-phospha-2,6,7-trioxabicyclo[2.2.2]octane.

1.14. Esters of β-(5-tert-butyl-4-hydroxy-3-methylphenyl) propionic acid with mono- or polyhydric alcohols, e.g. with methanol, ethanol, n-octanol, i-octanol, octadecanol, 1,6-hexanediol, 1,9-nonanediol, ethylene glycol, 1,2-propanediol, neopentyl glycol, thiodiethylene glycol, diethylene glycol, triethylene glycol, pentaerythritol, tris(hydroxyethyl) isocyanurate, N,N'-bis(hydroxyethyl) oxamide, 3-thiaundecanol, 3-thiapentadecanol, trimethylhexanediol, trimethylolpropane, and 4-hydroxymethyl-1-phospha-2,6,7-trioxabicyclo[2.2.2]octane.

1.15. Esters of β-(3,5-dicyclohexyl-4-hydroxyphenyl)propionic acid with mono- or polyhydric alcohols, e.g. with methanol, ethanol, octanol, octadecanol, 1,6-hexanediol, 1,9-nonanediol, ethylene glycol, 1,2-propanediol, neopentyl glycol, thiodiethylene glycol, diethylene glycol, triethylene glycol, pentaerythritol, tris(hydroxyethyl)isocyanurate, N,N'-bis(hydroxyethyl)oxamide, 3-thiaundecanol, 3-thiapentadecanol, trimethylhexanediol, trimethylolpropane, and 4-hydroxymethyl-1-phospha-2,6,7-trioxabicyclo[2.2.2]octane.

1.16. Esters of 3,5-di-tert-butyl-4-hydroxyphenyl acetic acid with mono- or polyhydric alcohols, e.g. with methanol, ethanol, octanol, octadecanol, 1,6-hexanediol, 1,9-nonanediol, ethylene glycol, 1,2-propanediol, neopentyl glycol, thiodiethylene glycol, diethylene glycol, triethylene glycol, pentaerythritol, tris(hydroxyethyl)isocyanurate, N,N'-bis(hydroxyethyl)oxamide, 3 -thiaundecanol, 3-thiapentadecanol, trimethylhexanediol, trimethylolpropane, and 4-hydroxymethyl-1-phospha-2,6,7-trioxabicyclo[2.2.2]octane.

1.17. Amides of β-(3,5-di-tert-butyl-4-hydroxyphenyl)propionic acid e.g. N,N'-bis(3,5-di-tert-butyl-4-hydroxyphenylpropionyl)hexamethylenediamide, N,N'-bis(3,5-di-tert-butyl-4-hydroxyphenylpropionyl) trimethylenediamide, N,N'-bis(3,5-di-tert-butyl-4-hydroxyphenylpropionyl)hydrazide, and N,N'-bis[2-(3-[3,5-di-tert-butyl-4-hydroxyphenyl]propionyloxy)ethyl] oxamide (Naugard®XL-1 supplied by Uniroyal).

The UV absorbers and hindered phenolic antioxidants may be present in the compositions from about 0.01 wt % to about 5 wt %, from about 0.025 wt % to about 2 wt %, or from about 0.1 wt % to about 1 wt %, based on the weight of the photocurable hardcoat resin solids. The UV absorbers may be employed in very low levels, as outlined for the present red-shifted UVAs.

Additionally, there may be employed in the processes and compositions additives such as fillers, flow aids, adhesion promoters, rheological modifiers such as fumed silica, pigments, dyes, antislip agents, optical brighteners, wetting agents, and surfactants.

A thickness of the photocured hardcoat films (dry film thickness) resulting from the photocurable hardcoat compositions are for example from about 0.2 mil to about 10 mil. This includes from about 0.2 mil to about 8 mil, from about 0.2 mil to about 6 mil, from about 0.2 mil to about 4 mil, and from about 0.2 mil to about 2 mil. For example, the dry film thickness may be in some embodiments from about 0.2 mil to about 10 mil, from about 0.2 mil to about 8 mil, from about 0.22 mil to about 6 mil, from about 0.2 mil to about 4 mil, or from about 0.2 mil to about 2 mil. In yet further embodiments, the dry coating film thicknesses are from about 0.5 mil to about 3.5 mil, or from about 1 mil to about 2.5 mil.

The photocured films prepared may be used as window films, in graphic overcoating, as solar control films, as backlit display films, as overlaminate films (exterior or interior digital graphics and the like), in signage, in laminated glazing, ink jet media coatings, in electrochromic/photochromic applications, optical light films, in safety glass/windshield interlayers, in-mold films, decals, antigrafitti films, specialty packaging, compact disc coatings, protective coatings for forward lighting, protective coatings for polymer substrates (e.g. for plastic parts such as machine and automobile parts), and other high-performance thin coating applications.

The photocured films are especially effective at protecting the underlying substrate from the deleterious effects of UV radiation. For example, they are effective in protecting dyes or pigments present in the underlying substrates against color fade.

The substrate surface may be coated by applying to the substrate a liquid composition, a solution or suspension. The choice of solvent and the concentration will depend mainly on the type of formulation and on the coating method employed. The solvent should be inert; in other words, it should not undergo any chemical reaction with the components and should be capable of being removed again after the coating operation, e.g. during the drying process. Examples of suitable solvents are ketones, ethers and esters, such as methyl ethyl ketone, isobutyl methyl ketone, cyclopentanone, cyclohexanone, N-methylpyrrolidone, dioxane, tetrahydrofuran, 2-methoxyethanol, 2-ethoxyethanol, 1-methoxy-2-propanol, 1,2-dimethoxyethane, ethyl acetate, n-butyl acetate, and ethyl 3-ethoxypropionate. The suspension is uniformly applied to a substrate by known coating techniques such as by spin coating, dip coating, curtain coating, knife coating, brushing or spraying or reverse roll coating. It is also possible to apply the photosensitive layer to a temporary, flexible support and then to coat the final substrate, for example a copper-laminated circuit board, by means of layer transfer via lamination.

The photosensitivity of the compositions according to the invention generally ranges from the UV region (about 200 nm) up to about 600 nm. Suitable radiation comprises, for example, sunlight or light from artificial sources. Therefore, a large number of very different types of light source may be used. Both point sources and flat radiators (lamp carpets) are appropriate. Examples are carbon arc lamps, xenon arc lamps, medium-pressure, high-pressure and low-pressure mercury lamps, doped with metal halides if desired (metal halogen lamps), microwave-stimulated metal vapor lamps, excimer lamps, superactinic fluorescent tubes, fluorescent lamps, incandescent argon lamps, electronic flashlights, photographic flood lamps, electron beams and X-rays. For example, Hg lamps, iron doped Hg lamps or Ga doped Hg lamps are suitable. Artificial light sources equivalent to daylight may be used, such as low intensity lamps such as specific fluorescent lamps, e.g. Philips TL05 or TL09 special fluorescent lamps. The distance between the lamp and the substrate according to the invention which is to be coated can vary depending on the application and on the type and/or power of the lamp, for example between 2 cm and 150 cm. Also suitable, for example, are lasers in the visible range. The cure may be effected behind a transparent layer (e.g. a pane of glass or plastic sheet).

The photocurable hard coat compositions of the instant invention can photocured using light emitting diode (LED) arrays. The LED arrays may be a combination of 365 nm and 395 nm wavelength LED lamps.

Complicated and expensive apparatus is superfluous when using light sources that emit light of low intensity, and the compositions in this case may be used in particular for special exterior applications. The cure with daylight or with light sources equivalent to daylight is an alternative to the standard moving belt method of UV curing. In contrast to the moving belt method, which is particularly suitable for flat parts, the daylight cure may be used for exterior coatings on stationary and fixed objects or constructions. These are typically coatings on buildings, facades, bridges, ships or markings on roads and sites as disclosed, inter alia, in EP-A-160723.

The cure with daylight or with light sources equivalent to daylight is an energy-saving method and, in exterior applications, no emission of volatile organic components into the environment occurs. The cure with daylight or light sources equivalent to daylight is, however, also suitable for series curing in which the objects are so positioned that angular areas are also exposed to daylight. In this connection, mirrors or reflectors can also be used.

The (e.g. protective film) article having the photocured hardcoat coating layer described herein may have a gloss or matte surface. Matte films typically have lower transmission and higher haze values than typical gloss films. For example, the haze is generally at least 5%, 6%, 7%, 8%, 9%, or 10% as measured according to ASTM D1003. Whereas gloss surfaces typically have a gloss of at least 130 as measured according to ASTM D 2457-03 at 60degree; matte surfaces have a gloss of less than 120. One exemplary matte film is commercially available from U.S.A. Kimoto Tech of Cedartown, Ga., under the trade designation "N4D2A."

The surface may be roughened or textured to provide a matte surface. This may be accomplished in a variety of ways as known in the art including embossing the surface with a suitable tool that has been bead-blasted or otherwise roughened, as well as by curing the composition against a suitable roughened master as described in U.S. Pat. Nos. 5,175,030 (Lu et al.) and 5,183,597 (Lu).

A particulate matting agent may be incorporated into the photocurable hardcoat composition in order to impart antiglare properties to the surface layer. The amount of particulate matting agent added is between about 0.5 and 10% of the total solids of the composition, depending upon the thickness of the layer. In some embodiments, this amount is about 2 wt %. The average particle diameter of the particulate matting agent has a predefined minimum and maximum that is partially dependent upon the thickness of the layer. However, generally speaking, average particle diameters below 1.0 microns do not provide the degree of anti-glare sufficient to warrant inclusion, while average particle diameters exceeding 10.0 microns deteriorate the sharpness of the transmission image. The average particle size is from about 1.0 to about 10.0 microns. This includes an average size from 1.7 to about 3.5 microns, in terms of the number-averaged value measured by the Coulter method.

As the particulate matting agent, inorganic particles or resin particles are used including, for example, amorphous silica particles, $TiO_2$ particles, $Al_2O_3$ particles, cross-linked polymer particles such as those made of cross-linked poly (methyl methacrylate), cross-linked polystyrene particles, melamine resin particles, benzoguanamine resin particles, and cross-linked polysiloxane particles. By taking into account the dispersion stability and sedimentation stability of the particles in the photocurable coating mixture for the anti-glare layer and/or the hard coat layer during the manufacturing process, resin particles may be used such as cross-linked polystyrene particles, since such resin particles have a high affinity for the binder material and a small specific gravity.

As for the shape of the particulate matting agent, spherical and amorphous particles may be used. However, to obtain a consistent anti-glare property, spherical particles are desirable. Two or more kinds of particulate materials may also be used in combination.

One commercially available silica particulate matting agent having an average particle size of 3.5 microns is commercially available from W.R. Grace and Co., Columbia, Md. under the trade designation "Syloid C803".

The attraction of the photocured hardcoat surface to lint may be further reduced by including an antistatic agent. For example, an antistatic coating may be applied to the (e.g. optionally primed) substrate prior to coating the photocured hardcoat. The thickness of the antistatic layer is typically at least 20 nm and generally no greater than 400 nm, 300 nm, or to 200 nm.

The antistatic coating may comprise at least one conductive polymer as an antistatic agent. Various conductive polymers are known. Examples of useful conductive polymers include polyaniline and derivatives thereof, polypyrrole, and polythiophene and its derivatives. One particularly suitable polymer is poly(ethylenedioxythiophene) (PEDOT) such as poly(ethylenedioxythiophene) doped with poly(styrenesulfonic acid) (PEDOT:PSS) commercially available from H.C. Starck, Newton, Mass. under the trade designation "BAYTRON P". This conductive polymer may be added at low concentrations to sulfopolyester dispersions to provide antistatic compositions that provided good antistatic performance in combination with good adhesion particularly to polyester and cellulose acetate substrates.

In other embodiments, the photocurable hardcoat composition may comprise conductive metal-containing particles, such as metals or semiconductive metal oxides. Such particles may also be described as nanoparticles having a particle size or associated particle size of greater than 1 nm and less than 200 nm. Various granular, nominally spherical, fine particles of crystalline semiconductive metal oxides are known. Such conductive particles are generally binary metal oxides doped with appropriate donor heteroatoms or containing oxygen deficiencies. In some embodiments, doped conductive metal oxide granular particles include Sb-doped tin oxide, Al-doped zinc oxide, In-doped zinc oxide, and Sb-doped zinc oxide.

Various antistatic particles are commercially available as water-based and solvent-based dispersions. Antimony tin oxide (ATO) nanoparticle dispersions that may be used include a dispersion available from Air Products under the trade designation "Nano ATO S44A" (25 wt % solids, water), 30 nm and 100 nm (20 wt % solids, water) dispersions available from Advanced Nano Products Co. Ltd. (ANP), 30 nm and 100 nm ATO IPA sols (30 wt %) also available from ANP, a dispersion available from Keeling & Walker Ltd under the trade designation "CPM10C" (19.1 wt % solids), and a dispersion commercially available from Ishihara Sangyo Kaisha, Ltd under the trade designation "SN-100 D" (20 wt % solids). Further, an antimony zinc oxide (AZO) IPA sol (20 nm, 20.8 wt % solids) is available from Nissan Chemical America, Houston Tex. under the trade designations "CELNAX CX-Z2101P", "CELNAX CX-Z300H" (in water), "CELNAX CX-Z401M" (in methanol), and "CELNAX CX-Z653M-F" (in methanol).

For nanoparticle antistats, the antistatic agent is present in an amount of at least 20 wt %. For conducting inorganic oxide nanoparticles, levels may be up to 80 wt % solids for refractive index modification. When a conductive polymer antistat is employed, it is generally preferred to employ as little as possible due to the strong absorption of the conductive polymer in the visible region. Accordingly, the concentration is generally no greater than 20 wt % solid. In various embodiments, this amount is less than 15 wt %. In some embodiments, the amount of conductive polymer ranges from 2 wt % to 5 wt % solids of the dried antistatic layer.

In some embodiments, the photocured hardcoat protective film also provides antireflective properties. For example, when the photocured hardcoat coating comprises a sufficient amount of high refractive index nanoparticles, the photocured hardcoat coating may be suitable as the high refractive index layer of an antireflective film. A low index surface layer is then applied to the high refractive index layer. Alternatively, a high and low index layer may be applied to the photocured hardcoat such as described in U.S. Pat. No. 7,267,850.

A variety of substrates may be utilized in the articles of the invention. Suitable substrate materials include glass as well as thermosetting or thermoplastic polymers such as polycarbonate, poly(meth)acrylate (e.g., polymethyl methacrylate or "PMMA"), polyolefins (e.g., polypropylene or "PP"), polyurethane, polyesters (e.g., polyethylene terephthalate or "PET"), polyamides, polyimides, phenolic resins, cellulose diacetate, cellulose triacetate, polystyrene, styrene-acrylonitrile co-polymers, epoxies, and the like. Typically the substrate will be chosen based in part on the desired optical and mechanical properties for the intended use. Such mechanical properties typically will include flexibility, dimensional stability and impact resistance. The substrate thickness typically also will depend on the intended use. For most applications, a substrate thickness of less than about 0.5 mm is preferred, and is more preferably about 0.02 to about 0.2 mm. Self-supporting polymeric films may be used, according to some embodiments. Films made from polyesters such as PET or polyolefins such as PP (polypropylene), PE (polyethylene) and PVC (polyvinyl chloride) may be used. The polymeric material may be formed into a film using conventional filmmaking techniques such as by extrusion and optional uniaxial or biaxial orientation of the extruded film. The substrate may be treated to improve adhesion between the substrate and the photocured hardcoat layer, e.g., chemical treatment, corona treatment such as air or nitrogen corona, plasma, flame, or actinic radiation. If desired, an optional tie layer or primer may be applied to the substrate and/or photocured hardcoat layer to increase the interlayer adhesion.

Various light transmissive optical films are known including but not limited to, multilayer optical films, microstructured films such as retroreflective sheeting and brightness enhancing films, (e.g. reflective or absorbing) polarizing films, diffusive films, as well as (e.g. biaxial) retarder films and compensator films.

Multilayer optical films provide desirable transmission and/or reflection properties at least partially by an arrangement of microlayers of differing refractive index. The microlayers have different refractive index characteristics so that some light is reflected at interfaces between adjacent microlayers. The microlayers are sufficiently thin so that light reflected at a plurality of the interfaces undergoes constructive or destructive interference in order to give the film body the desired reflective or transmissive properties. For optical films designed to reflect light at ultraviolet, visible, or near-infrared wavelengths, each microlayer generally has an optical thickness (i.e., a physical thickness multiplied by refractive index) of less than about 1 micrometer. Such films that reflect all visible light have a silver appearance and are often referred to as (e.g. colored) mirror films. However, thicker layers can also be included, such as skin layers at the outer surfaces of the film, or protective boundary layers disposed within the film that separate packets of microlayers. Multilayer optical film bodies can also comprise one or more thick adhesive layers to bond two or more sheets of multilayer optical film in a laminate.

Further details of suitable multilayer optical films and related constructions may be found in U.S. Pat. No. 5,882,774 (Jonza et al.), and PCT Publications WO 95/17303 (Ouderkirk et al.) and WO 99/39224 (Ouderkirk et al.). Polymeric multilayer optical films and film bodies can comprise additional layers and coatings selected for their optical, mechanical, and/or chemical properties such as described in U.S. Pat. No. 6,368,699 (Gilbert et al.). The polymeric films and film bodies can also comprise inorganic layers, such as metal or metal oxide coatings or layers.

Commercially available multilayer optical films include 3M™Vikuiti™ Dual Brightness Enhancement Film and 3M™Vikuiti™ Enhanced Specular Reflector Film.

In some embodiments, the photcurable hardcoat composition is applied to a substrate having at least one metallic or organometallic layer. Such substrate may be employed for the purpose of providing a decorative metallic finish and/or for the purpose of providing an electromagnetic interference (EMI) shield for an electronic device.

The metal layer may be made from a variety of materials. Illustrative metals include elemental silver, gold, copper, nickel and chrome. Alloys such as stainless steel or dispersions containing these metals in admixture with one another or with other metals also may be employed. When additional metal layers are employed, they may be the same as or different from one another, and need not have the same thickness. In some embodiments, the metal layer or layers are sufficiently thick so as to remain continuous if elongated by more than 3% in an in-plane direction, and sufficiently thin so as to ensure that the film and articles employing the film will have the desired degree of EMI shielding and light transmission. In some embodiments, the physical thickness (as opposed to the optical thickness) of the metal layer or layers is about 3 to about 50 nm, or from about 4 to about 15 nm. Typically, the metal layer or layers are formed by deposition on the above-mentioned support using techniques employed in the film metallizing art such as sputtering (e.g., cathode or planar magnetron sputtering), evaporation (e.g., resistive or electron beam evaporation), chemical vapor deposition, plating and the like.

The smoothness and continuity of the first metal layer and its adhesion to the support may be are enhanced by appropriate pretreatment of the support. A pretreatment regimen may include electrical discharge pretreatment of the support in the presence of a reactive or non-reactive atmosphere (e.g., plasma, glow discharge, corona discharge, dielectric barrier discharge or atmospheric pressure discharge); chemical pretreatment; flame pretreatment; application of a nucleating layer such as the oxides and alloys; or application of an organic base coat layer.

Films suitable for use as an EMI shield are described for example in U.S. Pat. No. 7,351,479; incorporated herein by reference. In one embodiment, the EMI shield film comprises a Fabry-Perot interference stack atop a light-transmissive polymeric film, such as previously described. The stack includes a first visible light-transparent metal layer spaced from a second visible light-transparent metal layer (e.g. made of silver) by means of an organic visible light-transparent spacing layer (e.g. made of a crosslinked acrylate polymer). The thicknesses of the metal layers and spacing layer are chosen such that the metal layers are partially reflective and partially transmissive. The spacing layer has an optical thickness (defined as the physical thickness of layer times its in-plane index of refraction) to achieve the center of the desired pass band for transmitted light. Wavelengths of light within the pass band are mainly transmitted through the thin metal layers; whereas wavelengths above the pass band are mainly reflected by the thin metal layers or canceled due to destructive interference. The photocured hardcoat or protective film prepared is suitable for use with various articles such as optical displays and display panels.

The photocured hardcoat coating or protective film is adhered to an article or device. The article or device may additionally contain an optical display or display panel.

The term "optical display", or "display panel", can refer to any conventional optical displays, including but not limited to multi-character multi-line displays such as liquid crystal displays ("LCDs"), plasma displays, front and rear projection displays, cathode ray tubes ("CRTs"), and signage, as well as single-character or binary displays such as light emitting diodes ("LEDs"), signal lamps, and switches. The exposed surface of such display panels may be referred to as a "lens." The invention is particularly useful for displays having a viewing surface that is susceptible to being touched or contacted by ink pens, markers and other marking devices, wiping cloths, paper items and the like.

The photocured hardcoat coatings or films of the invention may be employed in a variety of portable and non-portable information display devices. These devices include PDAs, cell phones (including combination PDA/cell phones), LCD televisions (direct lit and edge lit), touch sensitive screens, wrist watches, car navigation systems, computer tablets, global positioning systems, depth finders, calculators, electronic books, CD and DVD players, projection television screens, computer monitors, notebook computer displays, instrument gauges, instrument panel covers, signage such as graphic displays and the like. The viewing surfaces can have any conventional size and shape and may be planar or non-planar. The photocured hardcoat coatings, may be employed on a variety of other articles as well such as for example camera lenses, eyeglass lenses, binocular lenses, mirrors, retroreflective sheeting, automobile windows, building windows, train windows, boat windows, aircraft windows, vehicle headlamps and taillights, display cases, road pavement markers (e.g. raised) and pavement marking tapes, overhead projectors, stereo cabinet doors, stereo covers, watch covers, as well as optical and magneto-optical recording disks, and the like.

Various permanent and removable grade adhesive compositions may be coated on the opposite side (i.e. to the photocured hardcoat) of the (e.g. protective film substrate) so the article may be easily mounted to a (e.g. display) surface. Suitable adhesive compositions include (e.g. hydrogenated) block co-polymers such as those commercially available from Kraton Polymers of Westhollow, Tex. under the trade designation "Kraton G-1657", as well as other (e.g. similar) thermoplastic rubbers. Other exemplary adhesives include acrylic-based, urethane-based, silicone-based, and epoxy-based adhesives. Illustrative adhesives are of sufficient optical quality and light stability such that the adhesive does not yellow with time or upon weather exposure so as to degrade the viewing quality of the optical display. The adhesive may be applied using a variety of known coating techniques such as transfer coating, knife coating, spin coating, die coating and the like. Illustrative adhesives are described in U.S. Patent Application Publication No. 2003/0012936. Several of such adhesives are commercially available from 3M Company, St. Paul, Minn. under the trade designations 8141, 8142, and 8161.

FIG. 1 depicts a hardcoat film article of the invention. Hardcoat film article 500 includes a photocured hardcoat layer 511 in adherence thereto a substrate 512. The substrate 512 is a thermosetting or thermoplastic polymers such as polycarbonate, poly(meth)acrylate (e.g., polymethyl methacrylate or "PMMA"), polyolefins (e.g., polypropylene or "PP"), polyvinylchloride (PVC), polyurethane, polyesters (e.g., polyethylene terephthalate or "PET"), polyamides, polyimides, phenolic resins, cellulose diacetate, cellulose triacetate, polystyrene, or styrene-acrylonitrile co-polymers; carbon fiber reinforced plastics, glass fiber reinforced plastics, wood, glass, steel, aluminum, and corona treated or flame treated plastics. A photocurable hardcoat composition may be coated onto substarte 512 using coating methods known in the art. The thickness of photocured hardcoat layer 511 may be any useful thickness. In some embodiments, the photocured hardcoat layer 511 has a thickness in a range from about 1 to about 50 micrometers, from about 1 to about 25 micrometers, from about 1 to about 15 micrometers, or from about 1 to about 5 micrometers.

Figure 2:
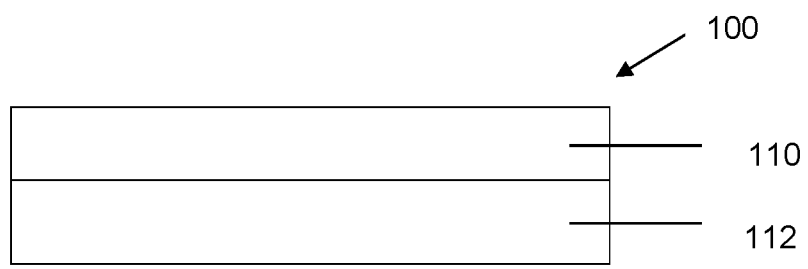
FIG. 2 is a schematic diagram of a photocured hardcoat film article, according to various embodiments.

FIG. 2 depicts a hardcoat film article of the invention. Hardcoat film article 100 includes a photocured hardcoat layer 110 disposed on release liner 112. A photocurable hardcoat composition may be coated onto release liner 112 using coating methods known in the art. The thickness of the photocured hardcoat coating layer 110 may be any useful thickness. In some embodiments, the photocured hardcoat layer 110 has a thickness in a range from about 1 to about 50 micrometers, from about 1 to about 25 micrometers, from about 1 to about 15 micrometers, or from about 1 to about 5 micrometers.

Figure 3:
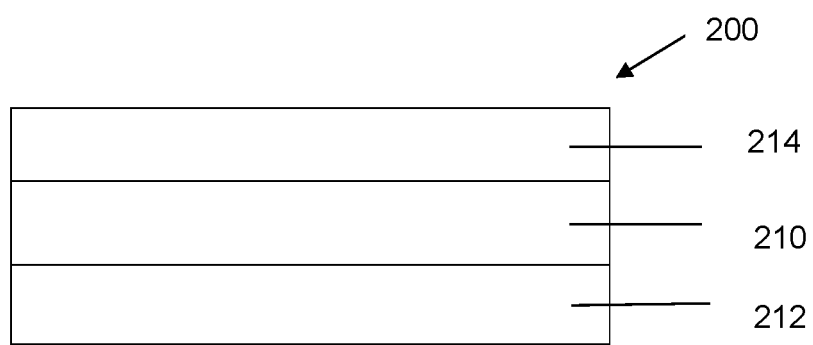
FIG. 3 is a schematic diagram of a photocured hardcoat film article including a light transmissive film layer, according to various embodiments.

The photocured hardcoat film articles of the invention can further comprise a (e.g. thermoplastic) light transmissive film layer. As illustrated in FIG. 3, hardcoat film article 200 comprises (e.g. thermoplastic) light transmissive film layer 214 disposed on photocured hardcoat layer 210. A photocurable hardcoat composition may be coated onto release liner 212 using coating methods known in the art. The thickness of (e.g. thermoplastic) light transmissive film layer 214 may be any useful thickness. In some embodiments, thermoplastic layer 214 has a thickness of about 0.5 to about 20 micrometers, from about 0.5 to about 5 micrometers, from about 0.5 to about 3 micrometers, or from 1 to about 3 micrometers. In some embodiments, the photocured hardcoat layer 210 has a thickness in a range from about 1 to about 50 micrometers, from about 1 to about 25 micrometers, from about 1 to about 15 micrometers, or from about 1 to about 5 micrometers.

In some embodiments, photocured hardcoat layer 210 and (e.g. thermoplastic) light transmissive film layer 214 have a combined film thickness of about 1.5 to about 25 micrometers, from about 1.5 to about 15 micrometers, or from about 1.5 to about 10 micrometers.

Surface treatments can sometimes be useful to secure adhesion between (e.g. thermoplastic) light transmissive film layer 214 and the photocured hardcoat layer 210. Surface treatments include, for example, chemical priming, corona treatment, plasma or flame treatment. A chemical primer layer or a corona treatment layer may be disposed between layer 214 and photocured hardcoat layer 210.

Suitable chemical primer layers may be selected from urethanes, silicones, epoxy resins, vinyl acetate resins, ethyleneimines, and the like. Examples of chemical primers for vinyl and polyethylene terephthalate films include crosslinked acrylic ester/acrylic acid co-polymers disclosed in U.S. Pat. No. 3,578,622. The thickness of the chemical primer layer is suitably within the range of about 10 to about 3,000 nanometers.

The photocured hardcoat film articles of the invention may be used to protect a substrate. In some embodiments, an adhesive (for example, a pressure sensitive adhesive) may be used to adhere the photocured hardcoat film article to the substrate that is to be protected. The adhesive may be disposed on the substrate.

Figure 4:
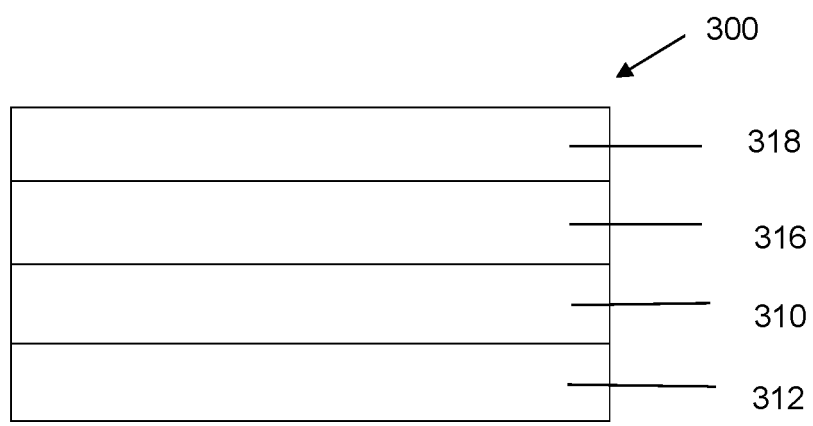
FIG. 4 is a schematic diagram of a photocured hardcoat film article including an adhesive layer and an optional second release liner, according to various embodiments.

Alternatively, the adhesive may be disposed on at least a portion of the photocured hardcoat layer, as illustrated in FIG. 4. Hardcoat film article 300 includes photocured hardcoat layer 310 disposed on protective release liner 312 and adhesive layer 316 (and an optional second release liner 318) disposed on photocured hardcoat layer 310. Optional second release liner 318 may be removed to reveal adhesive layer 316 so that adhesive layer 316 may be used to adhere hardcoat film article 300 to a substrate. Once hardcoat film article 300 is adhered to a substrate, protective release liner 312 may be removed. In some embodiments, the photocured hardcoat layer 310 has a thickness in a range from about 1 to about 50 micrometers, from about 1 to about 25 micrometers, from about 1 to about 15 micrometers, or from about 1 to about 5 micrometers.

The protective film articles described herein are suitable for methods of making an article that comprise lining a mold cavity with the protective film; injecting a solidifiable resin composition into the mold cavity; solidifying the resin composition; and removing the solidified resin article comprising the protective film from the mold.

In one embodiment, the (e.g. thermoplastic) light transmissive film layer (e.g. of FIG. 3) is placed within a metal or ceramic mold cavity such that the cured hard coat surface is in contact with the mold. The photocurable hardcoat described herein is particularly advantageous for embodiments wherein the mold has a curved surface (e.g. having a radius of curvature of at least about 1 mm). A solidifiable resin such as a molten thermoplastic resin or curable polymerizable (e.g. urethane) resin is then injected into the cavity of the mold so that an integrated body of the protective film and molded article is obtained.

In one embodiment, a method for forming a photocured hardcoat protective film coating which method comprises curing a photocurable hardcoat coating composition by irradiating the composition with ultraviolet radiation or daylight or with light sources equivalent to daylight, wherein the photocurable hardcoat coating composition includes: a) at least one ethylenically unsaturated polymerizable compound; b) at least one red-shifted UV absorber of Formula (I) or (II), or a combination of any two of Formulas (I), (II), and (III) (above); c) a combination of photoinitiators comprising: i) at least one a-hydroxy ketone photoinitiator; and ii) at least one bisacylphosphine oxide photoinitiator; and, optionally, d) a hindered amine light stabilizer. In some embodiments, the composition includes e) a compound selected from ultraviolet light absorbers, phenolic antioxidants, and organic or inorganic pigments.

In one embodiment, a composition includes an article and a photocured hardcoat coating layer in adherence thereto, wherein the photocured hardcoat coating layer is a photocurable hardcoat coating formulation that includes: a) at least one ethylenically unsaturated polymerizable compound; b) at least one red-shifted UV absorber of Formula (I) or (II), or a combination of any two of Formulas (I), (II), and (III) (above); c) a combination of photoinitiators comprising: i) at least one alpha-hydroxy ketone photoinitiator; and ii) at least one bisacylphosphine oxide photoinitiator; and, optionally, d) a hindered amine light stabilizer. In some embodiments, the composition includes e) a compound selected from ultraviolet light absorbers, phenolic antioxidants, and organic or inorganic pigments.

Paragraph A. A photocurable hard coat coating composition comprising:
 a) an ethylenically unsaturated polymerizable compound;
 b) a red-shifted UV absorber of Formula (I) or (II), or a mixture of any two of Formulas (I), (II), and (III); and c) a combination of photoinitiators comprising:
   i) an α-hydroxy ketone photoinitiator; and
   ii) a bisacylphosphine oxide photoinitiator; and
optionally, d) a hindered amine light stabilizer.
wherein:

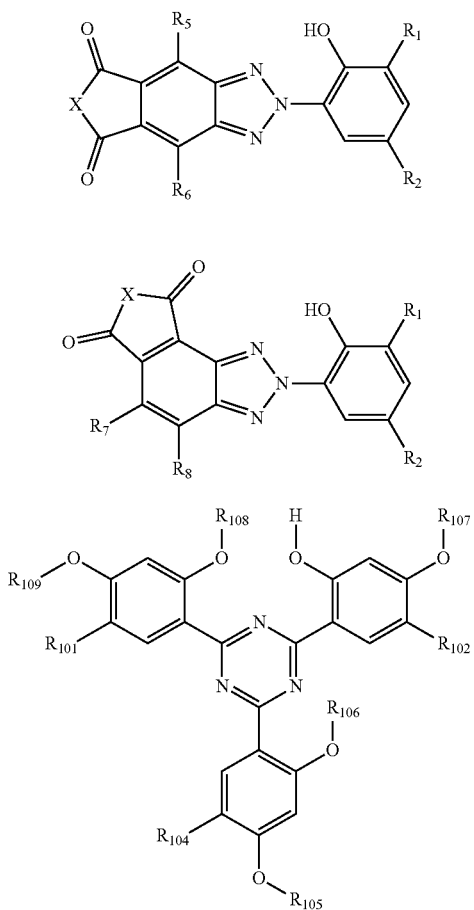

$R_1$ is hydrogen, a straight or branched chain $C_{1-24}$ alkyl, a straight or branched chain $C_{2-18}$ alkenyl, a $C_{5-12}$ cycloalkyl, a $C_{7-15}$ phenylalkyl, phenyl, or a phenyl or the phenylalkyl having 0 to 4 $C_{1-4}$ alkyl groups; or $R_1$ is

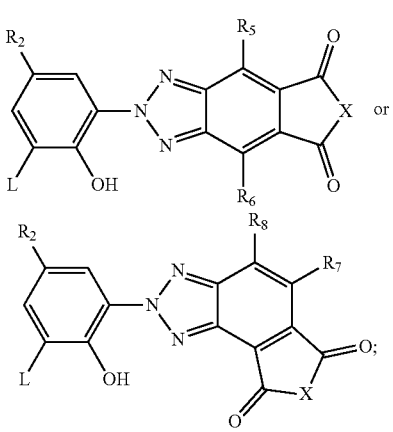

L is the linking group for $R_1$ and is a $C_{1-12}$ alkylene, $C_{2-12}$ alkylidene, benzylidene, p-xylylene, or a $C_{5-7}$ cycloalkylene;

$R_2$ is a straight or branched chain $C_{1-24}$ alkyl, a straight or branched chain $C_{2-18}$ alkenyl, a $C_{5-12}$ cycloalkyl, a $C_{7-15}$ phenylalkyl, phenyl, or a phenyl or the phenylalkyl having 0 to 3 $C_{1-4}$ alkyl groups; or the is alkyl substituted by one or more —OH, —OCO—$R_{11}$, —$OR_{14}$, —NCO or —$NH_2$ groups or mixtures thereof, or the alkyl or the alkenyl interrupted by one or more —O—, —NH— or —$NR_{14}$-groups or mixtures thereof and which may be unsubstituted or substituted by one or more —OH, —$OR_{14}$ or —$NH_2$ groups or mixtures thereof;

$R_{11}$ is hydrogen, straight or branched chain $C_1$-$C_{12}$alkyl, $C_5$-$C_{12}$cycloalkyl, straight or branched chain $C_3$-$C_8$alkenyl, phenyl, naphthyl or $C_7$-$C_{15}$ phenylalkyl;

$R_{14}$ is hydrogen, straight or branched $C_1$-$C_{24}$ alkyl;

$R_2$ is —$OR_{14}$, a group —C(O)—O—$R_{14}$, —C(O)—$NHR_{14}$ or —C(O)—$NR_{14}R'_{14}$ wherein $R'_{14}$ has the same meaning as $R_{14}$, —$SR_{13}$, —$NHR_{13}$ or —$N(R_{13})_2$, —$(CH_2)_m$—CO—$X_1$—$(Z)_p$—Y—$R_{15}$;

$X_1$ is —O— or —$N(R_{16})$—;

Y is —O— or —$N(R_{17})$— or a direct bond,

Z is $C_2$-$C_{12}$-alkylene, $C_4$-$C_{12}$alkylene interrupted by one to three nitrogen atoms, oxygen atoms or a mixture thereof, or is $C_3$-$C_{12}$alkylene, butenylene, butynylene, cyclohexylene or phenylene, each of which may be additionally substituted by a hydroxyl group,

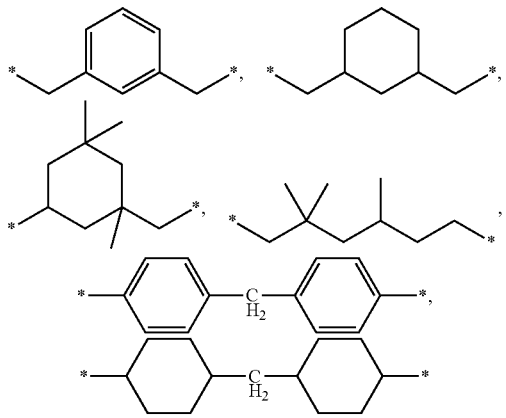

wherein * denotes a bond; or when Y is a direct bond, Z can be a direct bond;

m is zero, 1 or 2;

p is 1, or p is also zero when X and Y are —$N(R_{16})$— and —$N(R_{17})$—, respectively;

$R_{15}$ is hydrogen, $C_1$-$C_{12}$alkyl,

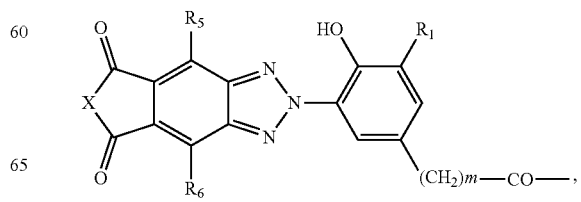

-continued

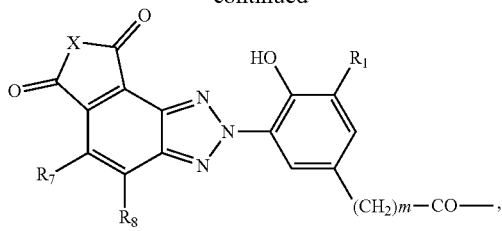

a group —CO—C($R_{18}$)=C(H)$R_{19}$, or
when Y is —N($R_{17}$)—, $R_{15}$ forms together with $R_{17}$ a group —CO—CH=CH—CO—;
$R_{18}$ is hydrogen or methyl and $R_{19}$ is hydrogen, methyl or —CO—$X_1$-$R_{20}$,
$R_{20}$ is hydrogen, $C_1$-$C_{12}$alkyl or a group of Formula

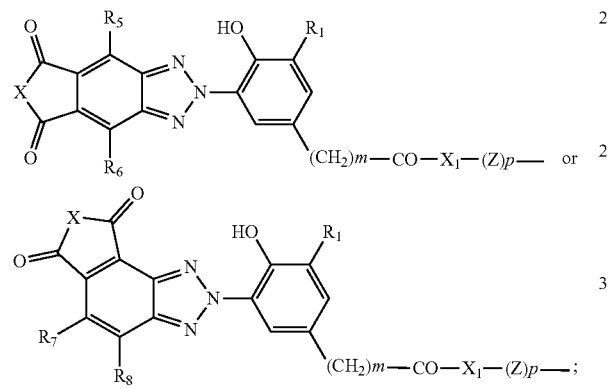

$R_5$, $R_6$, $R_7$ and $R_8$ are independently hydrogen, halogen, CN, $NO_2$ or $NH_2$;
$R_{13}$ is alkyl of 1 to 20 carbon atoms, hydroxyalkyl of 2 to 20 carbon atoms, alkenyl of 3 to 18 carbon atoms, cycloalkyl of 5 to 12 carbon atoms, phenylalkyl of 7 to 15 carbon atoms, phenyl or naphthyl, which both may be substituted by one or two alkyl of 1 to 4 carbon atoms;
$R_{16}$ and $R_{17}$ independently of one another are hydrogen, $C_1$-$C_{12}$-alkyl, $C_3$-$C_{12}$-alkyl interrupted by 1 to 3 oxygen atoms, cyclohexyl, or $C_7$-$C_{15}$phenylalkyl; or $R_{16}$ together with $R_{17}$ in the case where Z is ethylene, also forms ethylene;
X is O or $NE_1$;
$E_1$ is hydrogen, straight or branched chain $C_1$-$C_{24}$alkyl, straight or branched chain $C_2$-$C_{18}$alkenyl, $C_2$-$C_6$alkyinyl, $C_5$-$C_{12}$cycloalkyl, phenyl, naphthyl or $C_7$-$C_{15}$phenylalkyl; or the straight or branched chain $C_1$-$C_{24}$ alkyl, straight or branched chain $C_2$-$C_{24}$ alkenyl, $C_5$-$C_{12}$ cycloalkyl, $C_2$-$C_6$ alkinyl may be substituted by one or more —F, —OH, —$OR_{22}$, —$NH_2$, —$NHR_{22}$, —N($R_{22}$)$_2$, —$NHCOR_{23}$, —$NR_{22}COR_{23}$, —$OCOR_{24}$, —$COR_{25}$, —$SO_2R_{26}$, —PO($R_{27}$)$_n$($R_{28}$)$_{2-n}$, —Si($R_{29}$)$_n$($R_{30}$)$_{3-n}$, —Si($R_{22}$)$_3$, —$N^+(R_{22})_3$ $A^-$, —$S^+(R_{22})_2$ $A^-$-oxiranyl groups or mixtures thereof; the straight or branched chain $C_1$-$C_{24}$ alkyl, straight or branched chain unsubstituted or substituted $C_2$-$C_{24}$ alkenyl, $C_5$-$C_{12}$ cycloalkyl or $C_2$-$C_6$ alkinyl can also be interrupted by one or more —O—, —S—, —NH— or —$NR_{22}$— groups or combinations thereof; the phenyl, naphthyl or $C_7$-$C_{15}$phenylalkyl can also be substituted by one or more halogen, —CN, —$CF_3$, —$NO_2$, —$NHR_{22}$, —N($R_{22}$)$_2$, —$SO_2R_{26}$, —PO($R_{27}$)$_n$($R_{28}$)$_{2-n}$, —OH, —$OR_{22}$, —$COR_{25}$, —$R_{25}$;
n is 0, 1 or 2;
$R_{22}$ is straight or branched chain $C_1$-$C_{18}$ alkyl, straight or branched chain $C_2$-$C_{18}$ alkenyl, $C_5$-$C_{10}$ cycloalkyl, phenyl or naphthyl, $C_7$-$C_{15}$ phenylalkyl, or two $R_{22}$ when attached to an N or Si atom can form together with the atom to which they are bonded a pyrrolidine, piperidine or morpholine ring;
$R_{23}$ is hydrogen, $OR_{22}$, $NHR_{22}$, N($R_{22}$)$_2$ or has the same meaning as $R_{22}$;
$R_{24}$ is $OR_{22}$, $NHR_{22}$, N($R_{22}$)$_2$ or has the same meaning as $R_{22}$;
$R_{25}$ is hydrogen, OH, $OR_{22}$, $NHR_{22}$ or N($R_{22}$)$_2$, O-glycidyl or has the same meaning as $R_{22}$;
$R_{26}$ is OH, $OR_{22}$, $NHR_{22}$ or N($R_{22}$)$_2$;
$R_{27}$ is $NH_2$, $NHR_{22}$ or N($R_{22}$)$_2$;
$R_{28}$ is OH or $OR_{22}$;
$R_{29}$ is Cl or $OR_{22}$;
$R_{30}$ is straight or branched chain $C_1$-$C_{18}$ alkyl; or
$E_1$ is a group

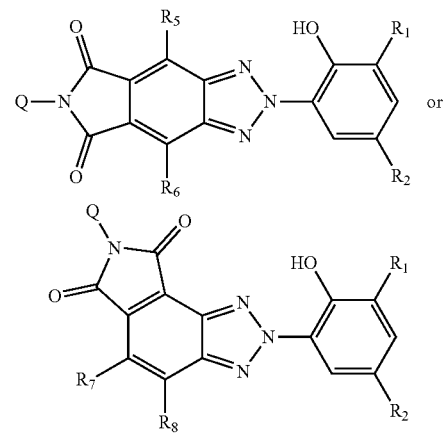

wherein Q is straight or branched $C_2$-$C_{12}$alkylene, $C_2$-$C_{12}$alkylene, which is interrupted by one or more —O—, NH or $NR_{14}$ atoms, $C_5$-$C_{10}$cycloalkylene, para-phenylene or a group

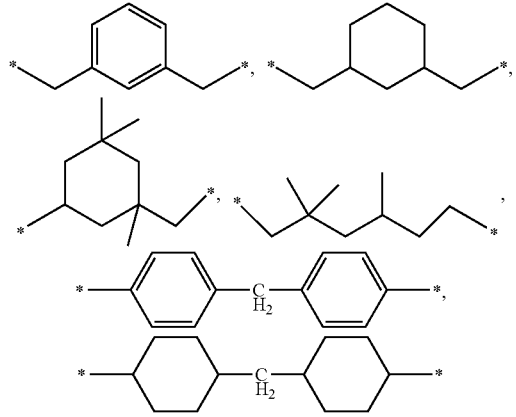

wherein * denotes a bond;

$R_{101}$, $R_{102}$, and $R_{104}$ are independently hydrogen, straight or branched chain alkyl of 1 to 24 carbon atoms, cycloalkyl of 5 to 12 carbon atoms, phenylalkyl of 7 to 15 carbon atoms;

$R_{105}$, $R_{106}$, $R_{107}$, $R_{108}$, and $R_{109}$ are independently hydrogen, straight or branched chain alkyl of 1 to 24 carbon atoms or cycloalkyl of 5 to 12 carbon atoms; or the alkyl or the cycloalkyl substitute by one to four halogen, epoxy, glycidyloxy, furyloxy, —$R_{204}$, —$OR_{205}$, —$N(R_{205})_2$, —$CON(R_{205})_2$, —$COR_{205}$, —$COOR_{205}$, —$OCOR_{205}$, —$OCOC(R_{205})=C(R_{205})_2$, —$C(R_{205})=CCOOR_{205}$, —CN, —NCO, or combinations thereof; or the alkyl or the cycloalkyl interrupted by one to four epoxy, —O—, —$NR_{205}$—, —$CONR_{205}$—, —COO—, —OCO—, —CO—, —$C(R_{205})=C(R_{205})$COO—, —$OCOC(R_{205})=C(R_{205})=C(R_{205})=C(R_{205})$—, phenylene or phenylene-G-phenylene in which G is —O—, —S—, —$SO_2$—, —$CH_2$— or —$C(CH_3)_2$—or combinations thereof, or the alkyl or the cycloalkyl both substituted and interrupted by combinations of the groups mentioned above; or —$COR_{206}$;

$R_{204}$ is aryl of 6 to 10 carbon atoms or the aryl substituted by one to three halogen, alkyl of 1 to 8 carbon atoms, alkoxy of 1 to 8 carbon atoms or combinations thereof; cycloalkyl of 5 to 12 carbon atoms; phenylalkyl of 7 to 15 carbon atoms or the phenylalkyl substituted on the phenyl ring by one to three halogen, alkyl of 1 to 8 carbon atoms, alkoxy of 1 to 8 carbon atoms or combinations thereof; or straight or branched chain alkenyl of 2 to 18 carbon atoms;

$R_{205}$ is defined as is $R_{204}$; or $R_{205}$ is also hydrogen or straight or branched chain alkyl of 1 to 24 carbon atoms, alkenyl of 2 to 24 carbon atoms;

$R_{206}$ is straight or branched chain alkyl of 1 to 18 carbon atoms, straight or branched chain alkenyl of 2 to 12 carbon atoms, phenoxy, alkyl amino of 1 to 12 carbon atoms, arylamino of 6 to 12 carbon atoms, —$R_{207}$COOH or —NH—$R_{208}$—NCO;

$R_{207}$ is alkylene of 2 to 14 carbon atoms or phenylene; and $R_{208}$ is alkylene of 2 to 24 carbon atoms, phenylene, tolylene, or diphenylmethane.

Paragraph B. The composition of Paragraph A, wherein:
$R_1$ is hydrogen, straight or branched chain alkyl of 1 to 24 carbon atoms, straight or branched chain alkenyl of 2 to 18 carbon atoms, cycloalkyl of 5 to 12 carbon atoms, phenylalkyl of 7 to 15 carbon atoms, phenyl, or the phenyl or the phenylalkyl substituted on the phenyl ring by 1 to 4 alkyl of 1 to 4 carbon atoms,

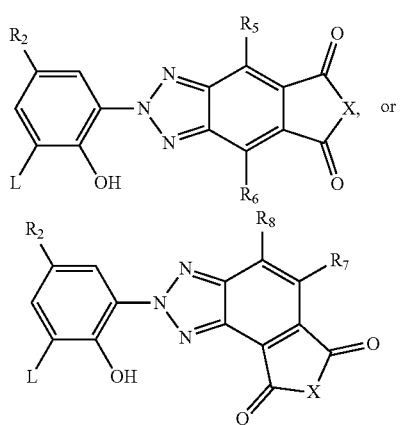

wherein L is alkylene of 1 to 12 carbon atoms, alkylidene of 2 to 12 carbon atoms, benzylidene, p-xylylene or cycloalkylene of 5 to 7 carbon atoms;

$R_2$ is straight or branched chain alkyl of 1 to 24 carbon atoms, straight or branched chain alkenyl of 2 to 18 carbon atoms, cycloalkyl of 5 to 12 carbon atoms, phenylalkyl of 7 to 15 carbon atoms, phenyl, or the phenyl or the phenylalkyl substituted on the phenyl ring by 1 to 3 alkyl of 1 to 4 carbon atoms, or —$(CH_2)_m$—CO—$X_1$—$(Z)_p$—Y—$R_{15}$;

$X_1$ is —O—;
Y is —O— or a direct bond;
Z is $C_2$-$C_{12}$-alkylene, $C_4$-$C_{12}$alkylene interrupted by one to three nitrogen atoms, oxygen atoms or a mixture thereof, or when Y is a direct bond, Z can additionally also be a direct bond;
m is 2;
p is 1;
$R_{15}$ is hydrogen, $C_1$-$C_{12}$alkyl or

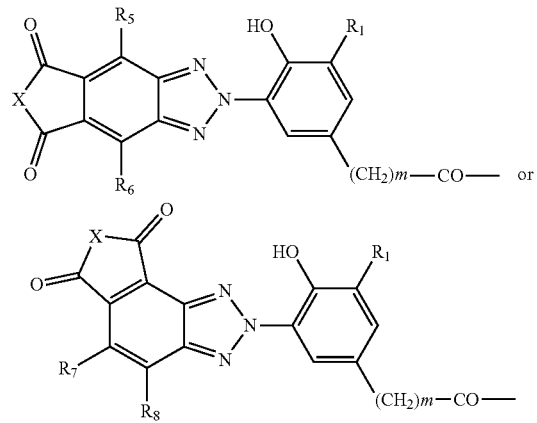

$R_5$, $R_6$, $R_7$ and $R_8$ are independently hydrogen, Cl or Br;
X is O or $NE_1$;
$E_1$ is hydrogen, straight or branched chain $C_1$-$C_{24}$alkyl, straight or branched chain $C_2$-$C_{18}$alkenyl, $C_2$-$C_6$alkyinyl, $C_5$-$C_{12}$cycloalkyl, phenyl, naphthyl or $C_7$-$C_{15}$phenylalkyl; or the straight or branched chain $C_1$-$C_{24}$ alkyl, straight or branched chain $C_2$-$C_{24}$ alkenyl, $C_5$-$C_{12}$ cycloalkyl, $C_2$-$C_6$ alkinyl may be substituted by one or more —F, —OH, —$OR_{22}$, —$NH_2$, —$NHR_{22}$, —$N(R_{22})_2$, —$NHCOR_{23}$, —$NR_{22}COR_{23}$, —$OCOR_{24}$, —$COR_{25}$, —$SO_2R_{26}$, —$PO(R_{27})_n$ $(R_{28})_{2-n}$, —$Si(R_{29})_n(R_{30})_{3-n}$, —$Si(R_{22})_3$, —$N^+(R_{22})_3$ $A^-$, —$S^+(R_{22})_2$ $A^-$, -oxiranyl groups or mixtures thereof; the straight or branched chain $C_1$-$C_{24}$ alkyl, straight or branched chain unsubstituted or substituted $C_2$-$C_{24}$ alkenyl, $C_5$-$C_{12}$ cycloalkyl or $C_2$-$C_6$ alkinyl can also be interrupted by one or more —O—, —S—, —NH— or —$NR_{22}$— groups or combinations thereof; the phenyl, naphthyl or $C_7$-$C_{15}$phenylalkyl can also be substituted by one or more halogen, —CN, —$CF_3$, —$NO_2$, —$NHR_{22}$, —$N(R_{22})_2$, $N(R_{22})_2$, —$SO_2R_{26}$, —$PO(R_{27})_nR_{28})_{2-n}$, —OH, —$OR_{22}$, —$COR_{25}$, —$R_{25}$;
n is 0, 1 or 2;
$R_{22}$ is straight or branched chain $C_1$-$C_{18}$ alkyl, straight or branched chain $C_2$-$C_{18}$ alkenyl, $C_5$-$C_{10}$ cycloalkyl, phenyl or naphthyl, $C_7$-$C_{15}$ phenylalkyl, or two $R_{22}$ when attached to an N or Si atom can form together with the atom to which they are bonded a pyrrolidine, piperidine or morpholine ring;

$R_{23}$ is hydrogen, $OR_{22}$, $NHR_{22}$, $N(R_{22})_2$ or has the same meaning as $R_{22}$;

$R_{24}$ is $OR_{22}$, $NHR_{22}$, $N(R_{22})_2$ or has the same meaning as $R_{22}$;

$R_{25}$ is hydrogen, OH, $OR_{22}$, $NHR_{22}$ or $N(R_{22})_2$, O-glycidyl or has the same meaning as $R_{22}$;

$R_{26}$ is OH, $OR_{22}$, $NHR_{22}$ or $N(R_{22})_2$;

$R_{27}$ is $NH_2$, $NHR_{22}$ or $N(R_{22})_2$;

$R_{28}$ is OH or $OR_{22}$;

$R_{29}$ is Cl or $OR_{22}$;

$R_{30}$ is straight or branched chain $C_1$-$C_{18}$ alkyl; $E_1$ is

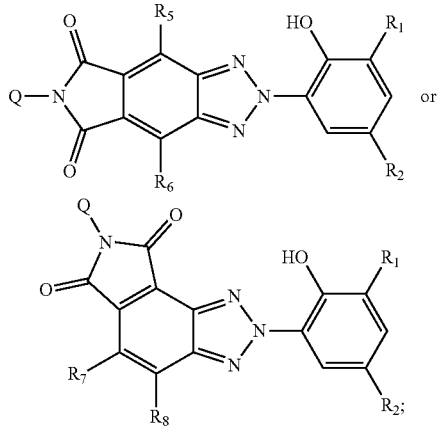

Q is straight or branched $C_2$-$C_{12}$alkylene, $C_5$-$C_{10}$cycloalkylene or para-phenylene,

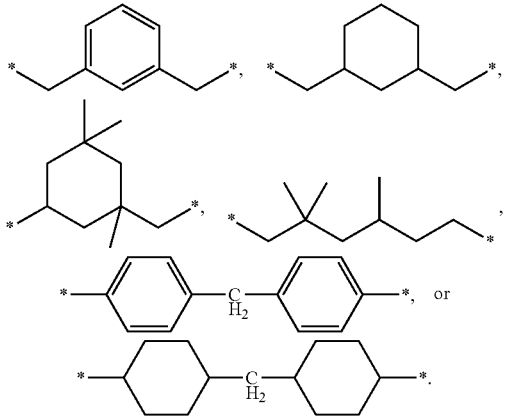

Paragraph C. The composition of Paragraph A or B, wherein:

$R_1$ is hydrogen, straight or branched chain alkyl of 1 to 24 carbon atoms, straight or branched chain alkenyl of 2 to 18 carbon atoms, cycloalkyl of 5 to 12 carbon atoms, phenylalkyl of 7 to 15 carbon atoms, phenyl, or the phenyl or the phenylalkyl substituted on the phenyl ring by 1 to 4 alkyl of 1 to 4 carbon atoms;

$R_2$ is straight or branched chain alkyl of 1 to 24 carbon atoms, straight or branched chain alkenyl of 2 to 18 carbon atoms, cycloalkyl of 5 to 12 carbon atoms, phenylalkyl of 7 to 15 carbon atoms, phenyl, or the phenyl or the phenylalkyl substituted on the phenyl ring by 1 to 3 alkyl of 1 to 4 carbon atoms, or —$(CH_2)_2$—CO—O—(Z)—O—$R_{15}$;

Z is $C_2$-$C_{12}$-alkylene, $C_4$-$C_{12}$alkylene interrupted by one to three oxygen atoms;

$R_{15}$ is hydrogen, $C_1$-$C_{12}$alkyl,

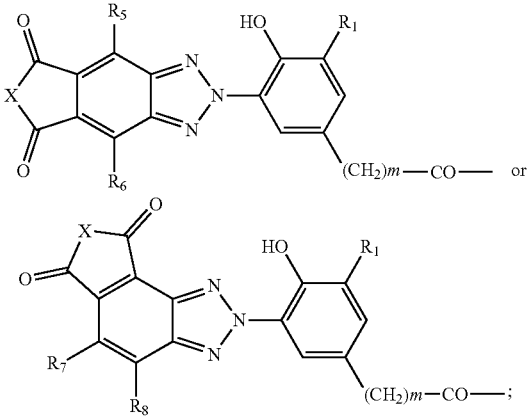

$R_5$, $R_6$, $R_7$ and $R_8$ are independently hydrogen, Cl or Br;

X is O or $NE_1$;

$E_1$ is hydrogen, straight or branched chain $C_1$-$C_{24}$alkyl, $C_5$-$C_{12}$cycloalkyl, phenyl or $C_7$-$C_{15}$phenylalkyl; or the straight or branched chain $C_1$-$C_{24}$ alkyl or $C_5$-$C_{12}$ cycloalkyl may be substituted by one or more —F, —OH, —$OR_{22}$, —$NH_2$, —$NHR_{22}$, —$N(R_{22})_2$, wherein the phenyl or $C_7$-$C_{15}$phenylalkyl can also be substituted by one or more -halogen, —CN, —$CF_3$, —OH, —$OR_{22}$, —$COR_{22}$, —$R_{22}$;

$R_{22}$ is straight or branched chain $C_1$-$C_{18}$ alkyl, straight or branched chain $C_2$-$C_{18}$ alkenyl, $C_5$-$C_{10}$ cycloalkyl, $C_6$-$C_{16}$ phenyl or naphthyl, $C_7$-$C_{15}$ phenylalkyl;

$E_1$ is

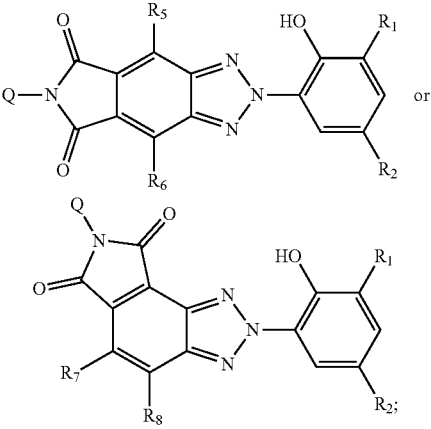

and Q is $C_2$-$C_{12}$alkylene, $C_5$-$C_7$cycloalkylene, para-phenylene,

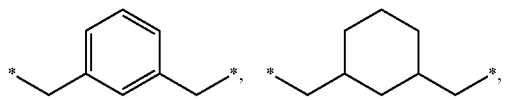

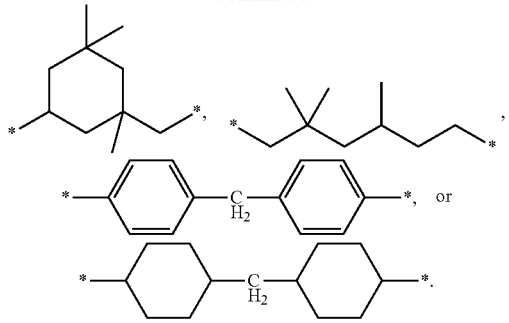

Paragraph D. The composition of Paragraph A, B, or C, wherein:
R$_1$ is hydrogen, straight or branched chain alkyl of 1 to 12 carbon atoms or phenylalkyl of 7 to 15 carbon atoms;
R$_2$ is straight or branched chain alkyl of 1 to 12 carbon atoms or phenylalkyl of 7 to 15 carbon atoms, phenyl, or the phenyl or the phenylalkyl substituted on the phenyl ring by 1 to 3 alkyl of 1 to 4 carbon atoms;
R$_5$ and R$_6$ are hydrogen or one of both is Cl or Br;
R$_7$ and R$_8$ are independently hydrogen, Cl or Br;
X is O or NE$_1$;
E$_1$ is hydrogen, straight or branched chain C$_1$-C$_6$alkyl, which is unsubstituted or substituted by 1 to 4 OH, phenyl which is unsubstituted or substituted by F, CF$_3$, CN or Cl, or C$_7$-C$_9$phenylalkyl.

Paragraph E. The composition of any one of Paragraphs A-D, wherein the red-shifted hydroxyphenylbenzotriazoles are of Formula (I).

Paragraph F. The composition of any one of Paragraphs A-E, wherein the red-shifted hydroxyphenylbenzotriazole is:

UVA1

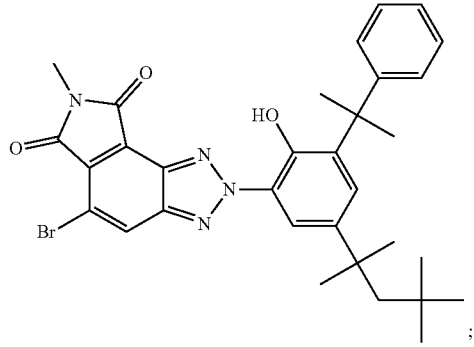

UVA2

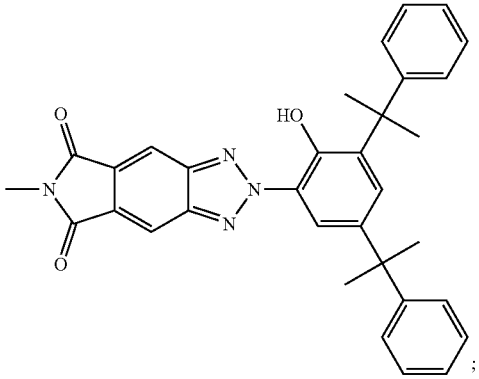

UVA3

UVA4

UVA5

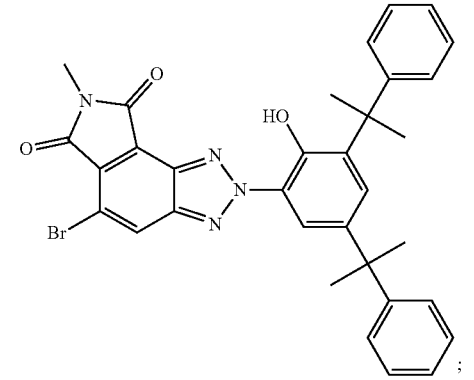

UVA6

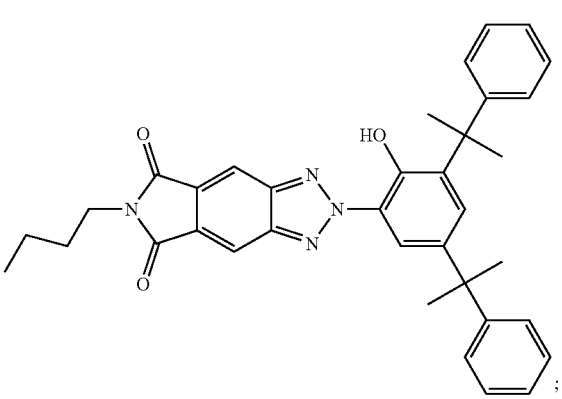

-continued

UVA7

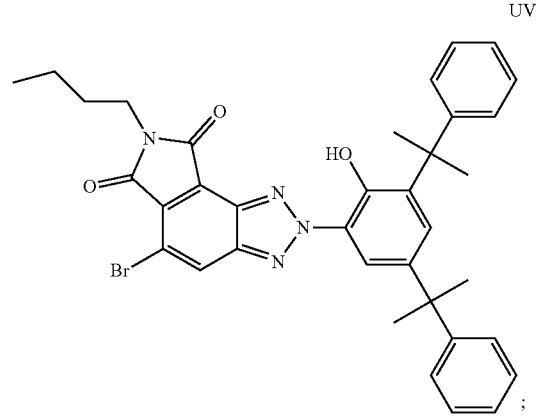
;

UVA8

;

UVA9

;

UVA10

;

-continued

UVA11

; or

UVA12

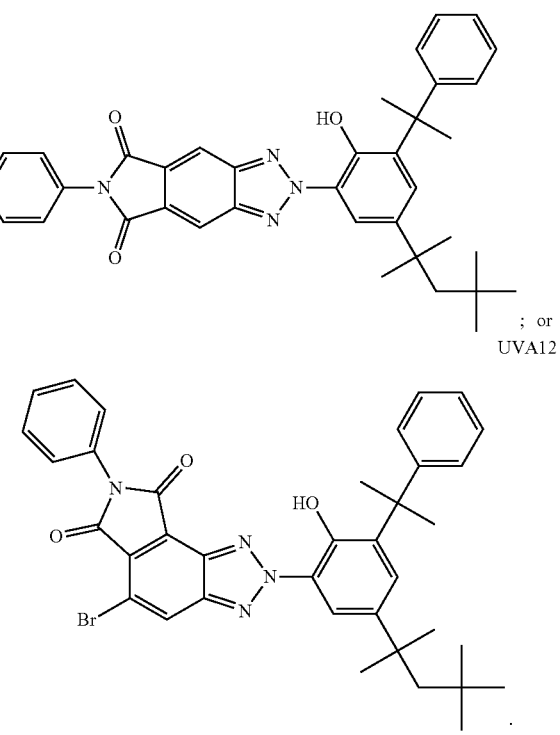
.

Paragraph G. The composition of any one of Paragraphs A-F comprising the red-shifted UV absorber of Formula III which is 2,4-bis(2-hydroxy-4-n-butyloxyphenyl)-6-(2,4-di-n-butyloxyphenyl)-s-triazine; 2,4,6-tris(2-hydroxy-4-isooctyloxycarbonylisopropylideneoxyphenyl)-s-triazine; 2,4,6-tris[2-hydroxy-4-(3-sec-butyloxy-2-hydroxypropyloxy) phenyl]-1,3,5-triazine; 2-(2,4dihydroxyphenyl)-4,6-bis(2-hydroxy-4(1-methoxycarbonylpentoxy)phenyl)-1,3,5-triazine; 2,4,6-tris(2-hydroxy-4-(1-methoxycarbonyl-pentoxy)phenyl)-1,3,5triazine; 2-(2,4-di(methoxycarbonylpentoxy)phenyl)-4,6-bis(2-hydroxy-4-(1-methoxycarbonylpentoxy)phenyl)-1,3,5-triazine; 2-(2,4-dihydroxyphenyl)-4,6-bis-(2-hydroxy-4-(1-hydroxycarbonylpentoxy)phenyl)-1,3,5-triazine; 2,4,6-tris(2-hydroxy-4-(1-hydroxycarbonyl-pentoxy)phenyl)-1,3,5-triazine; 2-(2,4-di(hydroxycarbonylpentoxy)phenyl)-4,6-bis(2-hydroxy-4-(1-hydroxycarbonylpentoxy)phenyl)-1,3,5-triazine; 2,4-bis[2-hydroxy-4-(3-n-butoxy-2-hydroxypropoxy)phenyl]-6-[2-methoxy-4-(3-n-butoxy-2-hydroxypropoxy)phenyl]-1,3,5-triazine; 2,4-bis[2-hydroxy-4-(3-n-butoxy-2-hydroxypropoxy)phenyl]-6-[2,4-di-(3-n-butoxy-2-hydroxypropoxy)phenyl]-1,3,5-triazine; 2,4-bis[2-hydroxy-4-(1-ethoxycarbonylethoxy)phenyl]-6-[2,4-di-(1-ethoxycarbonylethoxy)phenyl]-1,3,5-triazine; 2,4,6-tris(2'-hydroxy-4'-isopropyloxyphenyl)-1,3,5-triazine; 2,4,6-tris(2'-hydroxy-4'-n-hexyloxyphenyl)-1,3,5-triazine; 2,4-bis(2'-hydroxy-4'-isopropyloxyphenyl)-6-(2'-methoxy-4'-isopropyloxyphenyl)-1,3,5-triazine; 2,4-bis(2'-hydroxy-4'-isopropyloxyphenyl)-6-(2'-ethoxy-4'-isopropyloxypheny 1)-1,3,5-triazine; 2,4-bis(2'-hydroxy-4'-isopropyloxyphenyl)-6-(2',4'-diisopropyloxyphenyl)-1,3,5-triazine; 2,4-bis (2'-hydroxy-4'-n-hexyloxyphenyl)-6-(2',4'-di-(n-hexyloxy) phenyl)-1-3,5-triazine, or a mixture of any two or more thereof.

Paragraph H. The composition of any one of Paragraphs A-G, wherein the ethylenically unsaturated polymerizable compound is selected from the group consisting of hydroxyalkyl acrylates or methacrylates, acrylonitrile, acrylamide, methacrylamide, N-substituted (meth)acrylamides, vinyl esters, styrene, alkylstyrenes, halostyrenes, N-vinylpyrrolidone, vinyl chloride, vinylidene chloride, monomers containing two—four double bonds, acrylated epoxy resins, acrylated polyethers, acrylated polyurethanes, acrylated polyesters, esters of ethylenically unsaturated carboxylic acids and polyols or polyepoxides, unsaturated polyesters, polyamides and polyurethanes and co-polymers thereof, polybutadiene and butadiene co-polymers, polyisoprene and isoprene co-polymers, polymers and co-polymers containing (meth)acrylic groups in side-chains, unsaturated amides, oligomeric polyunsaturated compounds, urethane (meth) acrylate oligomer(s), acrylate monomer comprising three or four acrylate groups, methacrylate monomers comprising three or four methacrylate groups, and mixtures of any two or more thereof.

Paragraph I. The composition of any one of Paragraphs A-H comprising the hindered amine light stabilizer, which is selected from the group consisting of 1-cyclohexyloxy-2,2, 6,6-tetramethyl-4-octadecylaminopiperidine; bis(2,2,6,6-tetramethylpiperidin-4-yl) sebacate; bis(1-acetoxy-2,2,6,6-tetramethylpiperidin-4-yl) sebacate; bis(1,2,2,6,6-pentamethyl-4-yl) sebacate; bis(1-cyclohexyloxy-2,2,6,6-tetramethylpiperidin-4-yl) sebacate; bis(1-octyloxy-2,2,6,6-tetramethylpiperidin-4-yl) sebacate; bis(1-acyl-2,2,6,6-tetramethylpiperidin-4-yl) sebacate; bis(1,2,2,6,6-pentamethyl-4-piperidyl)-n-butyl-3,5-di-tert-butyl-4-hydroxybenzylmalonate; 2,4-bis[(1-cyclohexyloxy-2,2,6,6-tetramethylpiperidin-4-yl)-butylamino]-6-(2-hydroxyethylamino-s-triazine; bis(1-cyclohexyloxy-2,2,6,6-tetramethylpiperidin-4-yl)-adipate; 2,4-bis[(1-cyclohexyloxy-2,2,6,6-piperidin-4-yl)-butylamino]-6-chloro-s-triazine; 1-(2-hydroxy-2-methylpropoxy)-4-hydroxy-2,2,6,6-tetramethylpiperidine; 1-(2-hydroxy-2-methylpropoxy)-4-oxo-2,2,6,6-tetramethylpiperidine; 1-(2-hydroxy-2-methylpropoxy)-4-octadecanoyloxy-2,2,6,6-tetramethylpiperidine; bis(1-(2-hydroxy-2-methylpropoxy)-2,2,6,6-tetramethylpiperidin-4-yl) sebacate; bis(1-(2-hydroxy-2-methylpropoxy)-2,2,6,6-tetramethylpiperidin-4-yl) adipate; 2,4-bis{N-[1-(2-hydroxy-2-methylpropoxy)-2,2,6,6-tetramethylpiperidin-4-yl]-N-butylamino}-6-(2-hydroxyethylamino)-s-triazine; 4-benzoyl-2,2,6,6-tetramethylpiperidine; di-(1,2,2,6,6-pentamethylpiperidin-4-yl) p-methoxybenzylidenemalonate; 4-stearyloxy-2,2,6,6-tetramethylpiperidine; bis(1-octyloxy-2,2,6,6-tetramethylpiperidyl) succinate; 1,2,2,6,6-pentamethyl-4-aminopiperidine; 2-undecyl-7,7,9,9-tetramethyl-1-oxa-3,8-diaza-4-oxo-spiro[4,5]decane; tris(2,2,6,6-tetramethyl-4-piperidyl) nitrilotriacetate; tris(2-hydroxy-3-(amino-(2,2,6,6-tetramethylpiperidin-4-yl)propyl) nitrilotriacetate; tetrakis-(2,2,6,6-tetramethyl-4-piperidyl)-1,2,3,4-butane-tetracarboxylate; tetrakis-(1,2,2,6,6-pentamethyl-4-piperidyl)-1,2,3,4-butane-tetracarboxylate; 1,1'-(1,2-ethanediyl)-bis-(3,3,5,5-tetramethylpiperazinone); 3-n-octyl-7,7,9,9-tetramethyl-1,3,8-triazaspiro[4.5]decan-2,4-dione; 8-acetyl-3-dodecyl-7,7,9,9-tetramethyl-1,3,8-triazaspiro[4.5]decane-2,4-dione; 3-dodecyl-1-(2,2,6,6-tetramethyl-4-piperidyl)pyrrolidin-2,5-dione; 3-dodecyl-1-(1,2,2,6,6-pentamethyl-4-piperidyl)pyrrolidine-2,5-dione; N,N'-bis-formyl-N,N'-bis(2,2,6,6-tetramethyl-4-piperidyl) hexamethylenediamine; the reaction product of 2,4-bis[(1-cyclohexyloxy-2,2,6,6-piperidin-4-yl)butylamino]-6-chloro-s-triazine with N,N'-bis(3-aminopropyl) ethylenediamine); the condensate of 1-(2-hydroxyethyl)-2,2,6,6-tetramethyl-4-hydroxypiperidine and succinic acid; linear or cyclic condensates of N,N'-bis(2,2,6,6-tetramethyl-4-piperidyl)-hexamethylenediamine and 4-tert-octylamino-2,6-dichloro-1,3,5-triazine; linear or cyclic condensates of N,N'-bis(2,2,6,6-tetramethyl-4-piperidyl)-hexamethylenediamine and 4-cyclohexylamino-2,6-dichloro-1,3,5-triazine; linear or cyclic condensates of N,N'-bis-(2,2,6,6-tetramethyl-4-piperidyl)-hexamethylenediamine and 4-morpholino-2,6-dichloro-1,3,5-triazine; linear or cyclic condensates of N,N'-bis-(1,2,2,6,6-pentamethyl-4-piperidyl) hexamethylenediamine and 4-morpholino-2,6-dichloro-1,3,5-triazine; the condensate of 2-chloro-4,6-bis(4-n-butylamino-2,2,6,6-tetramethylpiperidyl)-1,3,5-triazine and 1,2-bis(3-aminopropylamino)ethane; the condensate of 2-chloro-4,6-di-(4-n-butylamino-1,2,2,6,6-pentamethylpiperidyl)-1,3,5-triazine and 1,2-bis-(3-aminopropylamino)ethane; a reaction product of 7,7,9,9-tetramethyl-2-cycloundecyl-11-oxa-3,8-diaza-4-oxospiro [4,5]decane and epichlorohydrin; poly[methyl, (3-oxy-(2,2,6,6-tetramethylpiperidin-4-yl)propyl)] siloxane, CAS#182635-99-0; the reaction product of maleic acid anhydride-$C_{18}$-$C_{22}$-α-olefin-copolymer with 2,2,6,6-tetramethyl-4-aminopiperidine; the oligomeric compound which is the condensation product of 4,4'-hexamethylenebis(amino-2,2,6,6-tetramethylpiperidine) and 2,4-dichloro-6-[(2,2,6,6-tetramethylpiperidin-4-yl)butylamino]-s-triazine end-capped with 2-chloro-4,6-bis (dibutylamino)-s-triazine; the oligomeric compound which is the condensation product of 4,4'-hexamethylenebis (amino-1,2,2,6,6-penta-methylpiperidine) and 2,4-dichloro-6-[(1,2,2,6,6-pentaamethylpiperidin-4-yl)butylamino]-s-triazine end-capped with 2-chloro-4,6-bis(dibutylamino)-s-triazine; the oligomeric compound which is the condensation product of 4,4'-hexamethylenebis(amino-1-propoxy-2,2,6,6-tetramethylpiperidine) and 2,4-dichloro-6-[(1-propoxy-2,2,6,6-tetramethylpiperidin-4-yl)butylamino]-s-triazine end-capped with 2-chloro-4,6-bis(dibutylamino)-s-triazine; the oligomeric compound which is the condensation product of 4,4'-hexamethylenebis(amino-1-acyloxy-2,2,6,6-tetramethylpiperidine) and 2,4-dichloro-6-[(1-acyloxy-2,2,6,6-tetramethylpiperidin-4-yl)butylamino]-s-triazine end-capped with 2-chloro-4,6-bis(dibutylamino)-s-triazine; and a product obtained by reacting a product, obtained by reacting 1,2-bis(3-aminopropylamino)ethane with cyanuric chloride and (2,2,6,6-tetramethylpiperidin-4-yl)butylamine.

Paragraph J. The composition of any one of Paragraphs A-I further comprising an ultraviolet light absorber selected from the group consisting of hydroxyphenylbenzotriazoles, hydroxyphenyl-s-triazines, benzophenones, esters of benzoic acids, acrylates, malonates, and oxamides.

Paragraph K. The composition of any one of Paragraphs A-J, wherein the ultraviolet light absorber comprises hydroxyphenyl-s-triazine or hydroxylphenylbenzotriazole.

Paragraph L. The composition of any one of Paragraphs A-K, wherein the photocurable hardcoat composition comprises a phenolic antioxidant.

Paragraph M. The composition of any one of Paragraphs A-L, wherein the red-shifted hydroxyphenylbenzotriazole is present from about 0.05% to about 5.0% by weight and the hindered amine light stabilizer is present from about 0.5% to about 3.0% by weight, each based on the weight of the photocurable hardcoat resin solids.

Paragraph N. A method for forming a photocured hardcoat protective film coating on a substrate, the method comprising applying the photocurable hardcoat coating composition of any one of Paragraphs A-M to a substrate and irradiating the photocurable hardcoat coating composition with a light source to form the photocured hardcoat protective film coating.

Paragraph O. An article comprising a substrate and a photocured hardcoat layer in adherence thereto, wherein the photocured hardcoat layer is a cured photocurable hardcoat coating formulation prepared from a photocurable harcoat coating composition of any one of Paragraph A-N.

Paragraph P. The article of Paragraph O, wherein the photocured hardcoat coating layer is from about 0.2 mil to about 10 mil thick.

Paragraph Q. The article of any one of Paragraphs O and P, wherein the photocured hardcoat coating layer exhibits a UV transmission of ≤0.1% at 290 nm to 360 nm, ≤0.5% at 400 nm and ≤12% at 420 nm.

Paragraph R. The article of any one of Paragraphs O-Q, wherein the photocured hardcoat coating layer is a tinted coating layer.

Paragraph S. The article of any one of Paragraphs O-R, wherein the photocured hardcoat coating layer is a pigmented coating layer.

Paragraph T. The article of any one of Paragraphs O-S, wherein the photocured hardcoat coating layer comprises an effect pigment.

Paragraph U. The article of any one of Paragraphs O-T, wherein the photocured hardcoat coating layer is a clear coat layer.

The present invention, thus generally described, will be understood more readily by reference to the following examples, which are provided by way of illustration and are not intended to be limiting of the present invention.

EXAMPLES

The composition of various tradename components used below are as follows:

Laromer® HDDA is a hexanediol diacrylate ester, available from BASF;

Laromer® UA 19T is an aliphatic urethane acrylate and is diluted with 35% by weight tripropylene glycol diacrylate (TPGDA), available from BASF;

Laromer® PO 9026 is a polyether acrylate resin, available from BASF;

Acronal® DS 3598 na is an acrylic dispersion used to manufacture pressure-sensitive adhesives for self-adhesive paper & film labels requiring clarity & polyolefin adhesion; available from BASF;

Irgacure® 184 is alpha-hydroxycyclohexyl phenyl ketone, available from BASF; and Irgacure® TPO is diphenyl (2,4,6-trimethylbenzoyl)-phosphine oxide, available from BASF.

Example 1

Monomer Solution Preparation

The present UV absorbers (UVAs) & hindered amine light stabilizers (HALS) are dissolved in a monomer mixture of 70 grams of Laromer 19T and 30 grams of Laromer HDDA followed by agitation for 30 minutes at ambient temperature. Photoinitiators are not added to these formulations since these materials would interfere with the UV absorbance measurement of these solutions. Viscosity is measured using a Brookfield Viscometer using spindle # 21 at 20 rpm and 23C. The UV absorbers are added at various combinations to the monomer mixture:

| Example | UVA 1 Concentration | UVA 13 Concentration | Component 3/ Concentration | Viscosity (cps) |
|---|---|---|---|---|
| 1-0 | — | — | — | 722.5 |
| 1-1 | 20 mg/L | — | — | 750 |
| 1-2 | 40 mg/L | — | — | 735 |
| 1-3 | 10 mg/L | 10 mg/L | — | 725 |
| 1-4 | 20 mg/L | 20 mg/L | — | 710 |
| 1-5 | — | 20 mg/L | — | 755 |
| 1-6 | — | 40 mg/L | — | 752.5 |
| 1-7 | 20 mg/L | — | HALS 1/5 mg/L | 737.5 |
| 1-8 | 10 mg/L | 10 mg/L | HALS 2/5 mg/L | 747.5 |
| 1-9 | — | — | Comparative UVA 1/20 mg/L | 742.5 |
| 1-10 | — | — | Comparative UVA 1/40 mg/L | 747.5 |

Example 1-0 is the 70:30 monomer mixture without UVAs & HALS. UVA 13 is 2,4,6-tris(2-hydroxy-4-isooctyloxycarbonylisopropylideneoxyphenyl)-s-triazine, a red-shifted triazine UV absorber. Comparative UVA 1 is 2-(2H-benzotriazol-2-yl)-6-(1-methyl-1-phenylethyl)-4-(1, 1, 3, 3-tetramethylbutyl) phenol, a benzotriazole UV absorber that is not red-shifted. HALS 1 is 3,5,5-trimethylhexanoic acid 2,2,6,6-tetramethyl-1-[2-(3,5,5-trimethyl-hexanoyloxy)-ethyl]-piperidin-4-yl ester. HALS 2 is bis(1-octyloxy-2,2,6,6-tetra-methylpiperidin-4-yl) sebacate.

Example 2

UV Transmittance of Monomer Solutions

The present UV absorbers are dissolved in a monomer mixture of 70 wt % of Laromer 19T and 30 wt % of Laromer HDDA. Photoinitiators are not added to these formulations since these materials would interfere with the UV absorbance measurement of these solutions. The UV absorbance is measured at various wavelengths for the monomer solutions containing 160 mg/liter total of the selected UV absorber or UV absorber combination and converted to percent transmission.

| UV Absorber | % T @ 360 nm | % T @ 400 nm | % T @ 420 nm |
|---|---|---|---|
| None | 1.8 | 79.4 | 100 |
| UVA 1 | 0 | 0.11 | 19.7 |
| UVA 1/UVA 13* | 0 | 2.35 | 39.8 |
| UVA 13 | 0 | 54.7 | 79.3 |
| Comparative UVA 1 | 0 | 66.8 | 80.7 |

*This is a 1:1 mixture by weight, 80 mg/each. % T = percent transmission

Example 3

Cured Clear Coating UV Transmittance

Glass plates having ultraviolet light transparency are obtained from Specialty Glass Products. UVA1, a red shifted UV absorber, is added to the formulation at a concentration of three weight percent relative to resin solids. The coated fused silica glass plates are coated with the UV absorber containing resin solution at different coating thicknesses using drawdown bars and are cured. The UV absorbance is measured for the clear coated fused silica glass plate and converted to percent transmission.

| Coating Thickness | % T at 360 nm | % T at 400 nm | % T at 420 nm |
|---|---|---|---|
| 3.3 mil | 0.02 | 0.1 | 11.3 |

This formulation achieves the present UV transmission levels.

Example 4

Cured Clear Coating UV Transmittance

Following the procedure of Example 3, UVA1, a red shifted UV absorber, is added to the formulation at a concentration of three weight percent relative to resin solids and bis(1,2,2,6,6-pentamethyl-4-piperidyl) n-butyl-3,5-di-tert-butyl-4-hydroxybenzylmalonate, a hindered amine light stabilizer, is added to the formulation at a concentration of 1.5 percent relative to resin solids. The UV absorbance is measured for the clear coated fused silica glass plate and converted to percent transmission.

| Coating Thickness | % T at 360 nm | % T at 400 nm | % T at 420 nm |
|---|---|---|---|
| 3.3 mil | 0.02 | 0.04 | 9.6 |

This formulation achieves the present UV transmission levels.

Example 5

Cured Clear Coating UV Transmittance

Following the procedure of Example 3, UVA1, a red shifted UV absorber, is added to the formulation at a concentration of two weight percent relative to resin solids, 2-[2-Hydroxy-4-[3-(2-ethylhexyl-1-oxy)-2-hydroxypropyloxy]phenyl]-4,6-bis(2,4-dimethylphenyl)-1,3,5-triazine, a commercial, non-redshifted, UV absorber, is added at a concentration of one weight percent relative to resin solids and bis(1,2,2,6,6-pentamethyl-4-piperidyl) n-butyl-3,5-di-tert-butyl-4 -hydroxybenzylmalonate, a hindered amine light stabilizer, is added to the formulation at a concentration of 1.5 percent relative to resin solids. The UV absorbance is measured for the clear coated fused silica glass plate and converted to percent transmission.

| Coating Thickness | % T at 360 nm % | % T at 400 nm | % T at 420 nm |
|---|---|---|---|
| 5.2 mil | 0.01 | 0.04 | 8.7 |

This formulation achieves the present UV transmission levels.

Example 6

Cured Clear Coating UV Transmittance

Following the procedure of Example 3, UVA1, a red shifted UV absorber, is added to the formulation at a concentration of two weight percent relative to resin solids, 2-(2H-benzotriazol-2-yl)-6-(1-methyl-1-phenylethyl)-4-(1,1,3,3-tetramethylbutyl) phenol, a comparative UVA 1, is added at a concentration of one weight percent relative to resin solids and bis(1,2,2,6,6-pentamethyl-4-piperidyl) n-butyl-3,5-di-tert-butyl-4-hydroxybenzylmalonate, a hindered amine light stabilizer, is added to the formulation at a concentration of 1.5 percent relative to resin solids. The UV absorbance is measured for the clear coated fused silica glass plate and converted to percent transmission.

| Coating Thickness | % T at 360 nm | % T at 400 nm | % T at 420 nm |
|---|---|---|---|
| 5.2 mil | 0.00 | 0.1 | 7.4 |

This formulation achieves the present UV transmission levels.

Comparative Example 1

Cured Clear Coating UV Transmittance

Glass plates having ultraviolet light transparency are obtained from Specialty Glass Products. The coated fused silica glass plates are coated with resin solutions containing no UV aborbers at different coating thicknesses using drawdown bars are cured. The UV absorbance is measured for the clear coated fused silica glass plate and converted to percent transmission. The cured formulation below contains no UV absorber.

| Coating Thickness | % T at 360 nm | % T at 400 nm | % T at 420 nm |
|---|---|---|---|
| 5.2 mil | 91.8 | 92.3 | 92.5 |
| 7.1 mil | 87.1 | 88.0 | 88.0 |

This formulation does not achieve the present UV transmission levels, even at 7.1 mils film thickness.

Comparative Example 2

Cured Clear Coating UV Transmittance

Following the procedure of Example 3, 2-[2-hydroxy-4-[3-(2-ethylhexyl-1-oxy)-2-hydroxypropyloxy]phenyl]-4,6-bis(2,4-dimethylphenyl)-1,3,5-triazine, a commercial triazine UV absorber, is added to the formulation at a concentration of three weight percent relative to resin solids. The UV absorbance is measured for the clear coated fused silica glass plate and converted to percent transmission.

| Coating Thickness | % T at 360 nm | % T at 400 nm | % T at 420 nm |
|---|---|---|---|
| 1.9 mil | 3.0 | 88.8 | 90.0 |
| 7.1 mil | 0.1 | 79.6 | 88.3 |

This formulation does not achieve the present UV transmission levels, even at 7.1 mils film thickness.

Comparative Example 3

Cured Clear Coating UV Transmittance

Following the procedure of Example 3, 2-(2H-benzotriazol-2-yl)-6-(1-methyl-1-phenylethyl)-4-(1,1,3,3-tetramethylbutyl) phenol, comparative UVA 1, is added to the formulation at a concentration of three weight percent relative to resin solids. The UV absorbance is measured for the clear coated fused silica glass plate and converted to percent transmission.

| Coating Thickness | % T at 360 nm | % T at 400 nm | % T at 420 nm |
|---|---|---|---|
| 1.9 mil | 0.2 | 78.1 | 88.1 |
| 3.3 mil | 0.1 | 68.2 | 89.5 |

This formulation does not achieve the present UV transmission levels.

Comparative Example 4

Cured Clear Coating UV Transmittance

Following the procedure of Example 3, 2-(5-chloro-2H-benzotriazol-2-yl)-6-(1,1-dimethylethyl)-4-methylphenol, a commercial red shifted benzotriazole UV absorber, is added to the formulation at a concentration of three weight percent relative to resin solids. The UV absorbance is measured for the clear coated fused silica glass plate and converted to percent transmission.

| Coating Thickness | % T at 360 nm | % T at 400 nm | % T at 420 nm |
|---|---|---|---|
| 3.3 mil | 0.02 | 14.0 | 84.5 |

This formulation does not achieve the present UV transmission levels.

Comparative Example 5

Cured Clear Coating UV Transmittance

Following the procedure of Example 3, 2-(5-chloro-2H-benzotriazol-2-yl)-6-(1,1-dimethylethyl)-4-methylphenol, a commercial red shifted benzotriazole UV absorber, is added to the formulation at a concentration of three weight percent relative to resin solids and bis(1,2,2,6,6-pentamethyl-4-piperidyl) n-butyl-3,5-di-tert-butyl-4-hydroxybenzylmalonate, a hindered amine light stabilizer, is added to the formulation at a concentration of 1.5 percent relative to resin solids. The UV absorbance is measured for the clear coated fused silica glass plate and converted to percent transmission.

| Coating Thickness | % T at 360 nm | % T at 400 nm | % T at 420 nm |
|---|---|---|---|
| 5.2 mil | 0.01 | 3.0 | 76.4 |

This formulation does not achieve the present UV transmission levels.

Example 7

Photocurable Compositions

The present stabilized photocurable compositions are prepared according to the tables below. All of the substances for each formulation are added together in an amber bottle followed by agitation for 30 minutes at ambient temperature.

| Raw Material | Experiment # | | | | |
|---|---|---|---|---|---|
| | 7-1 | 7-2 | 7-3 | 7-4 | 7-5 |
| UVA 1 | — | 3.0% | — | — | 1.5% |
| UVA 13 | — | — | 3.0% | — | 1.5% |
| HALS 2 | 0.50% | 0.50% | 0.50% | 0.50% | 0.50% |
| Comparative UVA 1 | — | — | — | 3% | — |
| Laromer HDDA | 18% | 15% | 15% | 15% | 15% |
| Laromer UA 19T | 60% | 60% | 60% | 60% | 60% |
| Laromer PO 9026 | — | — | — | — | — |
| Irgacure TPO | 2.00% | 2.00% | 2.00% | 2.00% | 2.00% |
| Irgacure 184 | 5.00% | 5.00% | 5.00% | 5.00% | 5.00% |
| MEK | 15% | 15% | 15% | 15% | 15% |

| Raw Material | Experiment # | | | | |
|---|---|---|---|---|---|
| | 7-6 | 7-7 | 7-8 | 7-9 | 7-10 |
| UVA 1 | — | 3.0% | — | — | 1.5% |
| UVA 13 | — | — | 3.0% | — | 1.5% |
| HALS 2 | 0.50% | 0.50% | 0.50% | 0.50% | 0.50% |
| Comparative UVA 1 | — | — | — | 3% | — |
| Laromer HDDA | 18% | 15% | 15% | 15% | 15% |
| Laromer UA 19T | — | — | — | — | — |
| Laromer PO 9026 | 60% | 60% | 60% | 60% | 60% |
| Irgacure TPO | 2.00% | 2.00% | 2.00% | 2.00% | 2.00% |
| Irgacure 184 | 5.00% | 5.00% | 5.00% | 5.00% | 5.00% |
| MEK | 15% | 15% | 15% | 15% | 15% |

Example 8

Photocured Coatings on TAC Films

The instant photocurable compositions prepared in Instant Example 7 are applied to cellulose triacetate (TAC) films (Grafix Plastics, 75 microns thickness, optical grade) using a #2 draw down bar and photocured using a Heraeus Noblelight Fusion UV systems Model DRS—10/12 QN, which is equipped with V & D lamps with a power setting of 80% and conveyor settings of 20 ft/minute. The UV dosage is UV A=1.569 J/cm$^2$, UV B=0.507 J/cm$^2$, UV C=0.066 J/cm$^2$, and UV V=1.154 J/cm$^2$. A dry film thickness of 0.25 mils is obtained. The L, a, b color and yellowness index (YI) are measured for the photocured films. YI is measured using ASTM 1925 and L, a, b color is measured using the CIE Lab color scale.

| Experiment # | 8-1 | 8-2 | 8-3 | 8-4 | 8-5 |
|---|---|---|---|---|---|
| Formulation | 7-1 | 7-2 | 7-3 | 7-4 | 7-5 |
| L Value | 90.49 | 90.05 | 90.33 | 90.32 | 90 |
| a Value | −0.27 | −1.98 | −0.46 | −0.4 | −1.32 |
| b Value | −0.77 | 4.66 | −0.22 | −0.36 | 2.47 |
| YI | −1.64 | 7.21 | −0.84 | −0.92 | 3.59 |

| Experiment # | 8-6 | 8-7 | 8-8 | 8-9 | 8-10 |
|---|---|---|---|---|---|
| Formulation | 7-6 | 7-7 | 7-8 | 7-9 | 7-10 |
| L Value | 90.49 | 89.89 | 90.4 | 90.27 | 90.14 |
| a Value | −0.3 | −3.29 | −0.57 | −0.5 | −1.79 |
| b Value | −0.68 | 7.39 | 0.02 | −0.05 | 3.21 |
| YI | −1.5 | 10.3 | −0.48 | −1.02 | 4.33 |

This instant example is illustrative of FIG. 1 wherein the TAC film is substrate 512 and the photocured layer is layer 511.

Example 9

Photocured Coatings Solvent Resistance

The instant photocurable compositions prepared in Instant Example 7 are applied to Leneta cards (The LENETA Co., Form 2A, size: 140×254 mm) using a #2 draw down bar and photocured using a Heraeus Noblelight Fusion UV systems Model DRS—10/12 QN, which is equipped with V & D lamps with a power setting of 80% and conveyor settings of 20 ft/minute. The UV dosage is UV A=1.569 J/cm$^2$, UV B=0.507 J/cm$^2$, UV C=0.066 J/cm$^2$, and UV V=1.154 J/cm$^2$. The instant photocured coatings are assessed for solvent resistance using ASTM D5402-15. This method describes a solvent rub technique (methylethyl ketone, MEK, for example) for assessing the solvent resistance of an organic coating that chemically changes during the curing process.

| Experiment # | 9-1 | 9-2 | 9-3 |
|---|---|---|---|
| Formulation | 7-2 | 7-3 | 7-4 |
| MEK Double Rubs | >200 | >200 | 175 |

The photocured coatings of the instant invention give better solvent resistance when compared to photocured coatings containing UV absorbers of the prior art.

Example 10

Photocured Coating Adhesion

The instant photocurable compositions prepared in Instant Example 7 are applied to polycarbonate (PC) plaques (Standard Plaque Inc., Sabic Lexane LS2-111, sample size: 4"×6"×0.125") using a #2 draw down bar and photocured using a Heraeus Noblelight Fusion UV systems Model DRS—10/12 QN, which is equipped with V & D lamps with a power setting of 80% and conveyor settings of 20 ft/minute. The UV dosage is UV A=1.569 J/cm$^2$, UV B=0.507 J/cm$^2$, UV C=0.066 J/cm$^2$, and UV V=1.154 J/cm$^2$. The instant photocured coatings are assessed for adhesion using ASTM D3359-09. This test method covers procedures for assessing the adhesion of coating films to substrates by applying and removing pressure-sensitive tape over cuts made in the film. Method B (cross-hatch) is used.

|  | 10-1 | 10-2 | 10-3 | 10-4 |
|---|---|---|---|---|
| Formulation | 7-6 | 7-7 | 7-8 | 7-10 |
| Cross Hatch Adhesion Results | 5B | 5B | 5B | 5B |

This instant example is illustrative of FIG. 1 wherein the PC plaque is substrate 512 and the photocured layer is layer 511. The photocured coatings of the instant invention on polycarbonate have no negative effect on adhesion when compared to photocured coatings containing UV absorbers of the prior art.

Example 11

Transmission of Photocured Coatings on PET Films

The instant photocurable compositions prepared in Instant Example 7 are applied to polyethylene terephthalate (PET) films (TAP Plastic Inc., Mylar film (PET) thickness: 2 mil) using a #2 draw down bar and photocured using a Heraeus Noblelight Fusion UV systems Model DRS—10/12 QN, which is equipped with V & D lamps with a power setting of 80% and conveyor settings of 20 ft/minute. The UV dosage is UV A=1.569 J/cm$^2$, UV B=0.507 J/cm$^2$, UV C=0.066 J/cm$^2$, and UV V=1.154 J/cm$^2$. A dry film thickness of 0.25 mils is obtained. Photocured films of greater film thickness can be prepared by changing the viscosity of the instant photocurable composition and/or using multiple photocured layers. The UV absorbance is measured for the clear photocured coating layer on a PET film wherein the photocured layer is 5.25 mils and converted to percent transmission.

| Experiment # | 11-1 | 11-2 | 11-3 | 11-4 | 11-5 |
|---|---|---|---|---|---|
| Formulation | 7-6 | 7-7 | 7-8 | 7-9 | 7-10 |
| % Transmission at 360 nm | 46.0 | 0 | 0 | 0 | 0 |
| % Transmission at 400 nm | 100 | 0 | 1.6 | 36.9 | 0.007 |
| % Transmission at 420 nm | 100 | 0.15 | 94.5 | 100 | 11.3 |

This instant example is illustrative of FIG. 1 wherein the PET film is layer 512 and the photocured layer is layer 511. The photocured coatings of the instant invention give better long wavelength UV protection when compared to photocured coatings containing UV absorbers of the prior art. The instant photocured coatings achieve the present UV transmission levels.

Example 12

Transmission of Photocured Coatings on TAC Films

The instant photocurable compositions prepared in Instant Example 7 are applied to cellulose triacetate (TAC) films (Grafix Plastics, 75 microns thickness, optical grade) using a #2 draw down bar and photocured using a Heraeus Noblelight Fusion UV systems Model DRS—10/12 QN, which is equipped with V & D lamps with a power setting of 80% and conveyor settings of 20 ft/minute. The UV dosage is UV A=1.569 J/cm$^2$, UV B=0.507 J/cm$^2$, UV C=0.066 J/cm$^2$, and UV V=1.154 J/cm$^2$. A dry film thickness of 0.25 mils is obtained. Photocured films of greater film thickness can be prepared by changing the viscosity of the instant photocurable composition and/or using multiple photocured layers. The UV absorbance is measured for the clear photocured coating layer on a TAC film wherein the photocured layer is 3.0 mils and converted to percent transmission.

| Experiment # | 12-1 | 12-2 | 12-3 | 12-4 | 12-5 |
|---|---|---|---|---|---|
| Formulation | 7-6 | 7-7 | 7-8 | 7-9 | 7-10 |
| % Transmission at 360 nm | 71.8 | 0 | 0 | 0 | 0 |
| % Transmission at 400 nm | 100 | 0 | 12.9 | 31.2 | 0.5 |
| % Transmission at 420 nm | 100 | 2.42 | 88.5 | 68.3 | 22.1 |

This instant example is illustrative of FIG. 1 wherein the TAC film is substrate 512 and the photocured layer is layer 511. The photocured coatings of the instant invention give better long wavelength UV protection when compared to photocured coatings containing UV absorbers of the prior art. The instant photocured coatings achieve the present UV transmission levels.

Example 13

Photocured Coating Scratch Resistance

The instant photocurable compositions prepared in Instant Example 7 are applied to cold rolled steel (CRS) panels [ACT Test Panels LLC, size=04×12×0.26 inches(thickness), B952 (phosphate bond), P90, DIW (deionzed water washed) unpolished CRS] using a #2 draw down bar and photocured using a Heraeus Noblelight Fusion UV systems Model DRS—10/12 QN, which is equipped with V & D lamps with a power setting of 80% and conveyor settings of 20 ft/minute. The UV dosage is UV A=1.569 J/cm$^2$, UV B=0.507 J/cm$^2$, UV C=0.066 J/cm$^2$, and UV V=1.154 J/cm$^2$. The instant photocured coatings are assessed for scratch resistance using a Crockmeter. This test is described below.

The width of the crocking head is 25 mm and the head is curved with a radius of 19 mm. The head of the crocking head is covered with ethylene propylene diene monomer rubber (EPDM) open celled foam with a Shore 00 hardness from 60. Movement of the cracking head relative to the sample is perpendicular to the axis of the surface curvature. An abrasive flexible polyester lapping film with aluminum oxide particles fixed with a synthetic adhesive is to be attached to the crocking head. Abrasive film is 3M 261X lapping film in 5 μm grain, available from 3M. Gloss before scratching is to be measured on ten positions on each sample and averaged. The average gloss retention of two scratch lines is determined. It is possible that all scratch lines are applied to a single sample. The scratching line is generated through a relative movement of the sample to the crockmeter head with the lapping film. The following test conditions are used: 1) force applied to sample is 9N; 2) number of cycles to produce scratch line is 5 back and forth cycles; 3) length of scratch line is 80-100 mm; and 4) the speed of the crocking head is 1 Hz. After the test, gloss is measured at ten locations on each of the scratch lines and averaged. The gloss retention is the final gloss divided by the initial gloss multiplied by 100.

| Experiment # | 13-1 | 13-2 | 13-3 | 13-4 | 13-5 |
| --- | --- | --- | --- | --- | --- |
| Formulation | 7-6 | 7-7 | 7-8 | 7-9 | 7-10 |
| 20 Degree Gloss Retention (%) | 96 | 97 | 97 | 91 | 97 |

This instant example is illustrative of FIG. 1 wherein the steel is substrate 512 and the photocured layer is layer 511. The photocured hardcoat coatings of the instant invention give better scratch resistance when compared to photocured coatings containing UV absorbers of the prior art.

Example 14

Preparation of Photocured TAC Films with Adhesive Layer and Release Liner

The instant photocurable compositions prepared in Instant Example 7 are applied to triacetate (TAC) films (Grafix Plastics, 240 microns thickness, optical grade) using a #2 draw down bar and photocured using a Heraeus Noblelight Fusion UV systems Model DRS—10/12 QN, which is equipped with V & D lamps with a power setting of 80% and conveyor settings of 20 ft/minute. The UV dosage is UV A=1.569 J/cm$^2$, UV B=0.507 J/cm$^2$, UV C=0.066 J/cm$^2$, and UV V=1.154 J/cm$^2$. A dry film thickness of 0.25 mils is obtained.

Eighty pound paper siliconized release liner (Spinnaker) is applied to an automatic drawdown table with a vacuum bed. The vacuum is applied to the bed in order to hold the liner in place. Coating weight is set by using a flat bird bar. Acronal DS 3598 is applied in front of the bar and is dragged down by the bar. An adhesive coating weight of 30 grams/m$^2$ is obtained. After the adhesive application, the release liner with the adhesive thereon is removed from the vacuum bed and placed on a plexiglass panel and put into an oven at 115° C. for four minutes. The liner with the adhesive layer is applied directly to the TAC film side of the photocured TAC film as prepared above. After applying pressure with a hand roller, the adhesive transfers to the non-release substrate (photocured TAC film) and it is set.

| Experiment # | 14-1 | 14-3 |
| --- | --- | --- |
| Formulation | 7-2 | 7-7 |
| Photocured TAC Film with Adhesive Layer and Release Liner - Appearance | Light Yellow, optically clear | Light Yellow, optically clear |

Example 15

Preparation of Photocured TAC Films with Adhesive Layer and Release Liner

The instant photocurable compositions prepared in Instant Example 7 are applied to cellulose triacetate (TAC) films (Grafix Plastics, 240 microns thickness, optical grade) using a #2 draw down bar and photocured using a Heraeus Noblelight Fusion UV systems Model DRS—10/12 QN, which is equipped with V & D lamps with a power setting of 80% and conveyor settings of 20 ft/minute. The UV dosage is UV A=1.569 J/cm$^2$, UV B=0.507 J/cm$^2$, UV C=0.066 J/cm$^2$, and UV V=1.154 J/cm$^2$. A dry film thickness of 0.25 mils is obtained.

The TAC film side of the photocured TAC film as prepared above is applied to an automatic drawdown table with a vacuum bed with the TAC film side up. The vacuum is applied to the bed in order to hold the liner in place. Coating weight is set by using a flat bird bar. Acronal 3598 is applied in front of the bar and is dragged down by the bar. An adhesive coating weight of 30 grams/m$^2$ is obtained. After the adhesive application, the photocured TAC film with the adhesive thereon is removed and placed on a plexiglass panel and put into an oven at 115° C. for four minutes. An optically clear release liner (PET film, Mitsubishi) is applied directly to the adhesive layer of photocured TAC film. After applying pressure with a hand roller, the adhesive transfers to the non-release substrate (photocured TAC film) and it is set.

| Experiment # | 15-1 | 15-2 |
| --- | --- | --- |
| Formulation | 7-5 | 7-10 |
| Photocured TAC Film with Adhesive Layer and Release Liner - Appearance | Light Yellow, optically clear | Light Yellow, optically clear |

While certain embodiments have been illustrated and described, it should be understood that changes and modifications may be made therein in accordance with ordinary skill in the art without departing from the technology in its broader aspects as defined in the following claims.

The embodiments, illustratively described herein may suitably be practiced in the absence of any element or elements, limitation or limitations, not specifically disclosed herein. Thus, for example, the terms "comprising," "including," "containing," etc. shall be read expansively and without limitation. Additionally, the terms and expressions employed herein have been used as terms of description and not of limitation, and there is no intention in the use of such terms and expressions of excluding any equivalents of the features shown and described or portions thereof, but it is recognized that various modifications are possible within the scope of the claimed technology. Additionally, the phrase "consisting essentially of" will be understood to include those elements specifically recited and those additional elements that do not materially affect the basic and novel characteristics of the claimed technology. The phrase "consisting of" excludes any element not specified.

The present disclosure is not to be limited in terms of the particular embodiments described in this application. Many modifications and variations may be made without departing from its spirit and scope, as will be apparent to those skilled in the art. Functionally equivalent methods and compositions within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can of course vary. It is also to be understood that the terminology used herein is for the purpose of describing particular embodiments only, and is not intended to be limiting.

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, particularly in terms of providing a written description, all ranges disclosed herein also encompass any and all possible subranges and combinations of subranges thereof. Any listed range may be easily recognized as sufficiently describing and enabling the same range being broken down into at least equal halves, thirds, quarters, fifths, tenths, etc. As a non-limiting example, each range discussed herein may be readily broken down into a lower third, middle third and upper third, etc. As will also be understood by one skilled in the art all language such as "up to," "at least," "greater than," "less than," and the like, include the number recited and refer to ranges which may be subsequently broken down into subranges as discussed above. Finally, as will be understood by one skilled in the art, a range includes each individual member.

All publications, patent applications, issued patents, and other documents referred to in this specification are herein incorporated by reference as if each individual publication, patent application, issued patent, or other document was specifically and individually indicated to be incorporated by reference in its entirety. Definitions that are contained in text incorporated by reference are excluded to the extent that they contradict definitions in this disclosure.

Other embodiments are set forth in the following claims.

What is claimed is:

1. A photocurable hard coat coating composition comprising:
   a) an ethylenically unsaturated polymerizable compound;
   b) a red-shifted UV absorber of Formula (I) or (II), or a mixture of any two of Formulas (I), (II), and (III); and
   c) a combination of photoinitiators comprising:
      i) an α-hydroxy ketone photoinitiator; and
      ii) a bisacylphosphine oxide photoinitiator; and
   optionally, d) a hindered amine light stabilizer, wherein:

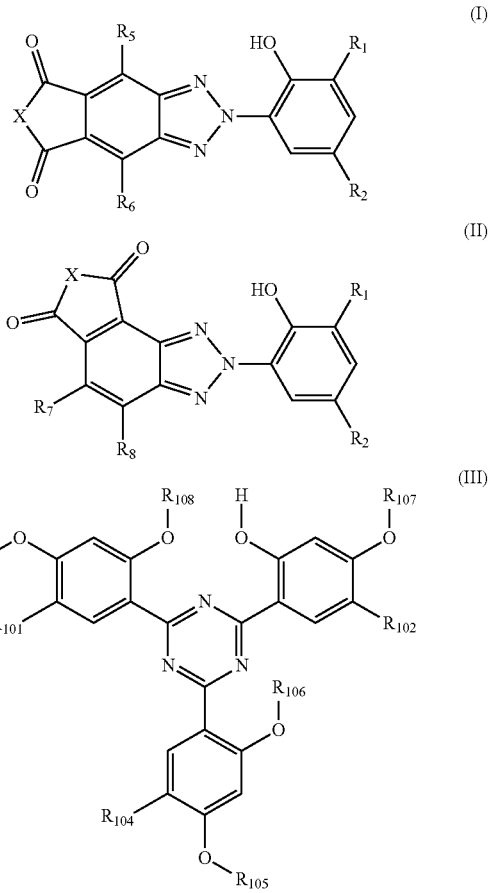

$R_1$ is hydrogen, a straight or branched chain $C_{1-24}$ alkyl, a straight or branched chain $C_{2-18}$ alkenyl, a $C_{5-12}$ cycloalkyl, a $C_{7-15}$ phenylalkyl, phenyl, or a phenyl or the phenylalkyl having 0 to 4 $C_{1-4}$ alkyl groups; or $R_1$ is

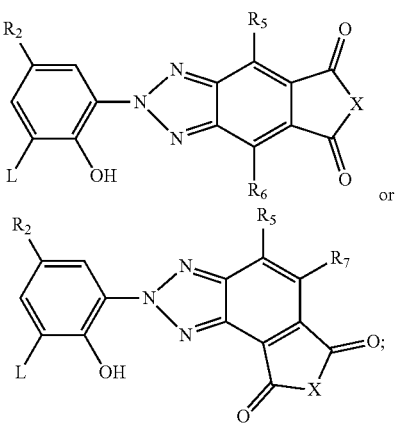

L is the linking group for $R_1$ and is a $C_{1-12}$ alkylene, $C_{2-12}$ alkylidene, benzylidene, p-xylylene, or a $C_{5-7}$ cycloalkylene;

$R_2$ is a straight or branched chain $C_{1-24}$ alkyl, a straight or branched chain $C_{2-18}$ alkenyl, a $C_{5-12}$ cycloalkyl, a $C_{7-15}$ phenylalkyl, phenyl, or a phenyl or the phenylalkyl having 0 to 3 $C_{1-4}$ alkyl groups; or the is alkyl substituted by one or more —OH, —OCO—$R_{11}$, —$OR_{14}$, —NCO or —$NH_2$ groups or mixtures thereof, or the alkyl or the alkenyl interrupted by one or more —O—, —NH— or —$NR_{14}$— groups or mixtures thereof and which may be unsubstituted or substituted by one or more —OH, —$OR_{14}$ or —$NH_2$ groups or mixtures thereof;

$R_{11}$ is hydrogen, straight or branched chain $C_1$-$C_{18}$alkyl, $C_5$-$C_{12}$cycloalkyl, straight or branched chain $C_3$-$C_8$alkenyl, phenyl, naphthyl or $C_7$-$C_{15}$ phenylalkyl;

$R_{14}$ is hydrogen, straight or branched $C_1$-$C_{24}$ alkyl;

$R_2$ is —$OR_{14}$, a group —C(O)—O—$R_{14}$, —C(O)—$NHR_{14}$ or —C(O)—$NR_{14}R'_{14}$ wherein $R'_{14}$ has the same meaning as $R_{14}$, —$SR_{13}$, —$NHR_{13}$ or —$N(R_{13})_2$, —$(CH_2)_m$—CO—$X_1$—$(Z)_p$—Y—$R_{15}$;

$X_1$ is —O— or —$N(R_{16})$—;

Y is —O— or —$N(R_{17})$— or a direct bond,

Z is $C_2$-$C_{12}$-alkylene, $C_4$-$C_{12}$alkylene interrupted by one to three nitrogen atoms, oxygen atoms or a mixture thereof, or is $C_3$-$C_{12}$alkylene, butenylene, butynylene, cyclohexylene or phenylene, each of which may be additionally substituted by a hydroxyl group,

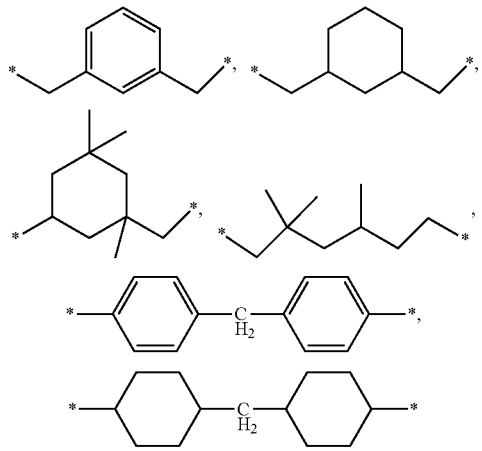

wherein * denotes a bond; or when Y is a direct bond, Z can be a direct bond;

m is zero, 1 or 2;

p is 1, or p is also zero when X and Y are —$N(R_{16})$— and —$N(R_{17})$—, respectively;

$R_{15}$ is hydrogen, $C_1$-$C_{12}$alkyl,

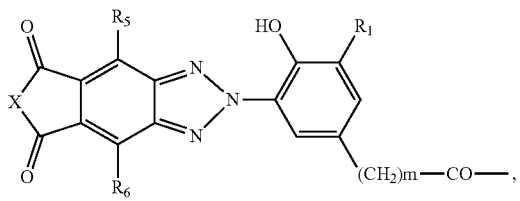

a group —CO—$C(R_{18})$=C(H)$R_{19}$, or when

Y is —$N(R_{17})$—, $R_{15}$ forms together with $R_{17}$ a group —CO—CH=CH—CO—;

$R_{18}$ is hydrogen or methyl and $R_{19}$ is hydrogen, methyl or —CO—$X_1$—$R_{20}$, $R_{20}$ is hydrogen, $C_1$-$C_{12}$alkyl or a group of Formula

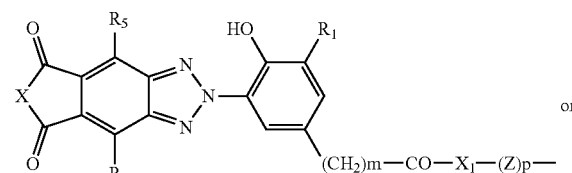

or

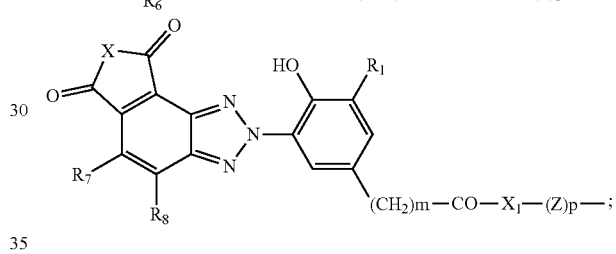

$R_5$, $R_6$, $R_7$ and $R_8$ are independently hydrogen, halogen, CN, $NO_2$ or $NH_2$;

$R_{13}$ is alkyl of 1 to 20 carbon atoms, hydroxyalkyl of 2 to 20 carbon atoms, alkenyl of 3 to 18 carbon atoms, cycloalkyl of 5 to 12 carbon atoms, phenylalkyl of 7 to 15 carbon atoms, phenyl or naphthyl, which both may be substituted by one or two alkyl of 1 to 4 carbon atoms;

$R_{16}$ and $R_{17}$ independently of one another are hydrogen, $C_1$-$C_{12}$-alkyl, $C_3$-$C_{12}$-alkyl interrupted by 1 to 3 oxygen atoms, cyclohexyl, or $C_7$-$C_{15}$phenylalkyl; or $R_{16}$ together with $R_{17}$ in the case where Z is ethylene, also forms ethylene;

X is O or $NE_1$;

$E_1$ is hydrogen, straight or branched chain $C_1$-$C_{24}$alkyl, straight or branched chain $C_2$-$C_{18}$alkenyl, $C_2$-$C_6$alkyinyl, $C_5$-$C_{12}$cycloalkyl, phenyl, naphthyl or $C_7$-$C_{15}$phenylalkyl; or the straight or branched chain $C_1$-$C_{24}$ alkyl, straight or branched chain $C_2$-$C_{24}$ alkenyl, $C_5$-$C_{12}$ cycloalkyl, $C_2$-$C_6$ alkinyl may be substituted by one or more —F, —OH, —$OR_{22}$, —$NH_2$, —$NHR_{22}$, —$N(R_{22})_2$, —$NHCOR_{23}$, —$NR_{22}COR_{23}$, —$OCOR_{24}$, —$COR_{25}$, —$SO_2R_{26}$, —$PO(R_{27})_n(R_{28})_{2-n}$, —$Si(R_{29})_n(R_{30})_{3-n}$, —$Si(R_{22})_3$, —$N^+(R_{22})_3$ $A^-$, —$S^+(R_{22})_2$ $A^-$, -oxiranyl groups or mixtures thereof; the straight or branched chain $C_1$-$C_{24}$ alkyl, straight or branched chain unsubstituted or substituted $C_2$-$C_{24}$ alkenyl, $C_5$-$C_{12}$ cycloalkyl or $C_2$-$C_6$ alkinyl can also be interrupted by one or more —O—, —S—, —NH— or —$NR_{22}$— groups or combinations thereof;

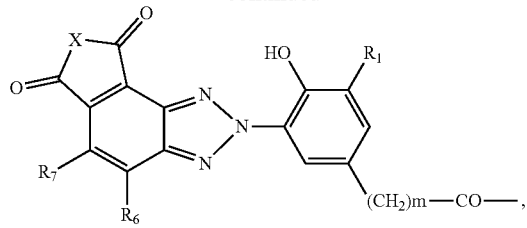

the phenyl, naphthyl or $C_7$-$C_{15}$phenylalkyl can also be substituted by one or more halogen, —CN, —$CF_3$, —$NO_2$, —$NHR_{22}$, —$N(R_{22})_2$, —$SO_2R_{26}$, —$PO(R_{27})_n(R_{28})_{2-n}$, —OH, —$OR_{22}$, —$COR_{25}$, —$R_{25}$;

n is 0, 1 or 2;

$R_{22}$ is straight or branched chain $C_1$-$C_{18}$ alkyl, straight or branched chain $C_2$-$C_{18}$ alkenyl, $C_5$-$C_{10}$ cycloalkyl, phenyl or naphthyl, $C_7$-$C_{15}$ phenylalkyl, or two $R_{22}$ when attached to an N or Si atom can form together with the atom to which they are bonded a pyrrolidine, piperidine or morpholine ring;

$R_{23}$ is hydrogen, $OR_{22}$, $NHR_{22}$, $N(R_{22})_2$ or has the same meaning as $R_{22}$;

$R_{24}$ is $OR_{22}$, $NHR_{22}$, $N(R_{22})_2$ or has the same meaning as $R_{22}$;

$R_{25}$ is hydrogen, OH, $OR_{22}$, $NHR_{22}$ or $N(R_{22})_2$, O-glycidyl or has the same meaning as $R_{22}$;

$R_{26}$ is OH, $OR_{22}$, $NHR_{22}$ or $N(R_{22})_2$;

$R_{27}$ is $NH_2$, $NHR_{22}$ or $N(R_{22})_2$;

$R_{28}$ is OH or $OR_{22}$;

$R_{29}$ is Cl or $OR_{22}$;

$R_{30}$ is straight or branched chain $C_1$-$C_{18}$ alkyl; or $E_1$ is a group

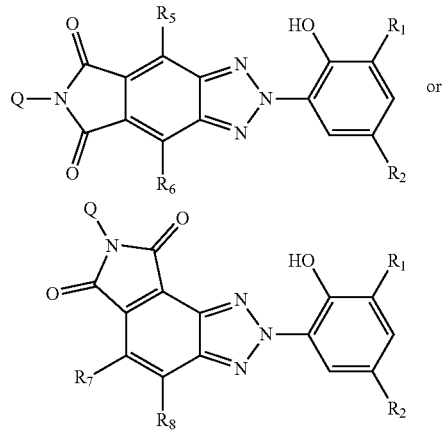

wherein Q is straight or branched $C_2$-$C_{12}$alkylene, $C_2$-$C_{12}$alkylene, which is interrupted by one or more —O—, NH or $NR_{14}$ atoms, $C_5$-$C_{10}$cycloalkylene, paraphenylene or a group

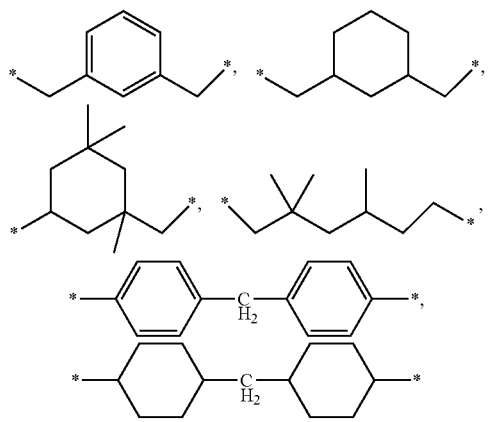

wherein * denotes a bond;

$R_{101}$, $R_{102}$, and $R_{104}$ are independently hydrogen, straight or branched chain alkyl of 1 to 24 carbon atoms, cycloalkyl of 5 to 12 carbon atoms, phenylalkyl of 7 to 15 carbon atoms;

$R_{105}$, $R_{106}$, $R_{107}$, $R_{108}$, and $R_{109}$ are independently hydrogen, straight or branched chain alkyl of 1 to 24 carbon atoms or cycloalkyl of 5 to 12 carbon atoms; or the alkyl or the cycloalkyl substitute by one to four halogen, epoxy, glycidyloxy, furyloxy, —$R_{204}$, —$OR_{205}$, —$N(R_{205})_2$, —$CON(R_{205})_2$, —$COR_{205}$, —$COOR_{205}$, —$OCOR_{205}$, —$OCOC(R_{205})=C(R_{205})_2$, —$C(R_{205})=CCOOR_{205}$, —CN, —NCO, or combinations thereof; or the alkyl or the cycloalkyl interrupted by one to four epoxy, —O—, —$NR_{205}$—, —$CONR_{205}$, —COO—, —OCO—, —CO—, —$C(R_{205})=C(R_{205})COO$—, —$OCOC(R_{205})=C(R_{205})$—, —$C(R_{205})=C(R_{205})$—, phenylene or phenylene-G-phenylene in which G is —O—, —S—, —$SO_2$—, —$CH_2$— or —$C(CH_3)_2$— or combinations thereof, or the alkyl or the cycloalkyl both substituted and interrupted by combinations of the groups mentioned above;

or —$COR_{206}$;

$R_{204}$ is aryl of 6 to 10 carbon atoms or the aryl substituted by one to three halogen, alkyl of 1 to 8 carbon atoms, alkoxy of 1 to 8 carbon atoms or combinations thereof; cycloalkyl of 5 to 12 carbon atoms; phenylalkyl of 7 to 15 carbon atoms or the phenylalkyl substituted on the phenyl ring by one to three halogen, alkyl of 1 to 8 carbon atoms, alkoxy of 1 to 8 carbon atoms or combinations thereof; or straight or branched chain alkenyl of 2 to 18 carbon atoms;

$R_{205}$ is defined as is $R_{204}$; or $R_{205}$ is also hydrogen or straight or branched chain alkyl of 1 to 24 carbon atoms, alkenyl of 2 to 24 carbon atoms;

$R_{206}$ is straight or branched chain alkyl of 1 to 18 carbon atoms, straight or branched chain alkenyl of 2 to 12 carbon atoms, phenoxy, alkyl amino of 1 to 12 carbon atoms, arylamino of 6 to 12 carbon atoms, —$R_{207}$COOH or —NH—$R_{208}$—NCO;

$R_{207}$ is alkylene of 2 to 14 carbon atoms or phenylene; and $R_{208}$ is alkylene of 2 to 24 carbon atoms, phenylene, tolylene, or diphenylmethane.

2. The composition of claim 1, wherein:

$R_1$ is hydrogen, straight or branched chain alkyl of 1 to 24 carbon atoms, straight or branched chain alkenyl of 2 to 18 carbon atoms, cycloalkyl of 5 to 12 carbon atoms, phenylalkyl of 7 to 15 carbon atoms, phenyl, or the phenyl or the phenylalkyl substituted on the phenyl ring by 1 to 4 alkyl of 1 to 4 carbon atoms,

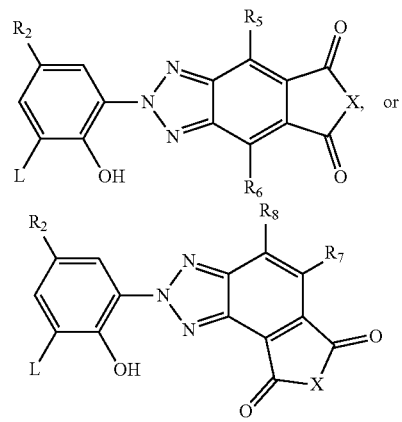

wherein L is alkylene of 1 to 12 carbon atoms, alkylidene of 2 to 12 carbon atoms, benzylidene, p-xylylene or cycloalkylene of 5 to 7 carbon atoms;

$R_2$ is straight or branched chain alkyl of 1 to 24 carbon atoms, straight or branched chain alkenyl of 2 to 18 carbon atoms, cycloalkyl of 5 to 12 carbon atoms, phenylalkyl of 7 to 15 carbon atoms, phenyl, or the phenyl or the phenylalkyl substituted on the phenyl ring by 1 to 3 alkyl of 1 to 4 carbon atoms, or —$(CH_2)_m$—CO—$X_1$—$(Z)_p$—Y—$R_{15}$;

$X_1$ is —O—;

Y is —O— or a direct bond;

Z is $C_2$-$C_{12}$-alkylene, $C_4$-$C_{12}$alkylene interrupted by one to three nitrogen atoms, oxygen atoms or a mixture thereof, or when Y is a direct bond, Z can additionally also be a direct bond;

m is 2;

p is 1;

$R_{15}$ is hydrogen, $C_1$-$C_{12}$alkyl or

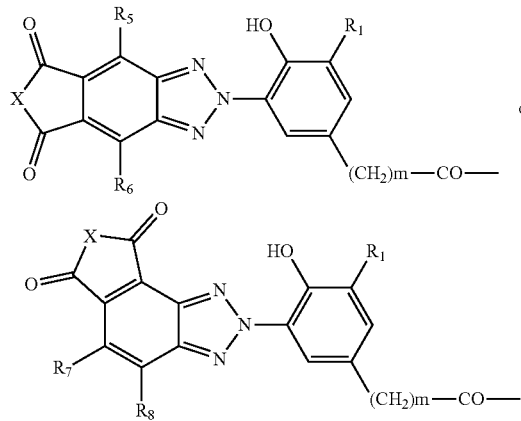

$R_5$, $R_6$, $R_7$ and $R_8$ are independently hydrogen, Cl or Br;

X is O or $NE_1$;

$E_1$ is hydrogen, straight or branched chain $C_1$-$C_{24}$alkyl, straight or branched chain $C_2$-$C_{18}$alkenyl, $C_2$-$C_6$alkyinyl, $C_5$-$C_{12}$cycloalkyl, phenyl, naphthyl or $C_7$-$C_{18}$phenylalkyl; or the straight or branched chain $C_1$-$C_{24}$ alkyl, straight or branched chain $C_2$-$C_{24}$ alkenyl, $C_5$-$C_{12}$ cycloalkyl, $C_2$-$C_6$ alkinyl may be substituted by one or more —F, —OH, —$OR_{22}$, —$NH_2$, —$NHR_{22}$, —$N(R_{22})_2$, —$NHCOR_{23}$, —$NR_{22}COR_{23}$, —$OCOR_{24}$, —$COR_{25}$, —$SO_2R_{26}$, —$PO(R_{27})_n$ $(R_{28})_{2-n}$, —$Si(R_{29})_n(R_{30})_{3-n}$, —$Si(R_{22})_3$, —$N^+(R_{22})_3$ $A^-$, —$S^+(R_{22})_2$ $A^-$, -oxiranyl groups or mixtures thereof; the straight or branched chain $C_1$-$C_{24}$ alkyl, straight or branched unsubstituted or substituted $C_2$-$C_{24}$ alkenyl, $C_5$-$C_{12}$ cycloalkyl or $C_2$-$C_6$ alkinyl can also be interrupted by one or more —O—, —S—, —NH— or —$NR_{22}$— groups or combinations thereof;

the phenyl, naphthyl or $C_7$-$C_{15}$phenylalkyl can also be substituted by one or more halogen, —CN, —$CF_3$, —$NO_2$, —$NHR_{22}$, —$N(R_{22})_2$, —$SO_2R_{26}$, —$PO(R_{27})_n$ $(R_{28})_{2-n}$, —OH, —$OR_{22}$, —$COR_{25}$, —$R_{25}$;

n is 0, 1 or 2;

$R_{22}$ is straight or branched chain $C_1$-$C_{18}$ alkyl, straight or branched chain $C_2$-$C_{18}$ alkenyl, $C_5$-$C_{10}$ cycloalkyl, phenyl or naphthyl, $C_7$-$C_{15}$ phenylalkyl, or two $R_{22}$ when attached to an N or Si atom can form together with the atom to which they are bonded a pyrrolidine, piperidine or morpholine ring;

$R_{23}$ is hydrogen, $OR_{22}$, $NHR_{22}$, $N(R_{22})_2$ or has the same meaning as $R_{22}$;

$R_{24}$ is $OR_{22}$, $NHR_{22}$, $N(R_{22})_2$ or has the same meaning as $R_{22}$;

$R_{25}$ is hydrogen, OH, $OR_{22}$, $NHR_{22}$ or $N(R_{22})_2$, O-glycidyl or has the same meaning as $R_{22}$;

$R_{26}$ is OH, $OR_{22}$, $NHR_{22}$ or $N(R_{22})_2$;

$R_{27}$ is $NH_2$, $NHR_{22}$ or $N(R_{22})_2$;

$R_{28}$ is OH or $OR_{22}$;

$R_{29}$ is Cl or $OR_{22}$;

$R_{30}$ is straight or branched chain $C_1$-$C_{18}$ alkyl;

$E_1$ is

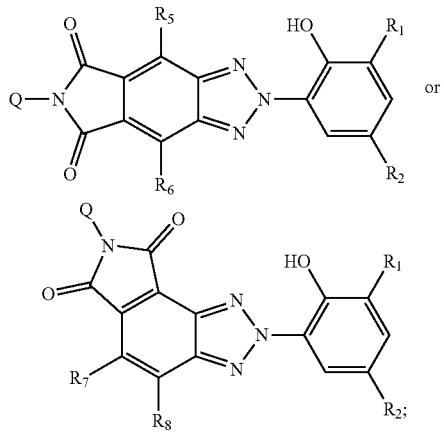

Q is straight or branched $C_2$-$C_{12}$alkylene, $C_5$-$C_{10}$cycloalkylene or para-phenylene,

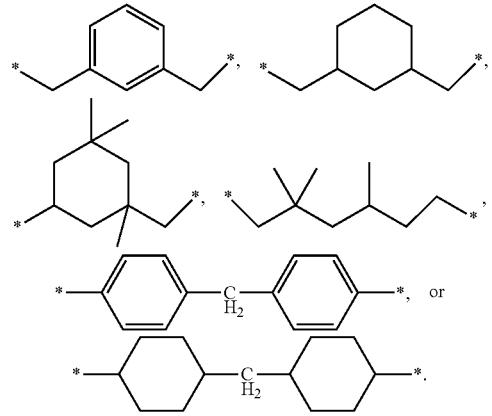

3. The composition of claim 1, wherein:

$R_1$ is hydrogen, straight or branched chain alkyl of 1 to 24 carbon atoms, straight or branched chain alkenyl of 2 to 18 carbon atoms, cycloalkyl of 5 to 12 carbon atoms, phenylalkyl of 7 to 15 carbon atoms, phenyl, or the phenyl or the phenylalkyl substituted on the phenyl ring by 1 to 4 alkyl of 1 to 4 carbon atoms;

$R_2$ is straight or branched chain alkyl of 1 to 24 carbon atoms, straight or branched chain alkenyl of 2 to 18 carbon atoms, cycloalkyl of 5 to 12 carbon atoms, phenylalkyl of 7 to 15 carbon atoms, phenyl, or the phenyl or the phenylalkyl substituted on the phenyl ring by 1 to 3 alkyl of 1 to 4 carbon atoms, or —$(CH_2)_2$—CO—O—(Z)—O—$R_{15}$;

Z is $C_2$-$C_{12}$-alkylene, $C_4$-$C_{12}$alkylene interrupted by one to three oxygen atoms;

$R_{15}$ is hydrogen, $C_1$-$C_{12}$alkyl,

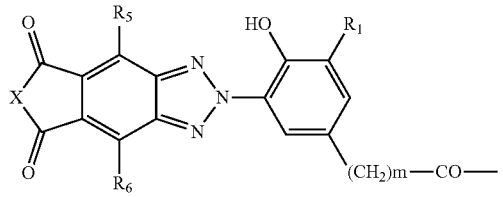

or

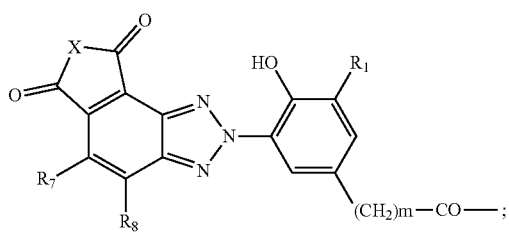

$R_5$, $R_6$, $R_7$ and $R_8$ are independently hydrogen, Cl or Br;

X is O or $NE_1$;

$E_1$ is hydrogen, straight or branched chain $C_1$-$C_{24}$alkyl, $C_5$-$C_{12}$cycloalkyl, phenyl or $C_7$-$C_{15}$phenylalkyl; or the straight or branched chain $C_1$-$C_{24}$ alkyl or $C_5$-$C_{12}$ cycloalkyl may be substituted by one or more —F, —OH, —$OR_{22}$, —$NH_2$, —$NHR_{22}$, —$N(R_{22})_2$, wherein the phenyl or $C_7$-$C_{15}$phenylalkyl can also be substituted by one or more -halogen, —CN, —$CF_3$, —OH, —$OR_{22}$, —$COR_{22}$, —$R_{22}$;

$R_{22}$ is straight or branched chain $C_1$-$C_{18}$alkyl, straight or branched chain $C_2$-$C_{18}$ alkenyl, $C_5$-$C_{10}$ cycloalkyl, $C_6$-$C_{16}$ phenyl or naphthyl, $C_7$-$C_{15}$ phenylalkyl;

$E_1$ is

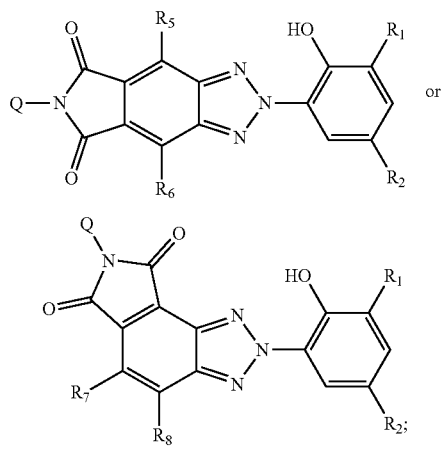

and Q is $C_2$-$C_u$alkylene, $C_5$-$C_7$cycloalkylene, para-phenylene,

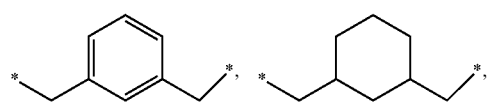

-continued

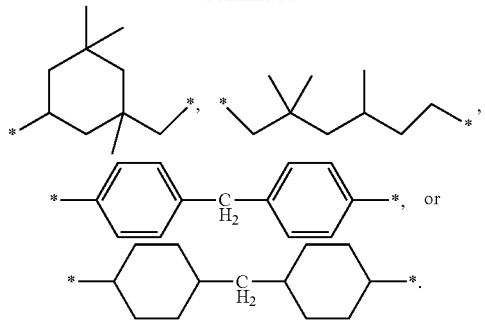

4. The composition of claim 1, wherein:

$R_1$ is hydrogen, straight or branched chain alkyl of 1 to 12 carbon atoms or phenylalkyl of 7 to 15 carbon atoms;

$R_2$ is straight or branched chain alkyl of 1 to 12 carbon atoms or phenylalkyl of 7 to 15 carbon atoms, phenyl, or the phenyl or the phenylalkyl substituted on the phenyl ring by 1 to 3 alkyl of 1 to 4 carbon atoms;

$R_5$ and $R_6$ are hydrogen or one of both is Cl or Br;

$R_7$ and $R_8$ are independently hydrogen, Cl or Br;

X is O or $NE_1$;

$E_1$ is hydrogen, straight or branched chain $C_1$-$C_6$alkyl, which is unsubstituted or substituted by 1 to 4 OH, phenyl which is unsubstituted or substituted by F, $CF_3$, CN or Cl, or $C_7$-$C_9$phenylalkyl.

5. The composition of claim 1, wherein the red-shifted hydroxyphenylbenzotriazoles are of Formula (I).

6. The composition of claim 5, wherein the red-shifted hydroxyphenylbenzotriazole is:

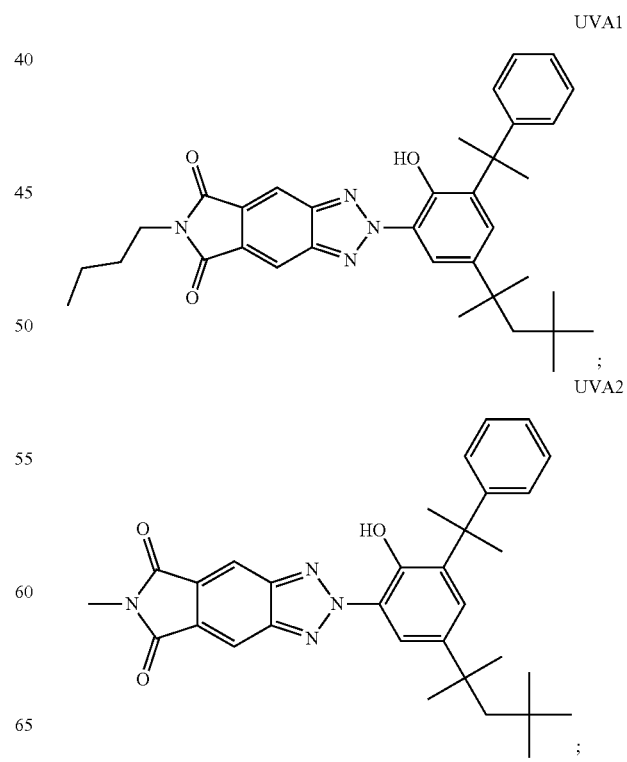

UVA3
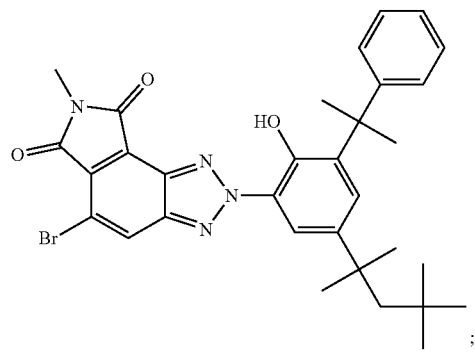
;
UVA4
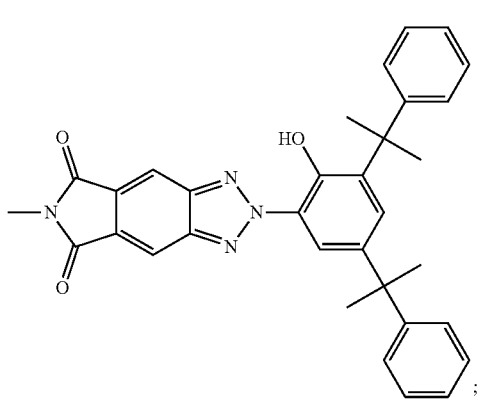
;
UVA5
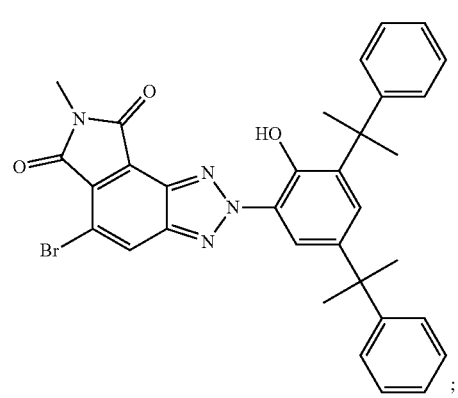
;
UVA6
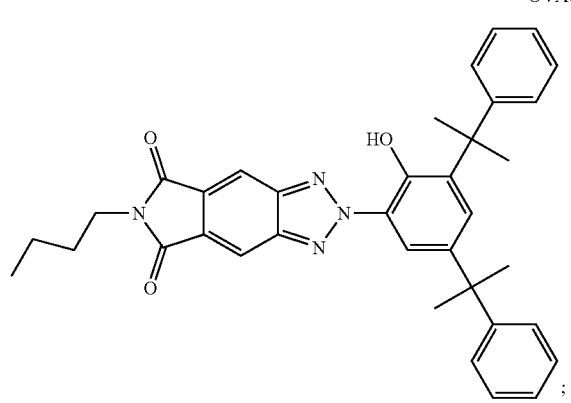
;
UVA7
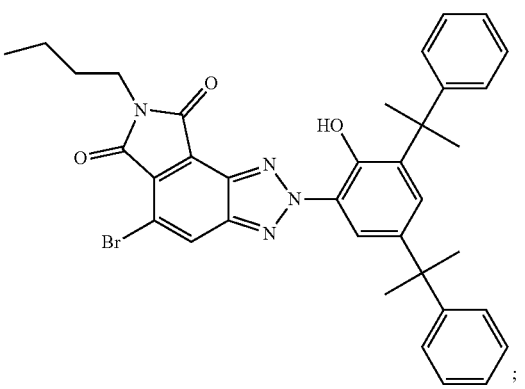
;
UVA8
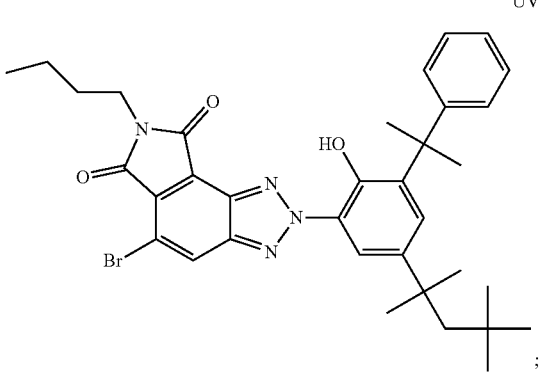
;
UVA9
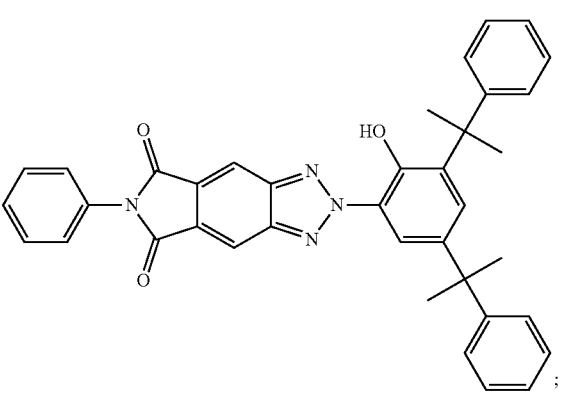
;
UVA10
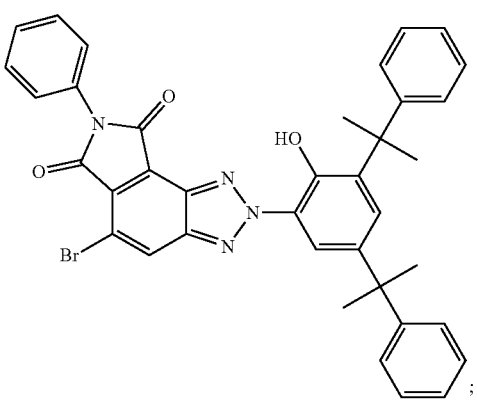
;

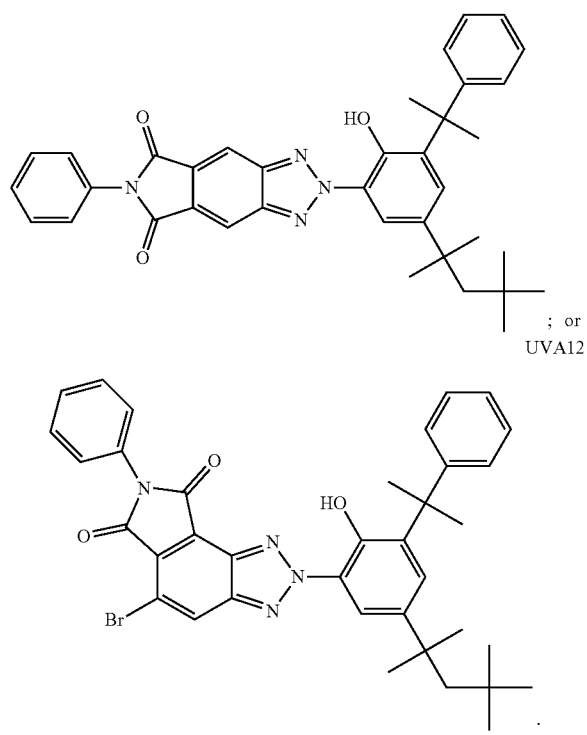

7. The composition of claim 1 comprising the red-shifted UV absorber of Formula III which is 2,4-bis(2-hydroxy-4-n-butyloxyphenyl)-6-(2,4-di-n-butyloxyphenyl)-s-triazine; 2,4,6-tris(2-hydroxy-4-isooctyloxycarbonylisopropylidene-oxyphenyl)-s-triazine; 2,4,6-tris[2-hydroxy-4-(3-sec-butyloxy-2-hydroxypropyloxy)phenyl]-1,3,5-triazine; 2-(2,4di-hydroxyphenyl)-4,6-bis(2-hydroxy-4(1-methoxycarbonylpentoxy)phenyl)-1,3,5-triazine; 2,4,6-tris (2-hydroxy-4-(1-methoxycarbonyl-pentoxy)phenyl)-1,3,5triazine; 2-(2,4-di(methoxycarbonylpentoxy)phenyl)-4,6-bis(2-hydroxy-4-(1-methoxycarbonylpentoxy)phenyl)-1,3,5-triazine; 2-(2,4-dihydroxyphenyl)-4,6-bis-(2-hydroxy-4-(1-hydroxycarbonylpentoxy)phenyl)-1,3,5-triazine; 2,4,6-tris(2-hydroxy-4-(1-hydroxycarbonyl-pentoxy)phenyl)-1,3,5-triazine; 2-(2,4-di(hydroxycarbonylpentoxy)phenyl)-4,6-bis(2-hydroxy-4-(1-hydroxycarbonylpentoxy)phenyl)-1,3,5-triazine; 2,4-bis[2-hydroxy-4-(3-n-butoxy-2-hydroxypropoxy)phenyl]-6-[2-methoxy-4-(3-n-butoxy-2-hydroxypropoxy)phenyl]-1,3,5-triazine; 2,4-bis[2-hydroxy-4-(3-n-butoxy-2-hydroxypropoxy)phenyl]-6-[2,4-di-(3-n-butoxy-2-hydroxypropoxy)phenyl]-1,3,5-triazine; 2,4-bis[2-hydroxy-4-(1-ethoxycarbonylethoxy)phenyl]-6-[2,4-di-(1-ethoxycarbonylethoxy)phenyl]-1,3,5-triazine; 2,4,6-tris (2'-hydroxy-4'-isopropyloxyphenyl)-1,3,5-triazine; 2,4,6-tris(2'-hydroxy-4'-n-hexyloxyphenyl)-1,3,5-triazine; 2,4-bis (2'-hydroxy-4'-isopropyloxyphenyl)-6-(2'-methoxy-4'-isopropyloxyphenyl)-1,3,5-triazine; 2,4-bis(2'-hydroxy-4'-isopropyloxyphenyl)-6-(2'-ethoxy-4'-isopropyloxypheny 1)-1,3,5-triazine; 2,4-bis(2'-hydroxy-4'-isopropyloxyphenyl)-6-(2',4'-diisopropyloxyphenyl)-1,3,5-triazine; 2,4-bis (2'-hydroxy-4'-n-hexyloxyphenyl)-6-(2',4'-di-(n-hexyloxy) phenyl)-1-3,5-triazine, or a mixture of any two or more thereof.

8. The composition of claim 1, wherein the ethylenically unsaturated polymerizable compound is selected from the group consisting of hydroxyalkyl acrylates or methacrylates, acrylonitrile, acrylamide, methacrylamide, N-substituted (meth)acrylamides, vinyl esters, styrene, alkylstyrenes, halostyrenes, N-vinylpyrrolidone, vinyl chloride, vinylidene chloride, monomers containing two—four double bonds, acrylated epoxy resins, acrylated polyethers, acrylated polyurethanes, acrylated polyesters, esters of ethylenically unsaturated carboxylic acids and polyols or polyepoxides, unsaturated polyesters, polyamides and polyurethanes and co-polymers thereof, polybutadiene and butadiene co-polymers, polyisoprene and isoprene co-polymers, polymers and co-polymers containing (meth)acrylic groups in side-chains, unsaturated amides, oligomeric polyunsaturated compounds, urethane (meth)acrylate oligomer(s), acrylate monomer comprising two, three, or four acrylate groups, methacrylate monomers comprising two, three, or four methacrylate groups, and mixtures of any two or more thereof.

9. The composition of claim 1 comprising the hindered amine light stabilizer, which is selected from the group consisting of 1-cyclohexyloxy-2,2,6,6-tetramethyl-4-octadecylaminopiperidine; bis(2,2,6,6-tetramethylpiperidin-4-yl) sebacate; bis(1-acetoxy-2,2,6,6-tetramethylpiperidin-4-yl) sebacate; bis(1,2,2,6,6-pentamethyl-4-yl) sebacate; bis (1-cyclohexyloxy-2,2,6,6-tetramethylpiperidin-4-yl) sebacate; bis(1-octyloxy-2,2,6,6-tetramethylpiperidin-4-yl) sebacate; bis(1-acyl-2,2,6,6-tetramethylpiperidin-4-yl) sebacate; bis(1,2,2,6,6-pentamethyl-4-piperidyl)-n-butyl-3,5-di-tert-butyl-4-hydroxybenzylmalonate; 2,4-bis[(1-cyclohexyloxy-2,2,6,6-tetramethylpiperidin-4-yl)-butylamino]-6-(2-hydroxyethylamino-s-triazine; bis(1-cyclohexyloxy-2,2,6,6-tetramethylpiperidin-4-yl)-adipate; 2,4-bis[(1-cyclohexyloxy-2,2,6,6-piperidin-4-yl)-butylamino]-6-chloro-s-triazine; 1-(2-hydroxy-2-methylpropoxy)-4-hydroxy-2,2,6,6-tetramethylpiperidine; 1-(2-hydroxy-2-methylpropoxy)-4-oxo-2,2,6,6-tetramethylpiperidine; 1-(2-hydroxy-2-methylpropoxy)-4-octadecanoyloxy-2,2,6,6-tetramethylpiperidine; bis(1-(2-hydroxy-2-methylpropoxy)-2,2,6,6-tetramethylpiperidin-4-yl) sebacate; bis(1-(2-hydroxy-2-methylpropoxy)-2,2,6,6-tetramethylpiperidin-4-yl) adipate; 2,4-bis{N-[1-(2-hydroxy-2-methylpropoxy)-2,2,6,6-tetramethylpiperidin-4-yl]-N-butylamino}-6-(2-hydroxyethylamino)-s-triazine; 4-benzoyl-2,2,6,6-tetramethylpiperidine; di-(1,2,2,6,6-pentamethylpiperidin-4-yl) p-methoxybenzylidenemalonate; 4-stearyloxy-2,2,6,6-tetramethylpiperidine; bis(1-octyloxy-2,2,6,6-tetramethylpiperidyl) succinate; 1,2,2,6,6-pentamethyl-4-aminopiperidine; 2-undecyl-7,7,9,9-tetramethyl-1-oxa-3,8-diaza-4-oxo-spiro[4,5]decane; tris(2,2,6,6-tetramethyl-4-piperidyl) nitrilotriacetate; tris(2-hydroxy-3-(amino-(2,2,6,6-tetramethylpiperidin-4-yl)propyl) nitrilotriacetate; tetrakis-(2,2,6,6-tetramethyl-4-piperidyl)-1,2,3,4-butane-tetracarboxylate; tetrakis-(1,2,2,6,6-pentamethyl-4-piperidyl)-1,2,3,4-butane-tetracarboxylate; 1,1'-(1,2-ethanediyl)-bis-(3,3,5,5-tetramethylpiperazinone); 3-n-octyl-7,7,9,9-tetramethyl-1,3,8-triazaspiro[4.5]decan-2,4-dione; 8-acetyl-3-dodecyl-7,7,9,9-tetramethyl-1,3,8-triazaspiro [4.5]decane-2,4-dione; 3-dodecyl-1-(2,2,6,6-tetramethyl-4-piperidyl)pyrrolidin-2,5-dione; 3-dodecyl-1-(1,2,2,6,6-pentamethyl-4-piperidyl)pyrrolidine-2,5-dione; N,N'-bis-formyl-N,N'-bis(2,2,6,6-tetramethyl-4-piperidyl) hexamethylenediamine; the reaction product of 2,4-bis[(1-cyclohexyloxy-2,2,6,6-piperidin-4-yl)butylamino]-6-chloro-s-triazine with N,N'-bis(3-aminopropyl) ethylenediamine); the condensate of 1-(2-hydroxyethyl)-2,2,6,6-tetramethyl-4-hydroxypiperidine and succinic acid; linear or cyclic condensates of N,N'-bis(2,2,6,6-tetramethyl- 4-piperidyl)-hexamethylenediamine and 4-tert-octylamino-2,6-dichloro-1,3,5-triazine; linear or cyclic condensates of N,N'-bis(2,2,6,6-tetramethyl-4-piperidyl)-hexamethylenediamine and 4-cyclohexylamino-2,6-dichloro-1,3,5-triazine; linear or cyclic condensates of N,N'-bis-(2,2,6,6-tetramethyl-4-piperidyl)-hexamethylenediamine and 4-morpholino-2,6-dichloro-1,3,5-triazine; linear or cyclic condensates of N,N'-bis-(1,2,2,6,6-pentamethyl-4-piperidyl)hexamethylenediamine and 4-morpholino-2,6-dichloro-1,3,5-triazine; the condensate of 2-chloro-4,6-bis(4-n-butylamino-2,2,6,6-tetramethylpiperidyl)-1,3,5-triazine and 1,2-bis(3-aminopropylamino)ethane; the condensate of 2-chloro-4,6-di-(4-n-butylamino-1,2,2,6,6-pentamethylpiperidyl)-1,3,5-triazine and 1,2-bis-(3-aminopropylamino)ethane; a reaction product of 7,7,9,9-tetramethyl-2-cycloundecyl-1-oxa-3,8-diaza-4-oxospiro [4,5]decane and epichlorohydrin; poly[methyl, (3-oxy-(2,2,6,6-tetramethylpiperidin-4-yl)propyl)] siloxane, CAS#182635-99-0; the reaction product of maleic acid anhydride-$C_{18}$-$C_{22}$-$\alpha$-olefin-copolymer with 2,2,6,6-tetramethyl-4-aminopiperidine; the oligomeric compound which is the condensation product of 4,4'-hexamethylenebis(amino-2,2,6,6-tetramethylpiperidine) and 2,4-dichloro-6-[(2,2,6,6-tetramethylpiperidin-4-yl)butyl-amino]-s-triazine end-capped with 2-chloro-4,6-bis(dibutylamino)-s-triazine; the oligomeric compound which is the condensation product of 4,4'-hexamethylenebis(amino-1,2,2,6,6-pentamethylpiperidine) and 2,4-dichloro-6-[(1,2,2,6,6-pentaamethylpiperidin-4-yl)butylamino]-s-triazine end-capped with 2-chloro-4,6-bis(dibutylamino)-s-triazine; the oligomeric compound which is the condensation product of 4,4'-hexamethylenebis(amino-1-propoxy-2,2,6,6-tetramethylpiperidine) and 2,4-dichloro-6-[(1-propoxy-2,2,6,6-tetramethylpiperidin-4-yl)butylamino]-s-triazine end-capped with 2-chloro-4,6-bis(dibutylamino)-s-triazine; the oligomeric compound which is the condensation product of 4,4'-hexamethylenebis(amino-1-acyloxy-2,2,6,6-tetramethylpiperidine) and 2,4-dichloro-6-[(1-acyloxy-2,2,6,6-tetramethylpiperidin-4-yl)butylamino]-s-triazine end-capped with 2-chloro-4,6-bis(dibutylamino)-s-triazine; and a product obtained by reacting a product, obtained by reacting 1,2-bis(3-aminopropylamino)ethane with cyanuric chloride and (2,2,6,6-tetramethylpiperidin-4-yl)butylamine.

10. The composition of claim 1 further comprising an ultraviolet light absorber selected from the group consisting of hydroxyphenylbenzotriazoles, hydroxyphenyl-s-triazines, benzophenones, esters of benzoic acids, acrylates, malonates, and oxamides.

11. The composition of claim 10, wherein the ultraviolet light absorber comprises hydroxyphenyl-s-triazine or hydroxylphenylbenzotriazole.

12. The composition of claim 1, wherein the photocurable hardcoat composition comprises a phenolic antioxidant.

13. The composition of claim 1, wherein the red-shifted hydroxyphenylbenzotriazole is present from about 0.05% to about 5.0% by weight and the hindered amine light stabilizer is present from about 0.5% to about 3.0% by weight, each based on the weight of the photocurable hardcoat resin solids.

14. A method for forming a photocured hardcoat protective film coating on a substrate, the method comprising applying the photocurable hardcoat coating composition of claim 1 to a substrate and irradiating the photocurable hardcoat coating composition with a light source to form the photocured hardcoat protective film coating.

15. An article comprising a substrate and a photocured hardcoat layer in adherence thereto, wherein the photocured hardcoat layer is a cured photocurable hardcoat coating formulation prepared from a photocurable hardcoat coating composition according to claim 1.

16. The article of claim 15, wherein the photocured hardcoat coating layer is from about 0.2 mil to about 10 mil thick.

17. The article of claim 15, wherein the photocured hardcoat coating layer exhibits a UV transmission of ≤0.1% at 290 nm to 360 nm, ≤0.5% at 400 nm and ≤12% at 420 nm.

18. The article of claim 15, wherein the photocured hardcoat coating layer is a tinted coating layer.

19. The article of claim 15, wherein the photocured hardcoat coating layer is a pigmented coating layer.

20. The article of claim 15, wherein the photocured hardcoat coating layer comprises an effect pigment.

21. The composition of claim 1, wherein said photocurable hard coat coating composition exhibits solvent resistance of greater than 200 as determined using ASTM D5402-15 for a coating derived therefrom.

* * * * *